United States Patent
Jung et al.

(10) Patent No.: US 10,103,098 B2
(45) Date of Patent: Oct. 16, 2018

(54) SEMICONDUCTOR DEVICES INCLUDING A THROUGH VIA STRUCTURE AND METHODS OF FORMING THE SAME

(71) Applicant: Samsung Electronics Co., Ltd., Suwon-si, Gyeonggi-do (KR)

(72) Inventors: Deokyoung Jung, Seoul (KR); Kwangjin Moon, Hwaseong-si (KR); Byung Lyul Park, Seoul (KR); Jin Ho An, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/403,480

(22) Filed: Jan. 11, 2017

(65) Prior Publication Data
US 2017/0200675 A1   Jul. 13, 2017

(30) Foreign Application Priority Data
Jan. 12, 2016 (KR) ........................ 10-2016-0003482

(51) Int. Cl.
*H01L 23/00* (2006.01)
*H01L 23/522* (2006.01)
(Continued)

(52) U.S. Cl.
CPC ........ *H01L 23/5226* (2013.01); *H01L 23/481* (2013.01); *H01L 23/53238* (2013.01);
(Continued)

(58) Field of Classification Search
CPC ............... H01L 23/5226; H01L 23/481; H01L 23/53238; H01L 23/53295; H01L 23/53266; H01L 2224/0401; H01L 2224/05572; H01L 2224/131; H01L 2225/06544

See application file for complete search history.

(56) References Cited

U.S. PATENT DOCUMENTS 8,592,310 B2   11/2013   Park et al.
8,779,559 B2   7/2014   Ramachandran et al.
(Continued)

FOREIGN PATENT DOCUMENTS

JP   2013058672   3/2013
KR   1019950050492   12/1995
KR   10-0220936   6/1999

*Primary Examiner* — Armando Rodriguez
(74) *Attorney, Agent, or Firm* — Myers Bigel, P.A.

(57) ABSTRACT

Semiconductor devices including a through via structure and methods of forming the same are provided. The semiconductor devices may include a semiconductor substrate including a first surface and a second surface opposite the first surface, a front insulating layer on the first surface of the semiconductor substrate, a back insulating layer on the second surface of the semiconductor substrate, a through via structure extending through the back insulating layer, the semiconductor substrate, and the front insulating layer, a via insulating layer on a side surface of the through via structure, and a contact structure extending through the front insulating layer. The through via structure may include a first region and a second region disposed on the first region. The second region may include a first doping element, and the first region may be substantially free of the first doping element.

19 Claims, 39 Drawing Sheets

(51) Int. Cl.
*H01L 23/532* (2006.01)
*H01L 23/48* (2006.01)

(52) U.S. Cl.
CPC .. *H01L 23/53295* (2013.01); *H01L 23/53266* (2013.01); *H01L 2224/0401* (2013.01); *H01L 2224/05572* (2013.01); *H01L 2224/131* (2013.01); *H01L 2225/06544* (2013.01)

(56) References Cited

U.S. PATENT DOCUMENTS

| | | | |
|---|---|---|---|
| 8,828,745 B2 | 9/2014 | Tsao et al. | |
| 8,841,754 B2 | 9/2014 | Kang et al. | |
| 8,975,729 B2 | 3/2015 | Ramachandran | |
| 9,087,885 B2 | 7/2015 | Ji et al. | |
| 2013/0187246 A1* | 7/2013 | Adkisson | H03H 9/64 257/416 |
| 2013/0270712 A1 | 10/2013 | Chen et al. | |
| 2014/0138848 A1 | 5/2014 | Matsuura | |
| 2014/0357077 A1 | 12/2014 | Lee et al. | |
| 2017/0345713 A1* | 11/2017 | Chun | H01L 23/481 |

* cited by examiner

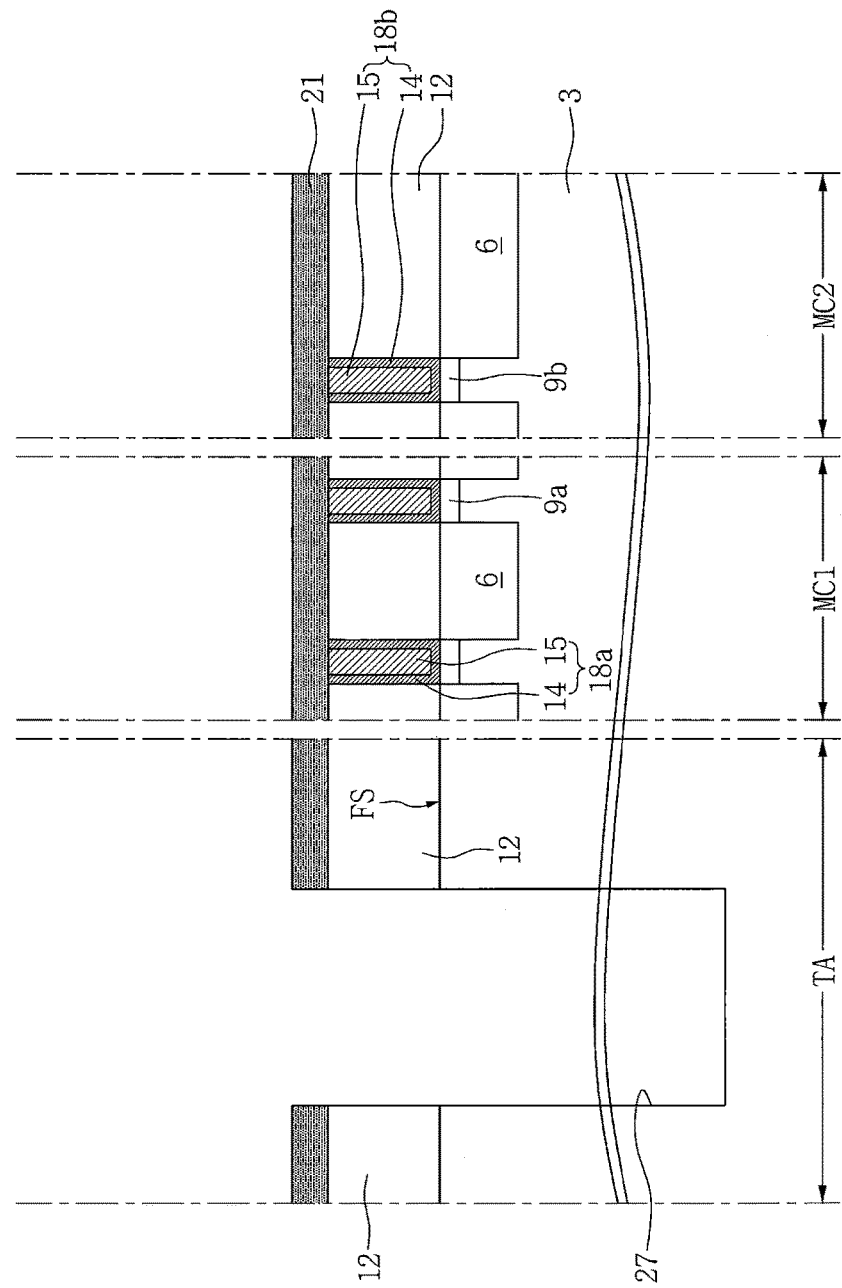

US 10,103,098 B2

1

SEMICONDUCTOR DEVICES INCLUDING A THROUGH VIA STRUCTURE AND METHODS OF FORMING THE SAME

CROSS-REFERENCE TO RELATED APPLICATION

This application claims priority under 35 U.S.C. § 119 to Korean Patent Application No. 10-2016-0003482, filed on Jan. 12, 2016, the disclosure of which is hereby incorporated by reference in its entirety.

BACKGROUND

The present disclosure generally relates to semiconductor devices and methods of forming the semiconductor devices, and more particularly, to semiconductor devices including a through via structure and methods of forming the same.

Semiconductor packages including multiple stacked semiconductor chips using a three-dimensional packaging technique have been developed. In order to stack multiple semiconductor chips, a through-silicon-via (TSV) may be used.

SUMMARY

Example embodiments of the inventive concepts provide a semiconductor device including a through via structure.

Example embodiments of the inventive concepts provide a semiconductor device having improved reliability.

Example embodiments of the inventive concepts provide a method of forming a semiconductor device that may reduce contamination of a contact structure while forming a through via structure, and a semiconductor device formed by the method.

Example embodiments of the inventive concepts provide a semiconductor device capable of reducing a leakage current between a contact structure and an adjacent wiring structure.

In accordance with an aspect of the inventive concepts, a semiconductor device is provided. The semiconductor device may include a semiconductor substrate including a first surface and a second surface opposite the first surface, a front insulating layer disposed on the first surface of the semiconductor substrate, a back insulating layer disposed on the second surface of the semiconductor substrate, a through via structure which extends through the back insulating layer, the semiconductor substrate, and the front insulating layer, a via insulating layer disposed on side surfaces of the through via structure, and a contact structure which extends through the front insulating layer. The through via structure may include a first region and a second region disposed on the first region, and the second region may further include a first doping element than the first region. In some embodiments, the second region may include the first doping element, and the first region may be substantially free of the first doping element.

In accordance with an aspect of the inventive concepts, a semiconductor device is provided. The semiconductor device may include a front lower insulating layer disposed on a first surface of a semiconductor substrate, a through via structure which extends through the semiconductor substrate and the front lower insulating layer, and a via insulating layer disposed on a side surface of the through via structure. The through via structure may include a first region and a second region disposed on the first region, and the second region of the through via structure may protrude from the first surface of the semiconductor substrate and may further include a first doping element than the first region. In some embodiments, the second region may include the first doping element, and the first region may be substantially free of the first doping element.

In accordance with an aspect of the inventive concepts, a semiconductor device is provided. The semiconductor device may include a semiconductor substrate including a first surface and a second surface opposite the first surface, a front lower insulating layer disposed on the first surface of the semiconductor substrate, a back insulating layer disposed on the second surface of the semiconductor substrate, a through via structure which extends through the semiconductor substrate, the front lower insulating layer, and the back insulating layer, a via insulating layer disposed on a side surface of the through via structure, a contact structure disposed on the first surface of the semiconductor substrate and in the front lower insulating layer, an inter-metal insulating layer disposed on the front lower insulating layer, a via pad which extends through the inter-metal insulating layer and is electrically connected to the through via structure, and a wiring structure which passes through the inter-metal insulating layer and is electrically connected to the contact structure. The through via structure may have a first region and a second region disposed on the first region, and the second region of the through via structure may further include a first doping element than the first region. In some embodiments, the second region may include the first doping element, and the first region may be substantially free of the first doping element.

In accordance with an aspect of the inventive concepts, a semiconductor device is provided. The semiconductor device may include a substrate and a through via structure extending through the substrate. The through via structure may include a metal electrode that extends through the substrate and includes a first surface and a second surface opposite the first surface. The metal electrode may include a first portion that includes the first surface of the metal electrode and includes a first chemical element that is silicon, oxygen or nitrogen.

BRIEF DESCRIPTION OF THE DRAWINGS

The foregoing and other features and advantages of the inventive concepts will be apparent from the description of example embodiments of the inventive concepts, as illustrated in the accompanying drawings in which like reference numerals/characters refer to the same elements/parts throughout the different views. The drawings are not necessarily to scale, emphasis instead being placed upon illustrating the principles of the inventive concepts. In the drawings:

FIGS. 16A to 16K are cross-sectional views illustrating a method of forming a semiconductor device according to some embodiments of the inventive concepts;

DETAILED DESCRIPTION

It will be understood that references herein to "an element A not overlapping an element B in plan view" (or similar language) means that no vertical line exists that intersects both the elements A and B. As used herein the term "and/or" includes any and all combinations of one or more of the associated listed items.

Semiconductor devices according to example embodiments of the inventive concepts will be described with reference to FIGS. 1 to 11. In FIGS. 1, and 4 to 11, a region denoted by "TA" may be a through via region, a region denoted by "MC1" may be a first circuit region, and a region denoted by "MC2" may be a second circuit region.

Figure 1:
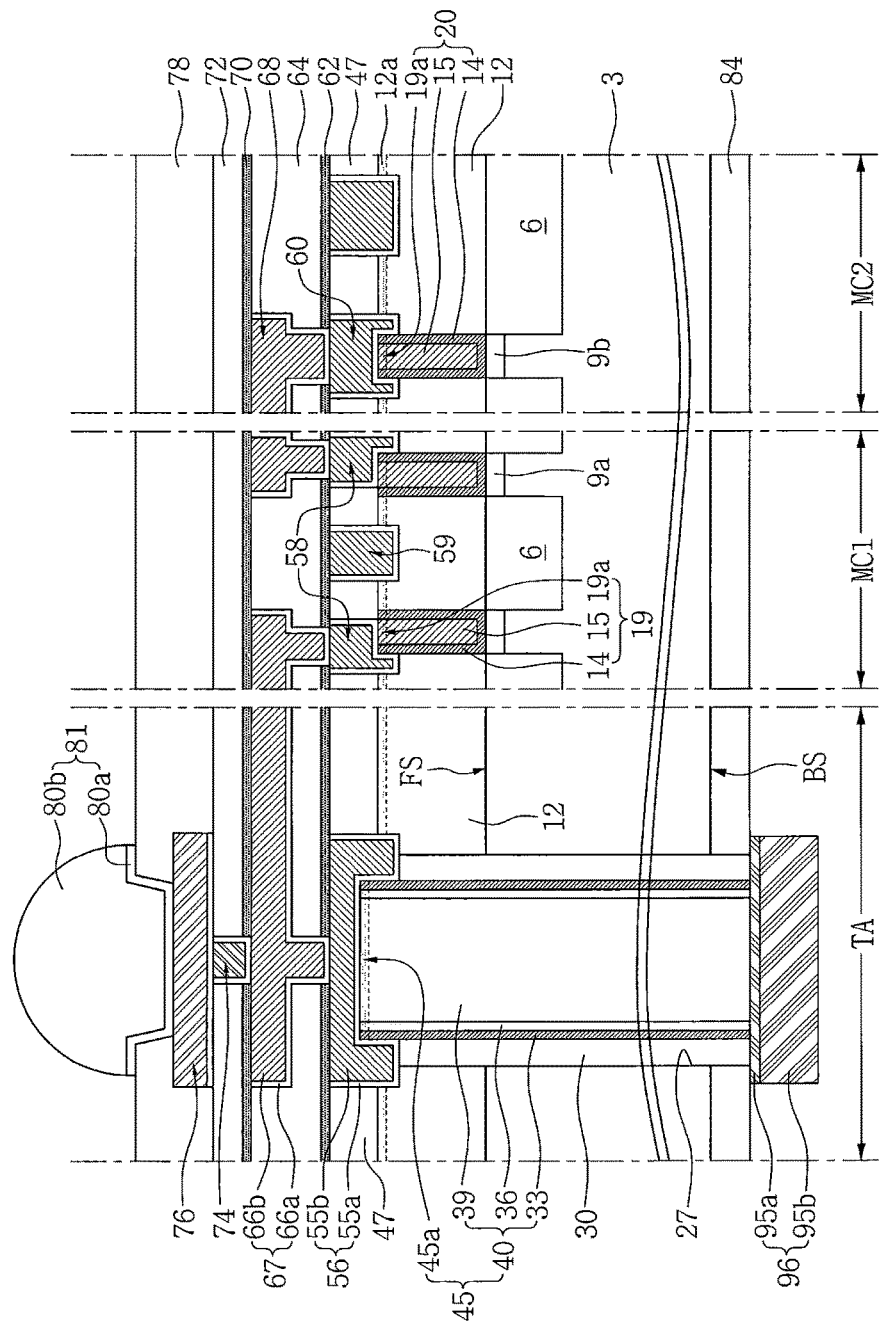
FIG. 1 is a cross-sectional view of a semiconductor device according to some embodiments of the inventive concepts.

First, a semiconductor device according to some embodiments of the inventive concepts will be described with reference to FIGS. 1, 2, and 3. FIG. 1 is a cross-sectional view of a semiconductor device according to some embodiments of the inventive concepts, FIG. 2 is an enlarged view of a portion of a through via structure 45 illustrated in FIG. 1, and FIG. 3 is a plan view of the through via structure 45 and a via pad 56 illustrated in FIG. 1.

Figure 2:
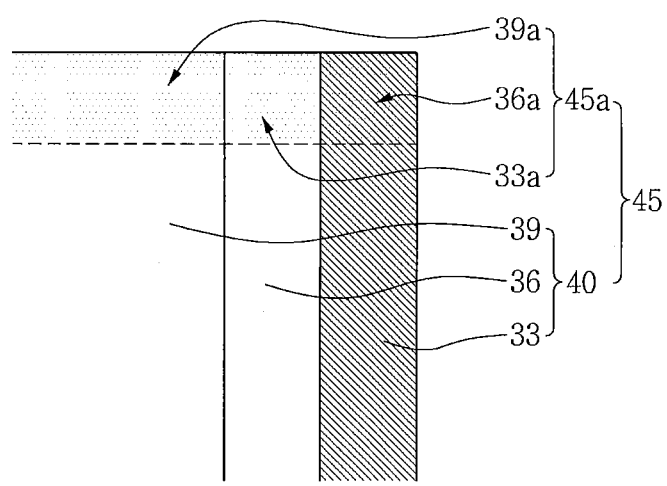
FIG. 2 is an enlarged view of a portion of the semiconductor device in FIG. 1.
Figure 3:
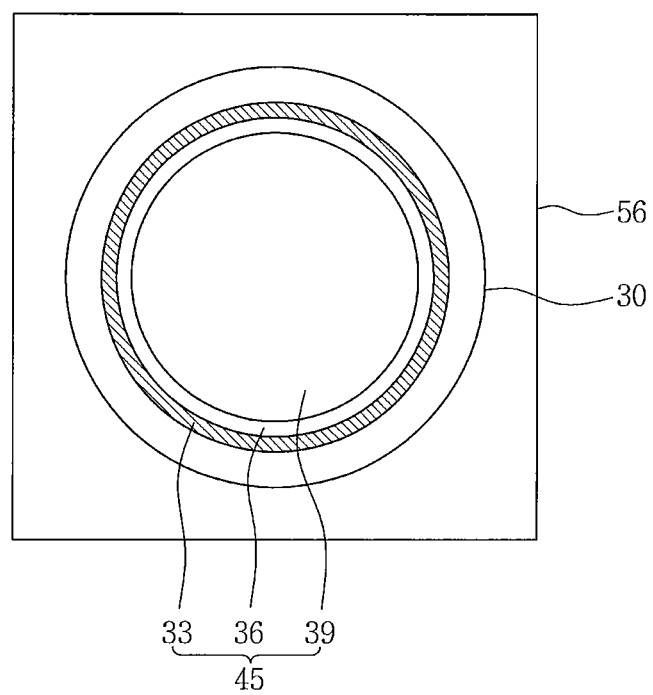
FIG. 3 is a plan view of the portion of the semiconductor device in FIG. 1.

Referring to FIGS. 1, 2, and 3, a semiconductor substrate 3 having a first surface FS and a second surface BS may be provided. The semiconductor substrate 3 may be formed of a semiconductor material such as silicon and the like. The first surface FS of the semiconductor substrate 3 may be a front surface, and the second surface BS of the semiconductor substrate 3 may be a back surface.

First contact regions 9a and a second contact region 9b may be disposed in the first surface FS of the semiconductor substrate 3. The first contact regions 9a may be disposed in a first circuit region MC1, and the second contact region 9b may be disposed in a second circuit region MC2.

In some embodiments, the first and second contact regions 9a and 9b may be contact regions of the semiconductor device constituting an internal circuit. For example, the first and second contact regions 9a and 9b may be source/drain regions and/or body contact regions of transistors, and the first and second contact regions 9a and 9b may be disposed in active regions of the semiconductor substrate 3 defined by trench device isolation regions 6.

A front lower insulating layer 12 may be disposed on the first surface FS of the semiconductor substrate 3. The front lower insulating layer 12 may be formed of a silicon oxide-based insulating material. A back insulating layer 84 may be disposed on the second surface BS of the semiconductor substrate 3. The back insulating layer 84 may be formed of an insulating material, for example, silicon oxide, silicon nitride, or the like.

In a through via region TA, a via insulating layer 30 and the through via structure 45 may be disposed in a via hole 27 passing through the semiconductor substrate 3, the front lower insulating layer 12, and the back insulating layer 84.

The via insulating layer 30 may be disposed on side surfaces of the through via structure 45. The via insulating layer 30 may be formed of a silicon oxide-based insulating material.

An upper surface of the through via structure 45 may be disposed in a different plane from an upper surface of the front lower insulating layer 12. For example, the upper surface of the through via structure 45 may be disposed at a higher level than the upper surface of the front lower insulating layer 12 relative to the first surface FS of the semiconductor substrate 3 as illustrated in FIG. 1.

The upper surface of the through via structure 45 may be disposed in the different plane from an upper surface of the via insulating layer 30, and a lower surface of the through via structure 45 may be disposed in the same plane as a lower surface of the via insulating layer 30 as illustrated in FIG. 1. The upper surface of the through via structure 45 may be disposed at a higher level than the upper surface of the via insulating layer 30 relative to the first surface FS of the semiconductor substrate 3 as illustrated in FIG. 1.

The through via structure 45 may include a via conductive pattern 39, a via barrier pattern 33 disposed on side surfaces of the via conductive pattern 39, and a via seed pattern 36 disposed between the via conductive pattern 39 and the via barrier pattern 33.

The through via structure 45 may include a doped region formed by doping with an "A" element in an upper portion thereof. The upper portion of the through via structure 45 may include the upper surface thereof. It will be understood that the term "element" refers to chemical element. It will be also understood that the "A" element can be referred to as a doping element since the "A" element is added into the through via structure 45. In some embodiments, the "A" element may be added into the through via structure 45 using, for example, a doping process. In the through via structure 45, a region in which substantially no "A" element is doped may be referred to as a first region 40, and the doped region formed by doping with the "A" element may be referred to as a second region 45a. The second region 45a may be disposed on the first region 40 and may further include the "A" element than the first region 40. The first region 40 may be substantially free of the "A" element.

In some embodiments, the "A" element may include one, two, or three elements of a first element, a second element, and a third element. For example, the first element may be a "silicon (Si)" element, the second element may be an "oxygen (O)" element, and the third element may be a "nitrogen (N)" element.

The first region 40 of the through via structure 45 may be a region in which the via conductive pattern 39, the via barrier pattern 33, and the via seed pattern 36 are not doped with the "A" element. Further, the second region 45a of the through via structure 45 may include doped regions 39a, 33a, and 36a formed by doping the via conductive pattern 39, the via barrier pattern 33, and the via seed pattern 36 with the "A" element. The thicknesses of the doped regions 39a, 33a, and 36a may be 3 Å to 20 Å, respectively.

The via conductive pattern 39 may be formed of a first metal material, and the doped region 39a of the via conductive pattern 39 may be formed of a material formed by doping with the "A" element in the first metal material. For example, the via conductive pattern 39 may be formed of a copper (Cu) material, and the doped region 39a of the via conductive pattern 39 may be formed by doping with one, two, or three elements of "silicon (Si)," "oxygen (O)," and "nitrogen (N)" in the Cu material. For example, the doped region 39a of the via conductive pattern 39 may be formed of a conductive material in which "Si" and "O" are doped in the Cu material, a conductive material in which "Si" and "N" are doped in the Cu material, or a material in which "Si," "N," and "O" are doped in the Cu material. For example, the doped region 39a of the via conductive pattern 39 may be formed of a CuSiO material, a CuSiN material and/or a CuSiON material. It will be understood that the via conductive pattern 39 can be referred to as a metal electrode when the via conductive pattern 39 includes a metal.

In some embodiments, in the doped region 39a of the via conductive pattern 39, an amount of the "oxygen (O)" element may be greater than that of the "nitrogen (N)" element. For example, a number of oxygen elements in the doped region 39a may be greater than a number of nitrogen elements in the doped region 39a.

The second region 45a of the through via structure 45, the doped region, may serve to reduce or possibly prevent diffusion of the Cu material of the via conductive pattern 39 into other regions.

The via barrier pattern 33 may be formed of any of Ta, TaN, Ru, Co, Mn, TiN, Ti/TiN, WN, Ni, and NiB or a combination thereof. The via seed pattern 36 may be formed of a seed material that can be used when the via conductive pattern 39 is formed through an electrolytic plating method. For example, the via seed pattern 36 may be formed of a Cu seed layer.

In some embodiments, the front lower insulating layer 12 may include an insulating doped region 12a disposed in the upper portion thereof. The front lower insulating layer 12 may be formed of a silicon oxide material, and the insulating doped region 12a may be formed of a silicon oxynitride (e.g., $SiO_xN_y$) material. It will be understood that SiON refers to silicon oxynitride. The thickness of the insulating doped region 12a may be 3 Å to 20 Å.

First contact structures 19 and a second contact structure 20 may be disposed to pass through the front lower insulating layer 12. The first contact structures 19 may be disposed in the first circuit region MC1 and may be electrically connected to the first contact regions 9a. The second contact structure 20 may be disposed in the second circuit region MC2 and may be electrically connected to the second contact region 9b.

Each of the first and second contact structures 19 and 20 may include a contact plug 15 and a contact barrier layer 14 which covers a bottom surface and side surfaces of the contact plug 15. The contact barrier layer 14 may be formed of a metal nitride (e.g., TiN or the like), and the contact plug 15 may be formed of a metal material (e.g., W or the like).

In some embodiments, the through via structure 45 may include a metal material different from the first and second contact structures 19 and 20. For example, the via conductive pattern 39 of the through via structure 45 may be formed of a Cu material, and the contact plugs 15 of the first and second contact structures 19 and 20 may be formed of a tungsten (W) material.

In some embodiments, each of the first and second contact structures 19 and 20 may include a doped region 19a formed in upper portions thereof. An upper surface of the doped region 19a may be the upper surface of the first contact structure 19 or the second contact structure 20 as illustrated in FIG. 1. The doped region 19a of each of the first and second contact structures 19 and 20 may be a region formed by doping each of the contact plug 15 and the contact barrier layer 14 with the "A" element. For example, the doped region 19a of each of the first and second contact structures 19 and 20 may be a region formed by doping with an element such as silicon, nitrogen, and/or the like.

A first inter-metal insulating layer 47 may be disposed on the front lower insulating layer 12. The first inter-metal insulating layer 47 may be formed of a silicon oxide-based insulating material, for example, silicon oxide. The first inter-metal insulating layer 47 may be in contact with the front lower insulating layer 12. The first inter-metal insulating layer 47 may be in contact with the doped region 12a of the front lower insulating layer 12.

The via pad 56 and wiring structures 58, 59, and 60 may be disposed to pass through the first inter-metal insulating layer 47. The via pad 56 and the wiring structures 58, 59, and 60 may be formed of the same material and may have upper surfaces disposed in the same plane.

In some embodiments, the via pad 56 and the wiring structures 58, 59, and 60 may pass through the insulating doped region 12a in the front lower insulating layer 12. Each of the via pad 56 and the wiring structures 58, 59, and 60 may include a conductive material layer 55b and a conductive barrier layer 55a which covers a bottom surface and side surfaces of the conductive material layer 55b.

The via pad 56 may be electrically connected to the through via structure 45. The via pad 56 may have a width greater than that of the through via structure 45.

In some embodiments, the via pad 56 may cover side surfaces of an upper region of the through via structure 45 while covering the entire upper surface of the through via structure 45 as illustrated in FIG. 1. The via pad 56 may be in contact with the side surfaces of the upper region of the through via structure 45 while being in contact with the upper surface of the through via structure 45. The via pad 56 may cover upper side surfaces of the first region 40 of the through via structure 45 while covering an upper surface and side surfaces of the second region 45a of the through via structure 45.

The via pad 56 may include a portion which overlaps the through via structure 45 and a portion which does not overlap the through via structure 45 in plan view. In the via pad 56, a lower surface of the portion which does not overlap the through via structure 45 may be disposed at a lower level than the upper surface of the front lower insulating layer 12. In the via pad 56, a bottom surface of the portion which covers upper side surfaces of the through via structure 45 may be closer to the first surface FS of the semiconductor substrate 3 than the upper surface of the front lower insulating layer 12. Lower surfaces of edge portions of the via pad 56 may be disposed at a lower level than the upper surface of the front lower insulating layer 12. The lower surfaces of the edge portions of the via pad 56 may be disposed at a lower level than upper surfaces of the first and second contact structures 19 and 20.

The wiring structures 58, 59, and 60 may include a pair of first wiring structures 58 electrically connected to the first contact structures 19 and an intermediate wiring structure 59 which is between the pair of the first wiring structures 58 and electrically insulated from the first contact structures 19. Further, the wiring structures 58, 59, and 60 may include a second wiring structure 60 that can be electrically connected to the second contact structure 20.

The first wiring structures 58 may have side surfaces which are not vertically aligned with side surfaces of the first contact structures 19. For example, the first wiring structures 58 may have side surfaces which overlap upper surfaces of the first contact structures 19 in plan view and side surfaces which do not overlap the upper surfaces of the first contact structures 19 in plan view. The second wiring structure 60 may have a width greater than that of the second contact structure 20 and cover the upper surface of the second contact structure 20 and portions of side surfaces of the second contact structures 20.

The front lower insulating layer 12 and the first inter-metal insulating layer 47 are formed of an oxide-based material, and thus may be stably in contact with each other. Accordingly, dielectric breakdown deterioration between the first contact structures 19 and the intermediate wiring structure 59 may be reduced or possibly prevented. Therefore, a leakage between the first contact structures 19 and the intermediate wiring structure 59 may be reduced or prevented, and the reliability of the semiconductor device may be improved.

A first insulating barrier layer 62 and a second inter-metal insulating layer 64, which are sequentially stacked on the via pad 56, the wiring structures 58, 59, and 60, and the first inter-metal insulating layer 47, may be disposed. The second inter-metal insulating layer 64 may be formed of a silicon oxide-based insulating material.

The first insulating barrier layer 62 may be formed of silicon nitride, silicon carbon nitride, or SiCON. When the conductive material layer 55b is formed of a Cu material, the first insulating barrier layer 62 may serve to reduce or possibly prevent diffusion of the Cu material of the conductive material layer 55b into other regions.

Connection wirings 67 and 68 having a dual damascene wiring structure may be disposed in the second inter-metal insulating layer 64. The connection wirings 67 and 68 may pass through the first insulating barrier layer 62 to electrically connect the via pad 56 to the wiring structures 58, 59, and 60. For example, one connection wiring 67 of the connection wirings 67 and 68 may electrically connect the via pad 56 to the first wiring structure 58.

Each of the connection wirings 67 and 68 may include a wiring material layer 66b and a wiring barrier layer 66a which covers a lower surface and side surfaces of the wiring material layer 66b. For example, the wiring material layer 66b may be formed of a metal material such as tungsten (W), copper (Cu), or the like, and the wiring barrier layer 66a may be formed of metal nitride such as TiN, TaN, or the like.

A second insulating barrier layer 70 and a front upper insulating layer 72, which are sequentially stacked on the connection wirings 67 and 68 and the second inter-metal insulating layer 64, may be disposed. The second insulating barrier layer 70 may be formed of silicon nitride, silicon carbon nitride, or SiCON. When the wiring material layer 66b is formed of Cu material, the second insulating barrier layer 70 may serve to reduce or possibly prevent diffusion of the Cu material of the wiring material layer 66b into other regions. The front upper insulating layer 72 may be formed of a silicon oxide-based insulating material.

A contact plug 74 may be disposed to pass through the front upper insulating layer 72 and the second insulating barrier layer 70 and to be electrically connected to the connection wiring 67. A front pad 76 may be disposed on the contact plug 74.

A front protective layer 78 may be disposed to cover the front pad 76 and the front upper insulating layer 72. The front protective layer 78 may be formed of an insulating material such as polyimide, silicon nitride, or the like.

A front conductive pattern 81 may be disposed to pass through the front protective layer 78 and to be electrically connected to the front pad 76.

The front conductive pattern 81 may include a first front conductive pattern 80a and a second front conductive pattern 80b disposed on the first front conductive pattern 80a.

In some embodiments, the front conductive pattern 81 may include a front bump or a front solder ball.

A back conductive pattern 96 may be disposed to cover the through via structure 45 which protrudes from the second surface BS of the semiconductor substrate 3.

The back conductive pattern 96 may have a width greater than that of the through via structure 45 and may cover the lower surface of the through via structure 45. The back conductive pattern 96 may include a first back conductive pattern 95a and a second back conductive pattern 95b disposed on the first back conductive pattern 95a. The back conductive pattern 96 may be a back bump.

A semiconductor device according to some embodiments of the inventive concepts will be described with reference to FIG. 4.

Figure 4:
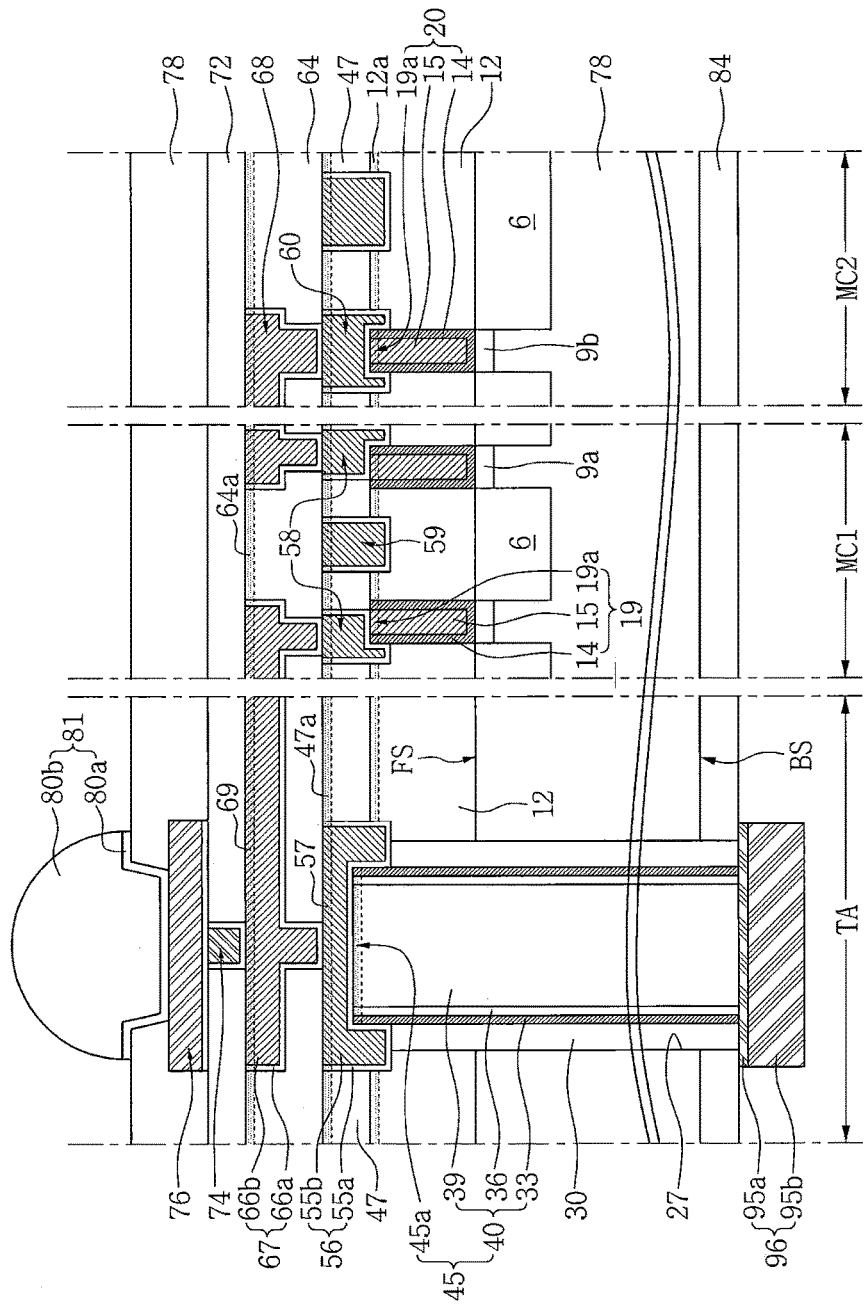
FIG. 4 is a cross-sectional view of a semiconductor device according to some embodiments of the inventive concepts.

Referring to FIG. 4, the semiconductor substrate 3, the front lower insulating layer 12, the back insulating layer 84, the through via structure 45, and the first and second contact structures 19 and 20, which are the same as those described with reference to FIG. 1, may be disposed.

A first inter-metal insulating layer 47 may be disposed on the front lower insulating layer 12. The first inter-metal insulating layer 47 may be formed of a silicon oxide-based insulating material.

A via pad 56, first wiring structures 58, an intermediate wiring structure 59, and a second wiring structure 60 may be disposed to pass through the first inter-metal insulating layer 47.

Each of the via pad 56 and the wiring structures 58, 59, and 60 may include the conductive material layer 55b and the conductive barrier layer 55a which covers the bottom surface and the side surfaces of the conductive material layer 55b, which are the same as described with reference to FIG. 1. As described in FIG. 1, the via pad 56 may be electrically connected to the through via structure 45, the first wiring structures 58 may be electrically connected to the first contact structures 19, the intermediate wiring structure 59 may be disposed between the first wiring structures 58, and the second wiring structure 60 may be electrically connected to the second contact structure 20.

The via pad 56 and the wiring structures 58, 59, and 60 may be formed of the same metal material, and may include a conductive doped region 57 in which one, two, or more elements of "silicon (Si)," "oxygen (O)," and "nitrogen (N)" are doped in an upper portion of the metal material. For example, the via pad 56 and the wiring structures 58, 59, and 60 may include the doped region 57 in which one, two, or more elements of "silicon (Si)," "oxygen (O)," and "nitrogen (N)" are doped in an upper portion of the conductive material layer 55b formed of a Cu material.

The first inter-metal insulating layer 47 may include an insulating doped region 47a formed in an upper portion thereof. The first inter-metal insulating layer 47 may be formed of silicon oxide, and the doped region 47a of the first inter-metal insulating layer 47 may be formed of a SiON material.

A second inter-metal insulating layer 64 may be disposed on the via pad 56, the wiring structures 58, 59, and 60, and the first inter-metal insulating layer 47. The second inter-metal insulating layer 64 may be formed of a silicon oxide-based insulating material.

Connection wirings 67 and 68 having a dual damascene wiring structure may be disposed in the second inter-metal insulating layer 64. The connection wirings 67 and 68 may pass through the second inter-metal insulating layer 64 to electrically connect the via pad 56 to the wiring structures 58, 59, and 60.

Each of the connection wirings 67 and 68 may include a wiring material layer 66b and a wiring barrier layer 66a which covers a lower surface and side surfaces of the wiring material layer 66b. The wiring material layer 66b may be formed of a metal material such as tungsten (W), copper (Cu), or the like, and the wiring barrier layer 66a may be formed of metal nitride such as TiN, TaN, or the like.

The connection wirings 67 and 68 may include conductive doped regions 69 formed by doping with one, two, or more elements of "silicon (Si)," "oxygen (O)," and "nitrogen (N)" in upper portions thereof. The second inter-metal insulating layer 64 may include an insulating doped region 64a in an upper portion thereof. The second inter-metal insulating layer 64 may be formed of silicon oxide, and the doped region 64a of the second inter-metal insulating layer 64 may be formed of a SiON material.

The front upper insulating layer 72, the contact plug 74, the front pad 76, the front protective layer 78, and the front conductive pattern 81, which are the same as described with reference to FIG. 1, may be disposed on the connection wirings 67 and 68 and the second inter-metal insulating layer 64. Further, the back conductive pattern 96, which is the same as described with reference to FIG. 1, may be disposed.

A semiconductor device according to some embodiments of the inventive concepts will be described with reference to FIG. 5.

Figure 5:
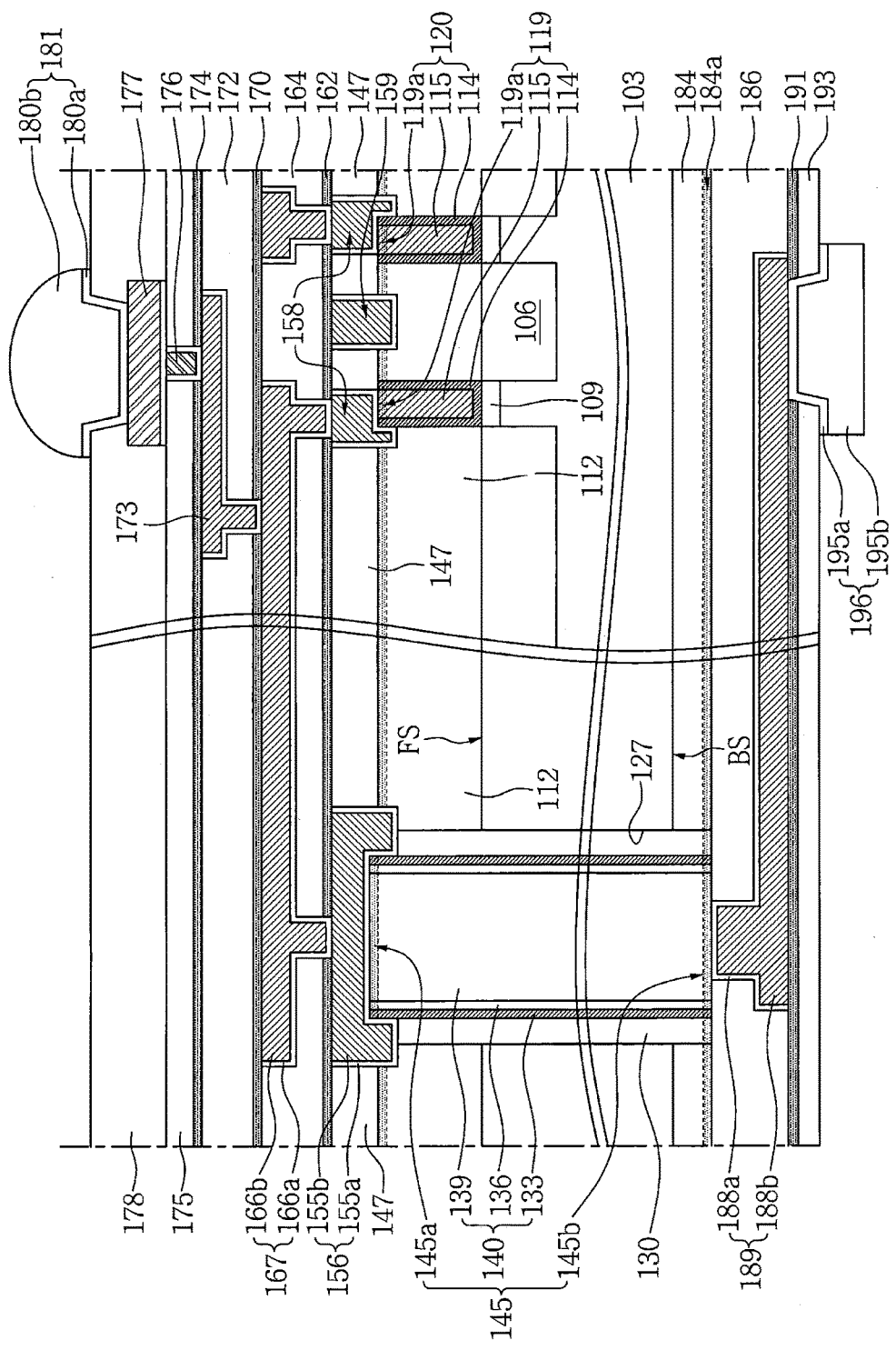
FIG. 5 is a cross-sectional view of a semiconductor device according to some embodiments of the inventive concepts.

Referring to FIG. 5, a semiconductor substrate 103 having a first surface FS and a second surface BS facing each other may be provided. Contact regions 109 may be disposed on the first surface FS of the semiconductor substrate 103.

In some embodiments, the contact regions 109 may be contact regions of devices constituting an internal circuit. For example, the contact regions 109 may be source/drain regions or body contact regions, and the contact regions 109 may be disposed in active regions defined by device isolation regions 106 formed in the first surface FS of the semiconductor substrate 103.

A front lower insulating layer 112 may be disposed on the first surface FS of the semiconductor substrate 103, and a back insulating layer 184 may be disposed on the second surface BS of the semiconductor substrate 103.

A through via structure 145 and a via insulating layer 130 may be disposed in a via hole 127 passing through the front lower insulating layer 112 and the back insulating layer 184 while passing through the semiconductor substrate 103. The via insulating layer 130 may be formed of silicon oxide and may surround side surfaces of the through via structure 145.

The through via structure 145 may include a via conductive pattern 139 and a via barrier pattern 133 disposed on side surfaces of the via conductive pattern 139. The through via structure 145 may include a via seed pattern 136 disposed between the via conductive pattern 139 and the via barrier pattern 133. The via conductive pattern 139, the via seed pattern 136, and the via barrier pattern 133 may be formed of the same material as that of the via conductive pattern 39, the via seed pattern 36, and the via barrier pattern 33 described with reference to FIGS. 1 and 2.

The through via structure 145 may include a conductive doped region formed by doping with an "A" element in an upper portion and/or a lower portion thereof. For example, the through via structure 145 may include a first region 140 in which substantially no "A" element is doped, a second region 145a formed by doping with the "A" element in the upper portion thereof, and a third region 145b formed by doping with the "A" element in the lower portion thereof. The "A" element may be one, two, or more elements of "silicon (Si)," "oxygen (O)," and "nitrogen (N)." The first region 140 may be substantially free of the "A" element.

In the through via structure 145, the second region 145a may be disposed in a surface of a portion protruding from the first surface FS of the semiconductor substrate 103, that is, the upper surface thereof, and the third region 145b may be disposed in a surface of a portion protruding from the second surface BS of the semiconductor substrate 103, that is, the lower surface thereof.

The first region 140 of the through via structure 145 may be formed of the same metal material as that of the first region 40 of the through via structure 145 described with reference to FIGS. 1 and 2, and the second region 145a and/or the third region 145b of the through via structure 145 may be formed of a metal material in which the same element as that of the second region 45a of the through via structure 45 described with reference to FIGS. 1 and 2 is doped. For example, in the through via structure 145, the first region 140 may include a Cu material, and the second and third regions 145a and 145b may include one, two, or more materials of a CuSiO material, a CuSiN material, and a CuSiON material. In some embodiments, the first region 140 may be substantially free of "silicon (Si)," "oxygen (O)," and "nitrogen (N)."

The front lower insulating layer 112 may include an insulating doped region 112a in which nitrogen and/or silicon are doped in an upper portion thereof. The upper portion of the front lower insulating layer 112 may include an upper surface that is opposite a lower surface of the front lower insulating layer 112, which faces the first surface FS of the semiconductor substrate 103. The back insulating layer 184 may include an insulating doped region 184a in which nitrogen and/or silicon are doped in a lower portion thereof. The lower portion of the back insulating layer 184 may include a lower surface that is opposite an upper surface of the back insulating layer 184, which faces the second surface BS of the semiconductor substrate 103. In some embodiments, the insulating doped region 112a and the insulating doped region 184a may include the "A" element.

Contact structures 120 may be disposed to pass through the front lower insulating layer 112 and to be electrically connected to the contact regions 109.

Each of the contact structures 120 may include a contact plug 115 and a contact barrier layer 114 which covers a bottom surface and side surfaces of the contact plug 115. The contact barrier layer 114 may be formed of metal nitride (e.g., TiN or the like), and the contact plug 115 may be formed of a metal material (e.g., W or the like). Each of the contact structures 120 may include a doped region 119a in which the "A" element is doped in an upper portion thereof, like the through via structure 145.

A first inter-metal insulating layer 147 may be disposed on the front lower insulating layer 112. A via pad 156 and wiring structures 158 and 159 may be disposed to pass through the first inter-metal insulating layer 147. Each of the via pad 156 and the wiring structures 158 and 159 may include a conductive material layer 155b and a conductive barrier layer 155a which covers a bottom surface and side surfaces of the conductive material layer 155b.

The via pad 156 may be electrically connected to the through via structure 145. The via pad 156 may have a width greater than that of the through via structure 145. The via pad 156 may cover upper side surfaces of the through via structure 145 while covering an upper surface of the through via structure 145. The via pad 156 may cover upper side surfaces of the first region 140 of the through via structure 145 while covering an upper surface and side surfaces of the second region 145a of the through via structure 145. In the via pad 156, a bottom of a portion which covers the upper side surfaces of the through via structure 145 may be closer to the first surface FS of the semiconductor substrate 103 than an upper surface of the front lower insulating layer 112. Lower surfaces of edge portions of the via pad 156 may be disposed at a lower level than the upper surface of the front lower insulating layer 112. The lower surfaces of the edge portions of the via pad 156 may be disposed at a lower level than the upper surface of the first and second contact structures 119 and 120.

The wiring structures 158 and 159 may include a pair of wiring structures 158 electrically connected to the contact structures 120 and an intermediate wiring structure 159 which is between the pair of the wiring structures 158 and is spaced apart from the contact structures 120.

A first insulating barrier layer 162 and a second inter-metal insulating layer 164, which are sequentially stacked on the via pad 156, the wiring structures 158 and 159, and the first inter-metal insulating layer 147, may be disposed. The first insulating barrier layer 162 may be formed of silicon nitride. The second inter-metal insulating layer 164 may be formed of a silicon oxide-based insulating material.

A connection wiring 167 having a dual damascene wiring structure may be disposed in the second inter-metal insulating layer 164. The connection wiring 167 may pass through the first insulating barrier layer 162 to electrically connect the via pad 156 to the wiring structures 158 and 159. The connection wiring 167 may include a wiring material layer 166b and a wiring barrier layer 166a which covers a lower surface and side surfaces of the wiring material layer 166b.

A second insulating barrier layer 170 and a third inter-metal insulating layer 172, which are sequentially stacked on the connection wiring 167 and the second inter-metal insulating layer 164, may be disposed, and an upper wiring 173 having a dual damascene wiring structure may be disposed in the third inter-metal insulating layer 172 to pass through the second insulating barrier layer 170 and to be electrically connected to the connection wiring 167.

A third insulating barrier layer 174 and a front upper insulating layer 175 may be disposed on the third inter-metal insulating layer 172 and the upper wiring 173. A contact plug 176 may be disposed to pass through the front upper insulating layer 175 and the third insulating barrier layer 174 and to be electrically connected to the upper wiring 173. A front pad 177 may be disposed on the contact plug 176.

A front protective layer 178 may be disposed to cover the front pad 177 and the front upper insulating layer 175. The front protective layer 178 may be formed of an insulating material such as polyimide, silicon nitride, or the like. A front conductive pattern 181 may be disposed to pass through the front protective layer 178 and to be electrically connected to the front pad 177. The front conductive pattern 181 may include a first front conductive pattern 180a and a second front conductive pattern 180b disposed on the first front conductive pattern 180a.

A back inter-metal insulating layer 186 may be disposed on the back insulating layer 184 on the second surface BS of the semiconductor substrate 103. The back inter-metal insulating layer 186 may be formed of an insulating material such as silicon oxide or the like.

A back rewiring structure 189 may be disposed in the back inter-metal insulating layer 186 to be electrically connected to the third region 145b of the through via structure 145. The back rewiring structure 189 may be formed to have a damascene wiring structure. The back rewiring structure 189 may include a conductive material layer 188b and a conductive barrier layer 188a which covers a bottom surface and side surfaces of the conductive material layer 188b.

A back insulating barrier layer 191 and a back protective layer 193 may be disposed on the back inter-metal insulating layer 186. The back insulating barrier layer 191 may be formed of a material such as silicon nitride or the like.

The back insulating layer 184, the back inter-metal insulating layer 186, the back insulating barrier layer 191, and the back protective layer 193 may be sequentially disposed on the second surface BS of the semiconductor substrate 103 as illustrated in FIG. 5.

A back conductive pattern 196 may be disposed to pass through the back protective layer 193 and the back insulating barrier layer 191 and to be electrically connected to the back rewiring structure 189.

The back conductive pattern 196 may include a first back conductive pattern 195a and a second back conductive pattern 195b disposed on the first back conductive pattern 195a. The back conductive pattern 196 may be a back bump.

Figure 6:
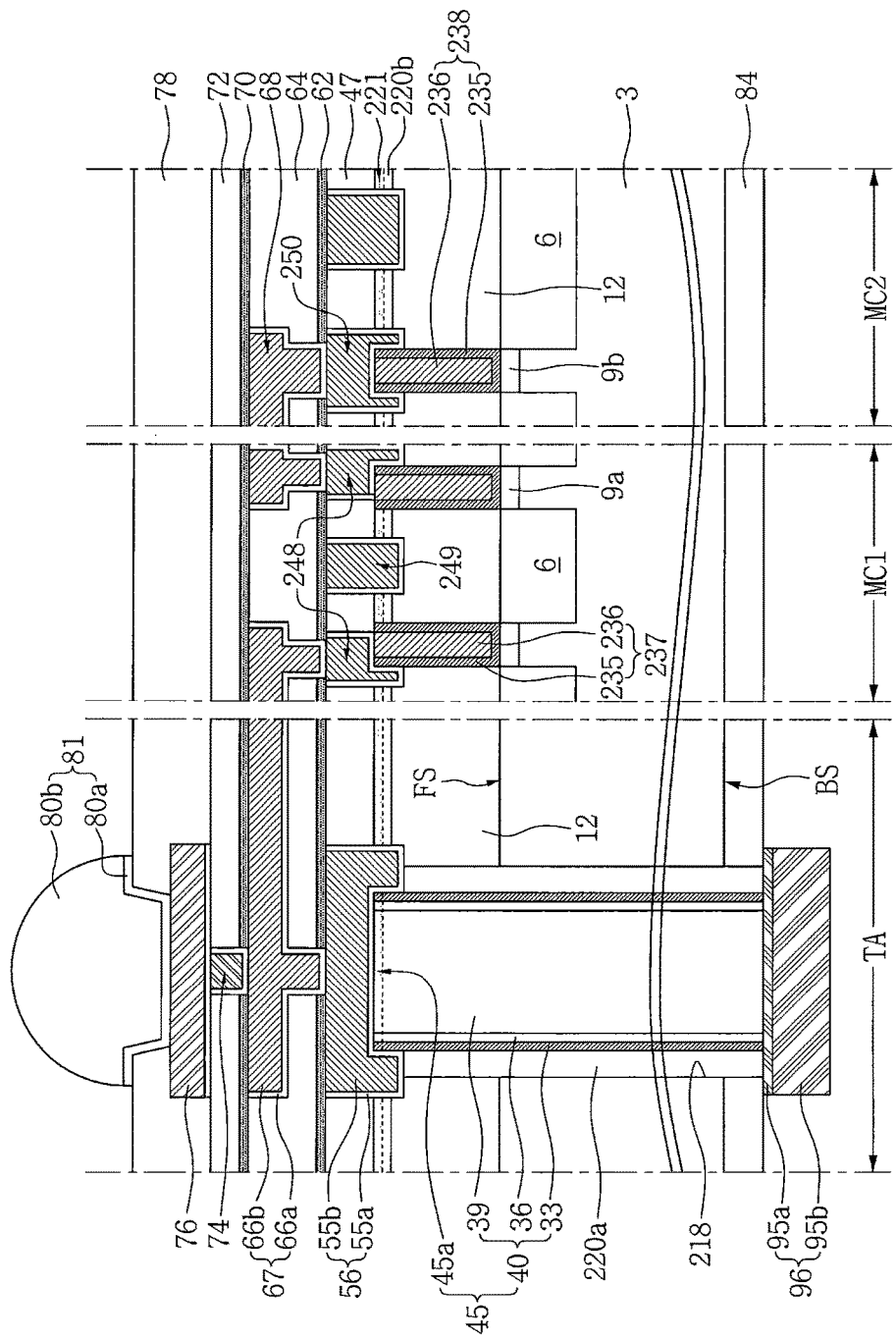
FIG. 6 is a cross-sectional view of a semiconductor device according to some embodiments of the inventive concepts.

A semiconductor device according to some embodiments of the inventive concepts will be described with reference to FIG. 6. FIG. 6 is a cross-sectional view illustrating a semiconductor device according to some embodiments of the inventive, concepts. In FIG. 6, a region denoted by "TA" may represent a through via region, a region denoted by "MC1" may represent a first circuit region, and a region denoted by "MC2" may represent a second circuit region.

Referring to FIG. 6, the semiconductor substrate 3 having the first surface FS and the second surface BS, which is the same as described with reference to FIG. 1, may be prepared. The first and second contact regions 9a and 9b, which are the same as described with reference to FIG. 1, may be disposed on the first surface FS of the semiconductor substrate 3, and the contact regions 9a and 9b may be disposed in active regions defined by device isolation regions 6 formed in the first surface FS of the semiconductor substrate 3. Further, as described in FIG. 1, the front lower insulating layer 12 may be disposed on the first surface FS of the semiconductor substrate 3, and the back insulating layer 84 may be disposed on the second surface BS of the semiconductor substrate 3.

A via hole 218 may be disposed to pass through the front lower insulating layer 12 and the back insulating layer 84 while passing through the semiconductor substrate 3.

A through via structure 45 may be disposed in the via hole 218. A via insulating layer 220a may be disposed in the via hole 218 to surround side surfaces of the through via structure 45.

The through via structure 45 may be formed of the same material and to have the same structure as the through via structure 45 described with reference to FIGS. 1 and 2.

An intermediate insulating layer 220b may be disposed on the front lower insulating layer 12. The via insulating layer 220a and the intermediate insulating layer 220b may include the same material, for example, a silicon oxide-based insulating material.

The intermediate insulating layer 220b may include an insulating doped region 221 disposed in an upper portion of the intermediate insulating layer 220b. The intermediate insulating layer 220b may be formed of a silicon oxide material, and the doped region 221 may be formed of a SiON material.

The upper surface of the intermediate insulating layer 220b may be disposed in the same plane as an upper surface of the through via structure 45. The upper surface of the intermediate insulating layer 220b may be coplanar with the upper surface of the through via structure 45.

First and second contact structures 237 and 238 may be disposed to pass through the front lower insulating layer 12 and the intermediate insulating layer 220b. The first contact structures 237 may be disposed in the first circuit region MC1 and may be electrically connected to the first contact regions 9a. The second contact structure 238 may be disposed in the second circuit region MC2 and may be electrically connected to the second contact region 9b.

Each of the first and second contact structures 237 and 238 may include a contact plug 236 and a contact barrier layer 235 which covers a bottom surface and side surfaces of the contact plug 236. The contact barrier layer 235 may be formed of metal nitride (e.g., TiN or the like), and the contact plug 236 may be formed of a metal material (e.g., W or the like).

In some embodiments, the through via structure 45 may include a different metal material from those of the first and second contact structures 237 and 238. For example, the via conductive pattern 39 of the through via structure 45 may be formed of a Cu material, and the contact plugs 236 of the first and second contact structures 237 and 238 may be formed of a tungsten (W) material.

In some embodiments, the through via structure 45 may include a doped region 45a in which the "A" element, which is the same as described in FIG. 1, is doped in the upper portion thereof, and upper portions of the first and second contact structures 237 and 238 may not be doped with the "A" element.

In some embodiments, the upper surface of the through via structure 45 may be disposed in the same plane as the upper surfaces of the first and second contact structures 237 and 238.

The first inter-metal insulating layer 47, which is the same as described with reference to FIG. 1, may be disposed on the intermediate insulating layer 220b.

The via pad 56, which is the same as described with reference to FIG. 1, may be disposed. The via pad 56 may be electrically connected to the through via structure 45, may have a width greater than that of the via structure 45, and may cover the upper surface of the via structure 45.

First wiring structures 248 that can be electrically connected to the first contact structures 237, an intermediate wiring structure 249, which is disposed between the first wiring structures 248 and is spaced apart from the first contact structures 237, and a second wiring structure 250 that can be electrically connected to the second contact structure 238 may be disposed. The via pad 56, the first wiring structures 248, the intermediate wiring structure 249, and the second wiring structure 250 may be formed of the same material, and may pass through the first inter-metal insulating layer 47 and the intermediate insulating layer 220b.

Each of the via pad 56, the first wiring structures 248, the intermediate wiring structure 249, and the second wiring structure 250 may include the conductive material layer 55b and the conductive barrier layer 55a which covers the bottom surface and the side surfaces of the conductive material layer 55b, which are the same as described with reference to FIG. 1.

The first insulating barrier layer 62, the second inter-metal insulating layer 64, the connection wirings 67 and 68, the second insulating barrier layer 70, the front upper insulating layer 72, the contact plug 74, the front pad 76, the front protective layer 78, and the front conductive pattern 81, which are the same as described with reference to FIG. 1, may be disposed on the via pad 56, the wiring structures 248, 249, and 250, and the first inter-metal insulating layer 47. Further, the back conductive pattern 96, which is the same as described with reference to FIG. 1, may be disposed.

A semiconductor device according to some embodiments of the inventive concepts will be described with reference to FIG. 7.

Figure 7:
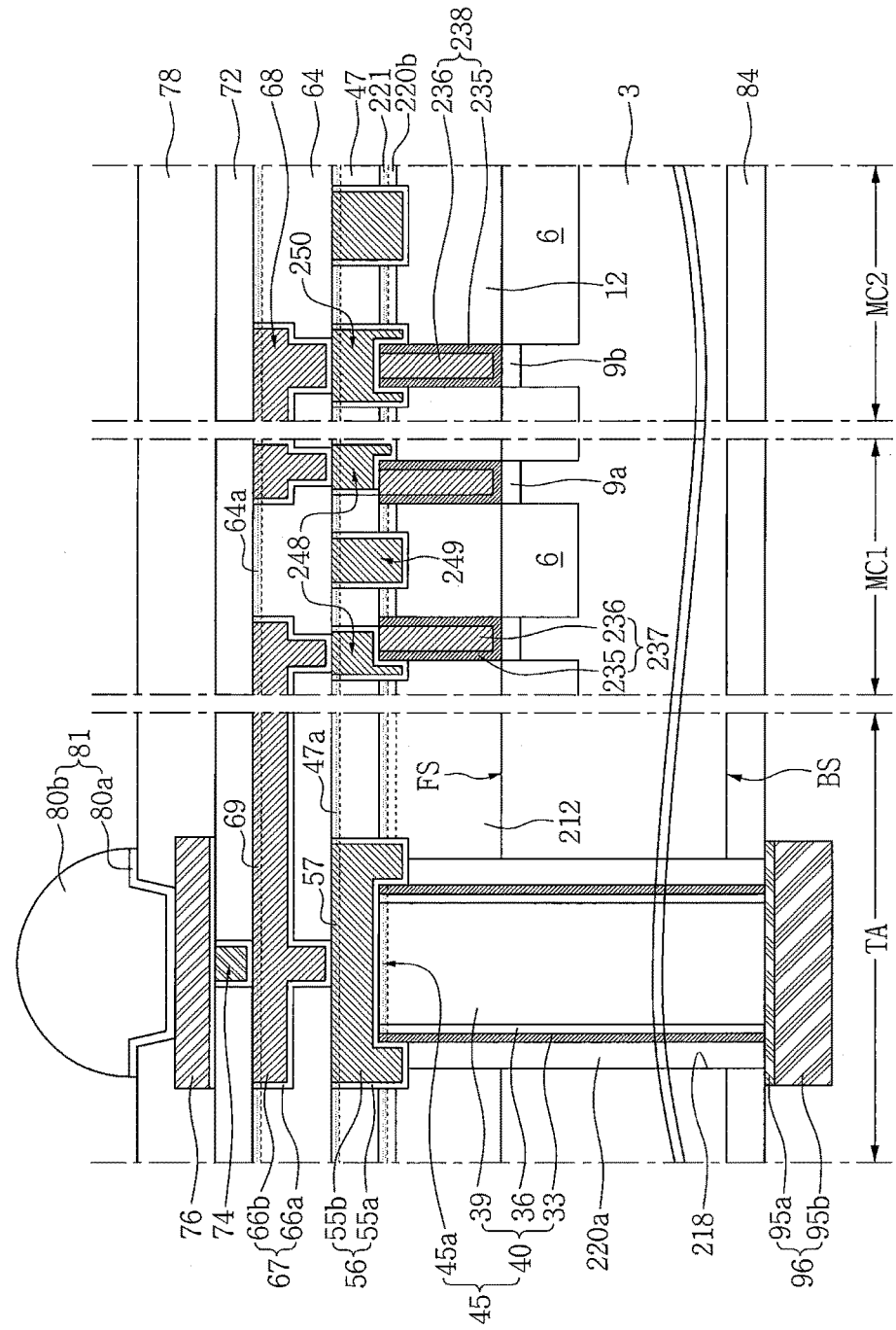
FIG. 7 is a cross-sectional view of a semiconductor device according to some embodiments of the inventive concepts.

Referring to FIG. 7, the semiconductor substrate 3, the front lower insulating layer 12, the back insulating layer 84, the through via structure 45, the via insulating layer 220a, the first and second contact structures 237 and 238, and the intermediate insulating layer 220b, which are the same as described with reference to FIG. 6, may be disposed.

A first inter-metal insulating layer 47 may be disposed on the intermediate insulating layer 220b. The first inter-metal insulating layer 47 may be formed of a silicon oxide-based insulating material.

The via pad 56 and the wiring structures 248, 249, and 250, which are the same as described with reference to FIG. 6, may be disposed. Each of the via pad 56 and the wiring structures 248, 249, and 250 may include a conductive material layer 55b and a conductive barrier layer 55a which covers the bottom surface and the side surfaces of the conductive material layer 55b as described in FIG. 6. The via pad 56 and the wiring structures 248, 249, and 250 may be formed of the same metal material, and may include a conductive doped region 57 in which one, two, or more elements of "silicon (Si)," "oxygen (O)," and "nitrogen (N)" are doped in the upper portion of the metal material.

The first inter-metal insulating layer 47 may include an insulating doped region 47a formed in the upper portion thereof as described with reference to FIG. 4. The first inter-metal insulating layer 47 may be formed of silicon oxide, and the doped region 47a of the first inter-metal insulating layer 47 may be formed of a SiON material.

The via pad 56 and the wiring structures 248, 249, and 250 may pass through the first inter-metal insulating layer 47 and the intermediate insulating layer 220b and may extend into the front lower insulating layer 12 as described with reference to FIG. 6.

The second inter-metal insulating layer 64 including the insulating doped region 64a, the connection wirings 67 and 68 including the conductive doped region 69, the front upper insulating layer 72, the contact plug 74, the front pad 76, the front protective layer 78, and the front conductive pattern 81, which are the same as described with reference to FIG. 4, may be disposed on the via pad 56, the wiring structures 248, 249, and 250, and the first inter-metal insulating layer 47. Further, the back conductive pattern 96, which is the same as described with reference to FIG. 1, may be disposed.

A semiconductor device according to some embodiments of the inventive concepts will be described with reference to FIG. 8.

Figure 8:
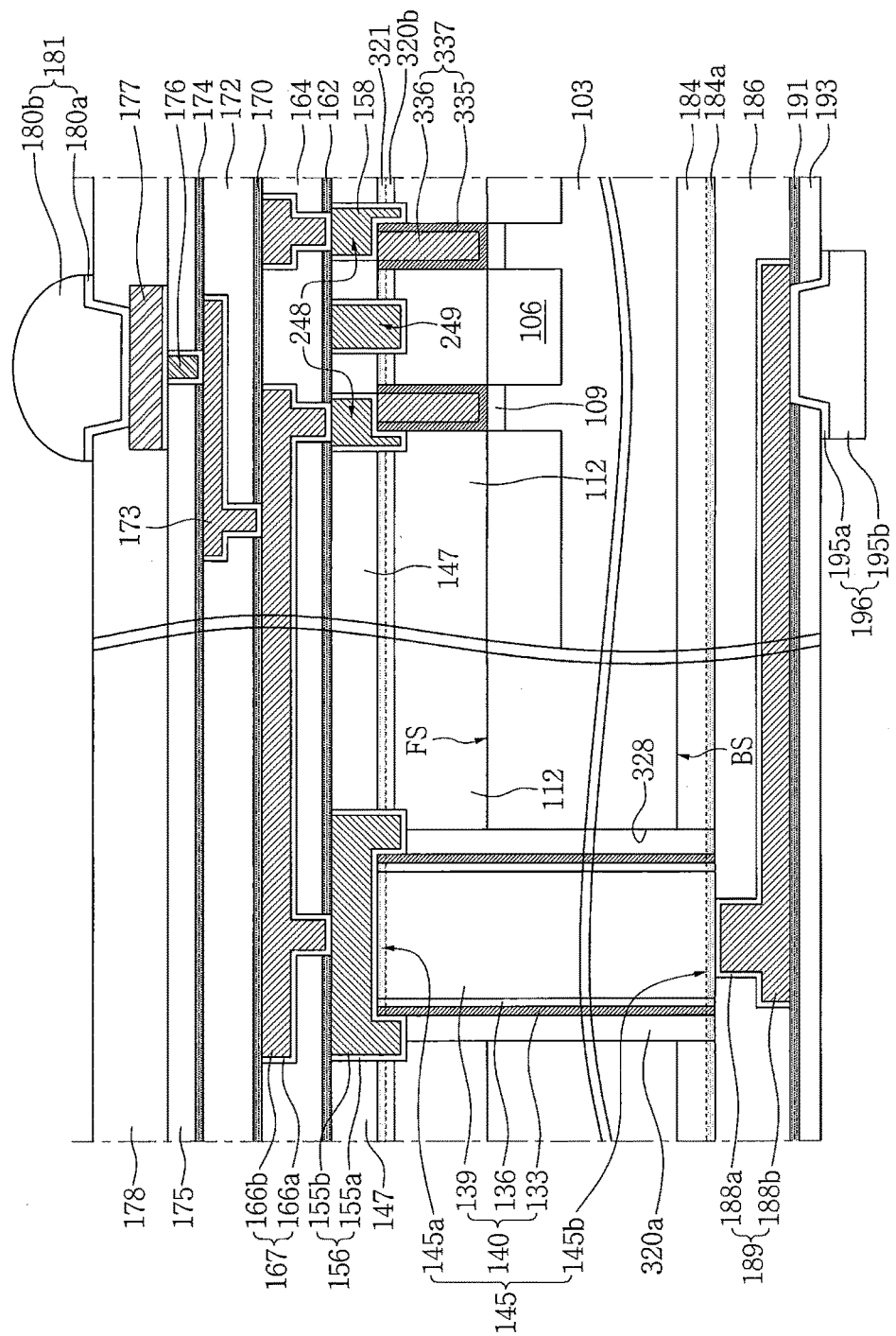
FIG. 8 is a cross-sectional view of a semiconductor device according to some embodiments of the inventive concepts.

Referring to FIG. 8, the semiconductor substrate 103 having the first surface FS and the second surface BS, which is the same as described with reference to FIG. 5, may be provided. The contact regions 109, which are the same as described with reference to FIG. 5, may be disposed on the first surface FS of the semiconductor substrate 103.

A front lower insulating layer 112 may be disposed on the first surface FS of the semiconductor substrate 103. An intermediate insulating layer 320b may be disposed on the front lower insulating layer 112.

The back insulating layer 184 including the insulating doped region 184a, which is the same as described with reference to FIG. 5, may be disposed on the second surface BS of the semiconductor substrate 103.

A via hole 328 may be disposed to pass through the front lower insulating layer 112, the intermediate insulating layer 320b, and the back insulating layer 184 while passing through the semiconductor substrate 103.

The through via structure 145, which is the same as described with reference to FIG. 5, may be disposed in the via hole 328. A via insulating layer 320a may be disposed in the via hole 328 to surround the side surfaces of the through via structure 145.

The via insulating layer 320a and the intermediate insulating layer 320b may include the same material, for example, a silicon oxide-based insulating material. The intermediate insulating layer 320b may include an insulating doped region 321 disposed in an upper portion of the intermediate insulating layer 320b. The intermediate insulating layer 320b may be formed of a silicon oxide material, and the doped region 321 in the upper portion of the intermediate insulating layer 320b may be formed of a SiON material.

The upper surface of the through via structure 145 may be disposed in the same plane as an upper surface of the doped region 321 of the intermediate insulating layer 320b.

Contact structures 337 may be disposed to pass through the front lower insulating layer 112 and the intermediate insulating layer 320b and to be electrically connected to the contact regions 109.

Each of the contact structures 337 may include a contact plug 336 and a contact barrier layer 335 which covers a bottom surface and side surfaces of the contact plug 336. The contact barrier layer 335 may be formed of metal nitride (e.g., TiN or the like), and the contact plug 336 may be formed of a metal material (e.g., W or the like).

As described with reference to FIG. 5, the upper portion of the through via structure 145 may be doped with the "A" element. Upper portions of the contact structures 337 may not be doped with the "A" element. The upper surface of the through via structure 145 may be disposed in the same plane as the upper surfaces of the contact structures 337.

The first inter-metal insulating layer 147, the via pad 156, the wiring structures 158 and 159, the first insulating barrier layer 162, the second inter-metal insulating layer 164, the connection wiring 167, the second insulating barrier layer 170, the third inter-metal insulating layer 172, the upper wiring 173, the third insulating barrier layer 174, the front upper insulating layer 175, the contact plug 176, the front pad 177, the front protective layer 178, and the front conductive pattern 181, which are the same as described with reference to FIG. 5, may be disposed on the through via structure 145 and the intermediate insulating layer 320b.

The back inter-metal insulating layer 186, the back rewiring structure 189, the back insulating barrier layer 191, the back protective layer 193, and the back conductive pattern 196, which are the same as described with reference to FIG. 5, may be disposed on the back insulating layer 184 of the second surface BS of the semiconductor substrate 103.

A semiconductor device according to some embodiments of the inventive concepts will be described with reference to FIG. 9.

Figure 9:
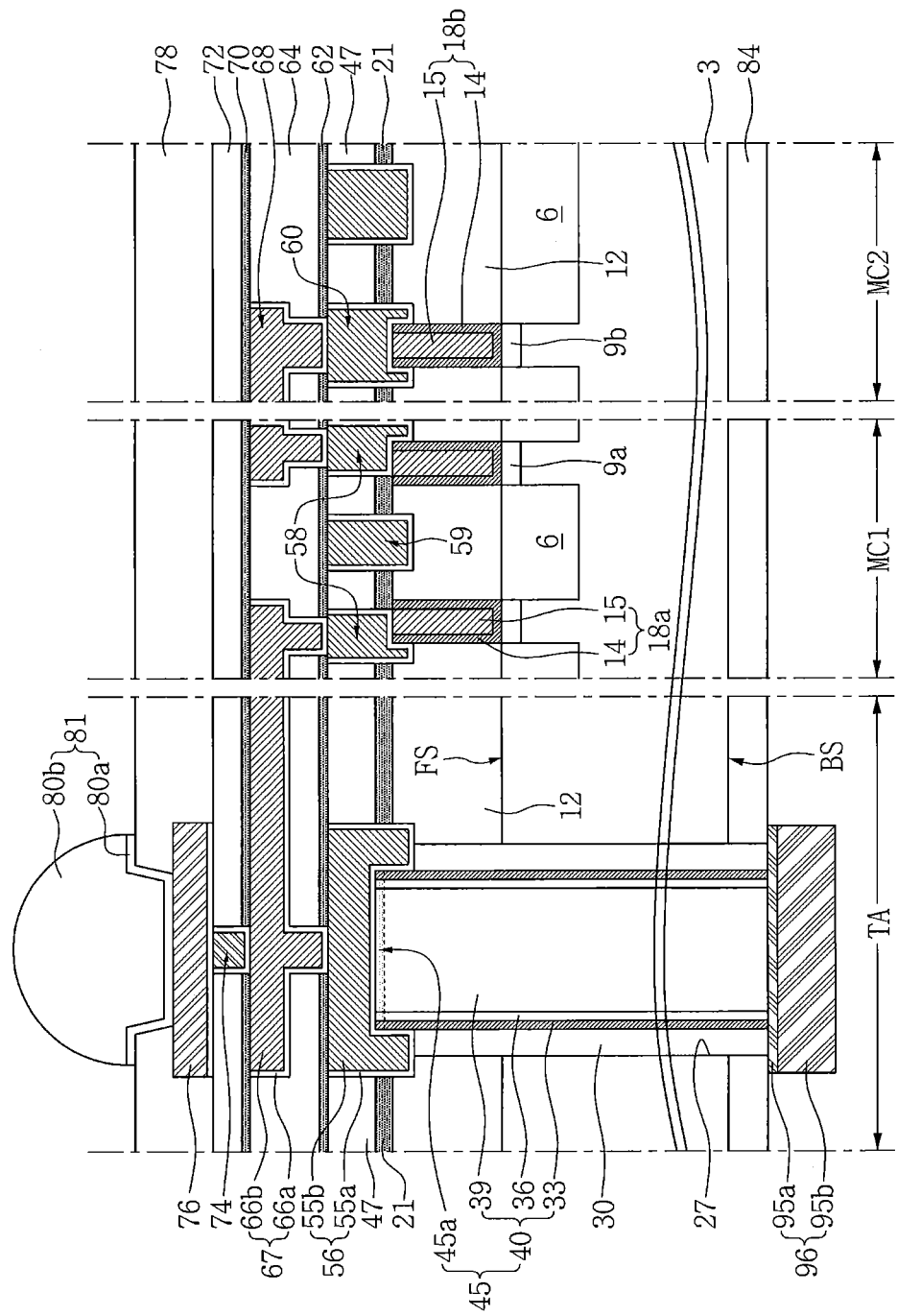
FIG. 9 is a cross-sectional view of a semiconductor device according to some embodiments of the inventive concepts.

Referring to FIG. 9, the semiconductor substrate 3 having the first surface FS and the second surface BS, which is the same as described with reference to FIG. 1, may be prepared. Further, the first and second contact regions 9a and 9b, which are the same as described with reference to FIG. 1, may be disposed on the first surface FS of the semiconductor substrate 3, which is the same as described with reference to FIG. 1, and the contact regions 9a and 9b may be disposed in the active regions defined by device isolation regions 6 formed in the first surface FS of the semiconductor substrate 3. A front lower insulating layer 12 may be disposed on the first surface FS of the semiconductor substrate 3.

First and second contact structures 18a and 18b may be disposed to pass through the front lower insulating layer 12. The first contact structures 18a may be disposed in the first circuit region MC1 and may be electrically connected to the first contact regions 9a. The second contact structure 18b may be disposed in the second circuit region MC2 and may be electrically connected to the second contact region 9b.

Each of the first and second contact structures 18a and 18b may include a contact plug 15 and a contact barrier layer 14 which covers a bottom surface and side surfaces of the contact plug 15. The contact barrier layer 14 may be formed of metal nitride (e.g., TiN or the like), and the contact plug 15 may be formed of a metal material (e.g., W or the like).

An intermediate insulating layer 21 may be disposed on the front lower insulating layer 12. The front lower insulating layer 12 may be formed of silicon oxide, and the intermediate insulating layer 21 may be formed of a different insulating material from that of the front lower insulating layer 12, for example, silicon nitride.

The back insulating layer 84, which is the same as described with reference to FIG. 1, may be disposed on the second surface BS of the semiconductor substrate 3.

The through via structure 45 and the via insulating layer 30, which are the same as described with reference to FIG. 1, may be disposed. The through via structure 45 and the via insulating layer 30 may be disposed in a via hole 27 passing through the front lower insulating layer 12, the intermediate insulating layer 21, and the back insulating layer 84 while passing through the semiconductor substrate 3.

The first inter-metal insulating layer 47, which is the same as described with reference to FIG. 1, may be disposed on the intermediate insulating layer 21. The via pad 56 that can be electrically connected to the through via structure 45, the first wiring structures 58 that can be electrically connected to the first contact structures 18a, and the second wiring structure 60 that can be electrically connected to the second contact structure 18b, which are the same as described with reference to FIG. 1, may be disposed. The via pad 56, the first wiring structures 58, and the second wiring structure 60 may pass through the first inter-metal insulating layer 47 and the intermediate insulating layer 21.

The first insulating barrier layer 62, the second inter-metal insulating layer 64, the connection wirings 67 and 68, the second insulating barrier layer 70, the front upper insulating layer 72, the contact plug 74, the front pad 76, the front protective layer 78, and the front conductive pattern 81, which are the same as described with reference to FIG. 1, may be disposed on the intermediate insulating layer 21, the via pad 56, the first wiring structures 58, and the second wiring structure 60.

Further, the back conductive pattern 96, which is the same as described with reference to FIG. 1, may be disposed in on the back insulating layer 84.

A semiconductor device according to some embodiments of the inventive concepts will be described with reference to FIG. 10.

Figure 10:
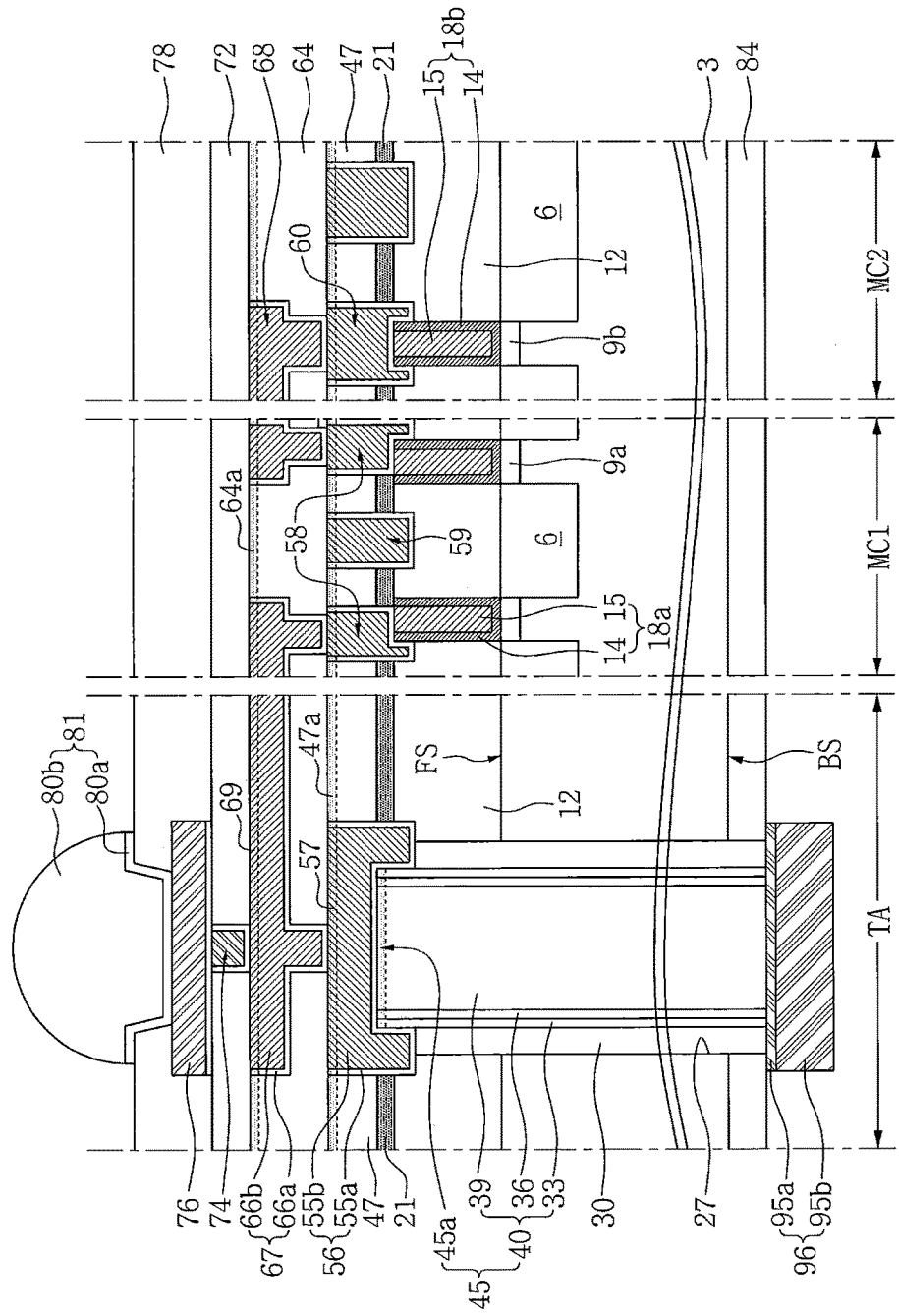
FIG. 10 is a cross-sectional view of a semiconductor device according to some embodiments of the inventive concepts.

Referring to FIG. 10, the semiconductor substrate 3, the front lower insulating layer 12, the first and second contact structures 18a and 18b, the intermediate insulating layer 21, the back insulating layer 84, the back conductive pattern 96, the through via structure 45, and the via insulating layer 30, which are the same as described with reference to FIG. 9, may be disposed.

A first inter-metal insulating layer 47 may be disposed on the intermediate insulating layer 21. The first inter-metal insulating layer 47 may be formed of a silicon oxide-based insulating material.

As described with reference to FIG. 4, the via pad 56 and the wiring structures 58, 59, and 60 may be disposed. Each of the via pad 56 and the wiring structures 58, 59, and 60 may include the conductive material layer 55b and the conductive barrier layer 55a which covers the bottom surface and side surfaces of the conductive material layer 55b as described in FIG. 4. Each of the via pad 56 and the wiring structures 58, 59, and 60 may include the doped region 57, which is the same as described with reference to FIG. 4. The first inter-metal insulating layer 47 may include the insulating doped region 47a formed in the upper portion thereof as described with reference to FIG. 4.

The via pad 56 and the wiring structures 58, 59, and 60 may pass through the first inter-metal insulating layer 47 and the intermediate insulating layer 21 and extend into the front lower insulating layer 12 as described with reference to FIG. 9. The via pad 56 may be electrically connected to the through via structure 45, the first wiring structures 58 may be electrically connected to the first contact structures 18a, the intermediate wiring structure 59 may be disposed between the first wiring structures 58, and the second wiring structure 60 may be electrically connected to the second contact structure 18b.

The second inter-metal insulating layer 64 including the insulating doped region 64a, the connection wirings 67 and 68 including the conductive doped region 69, the front upper insulating layer 72, the contact plug 74, the front pad 76, the front protective layer 78, and the front conductive pattern 81, which are the same as described with reference to FIG. 4, may be disposed on the via pad 56, the wiring structures 58, 59, and 60, and the first inter-metal insulating layer 47.

Further, the back conductive pattern 96, which is the same as described with reference to FIG. 4, may be disposed.

A semiconductor device according to some embodiments of the inventive concepts will be described with reference to FIG. 11.

Figure 11:
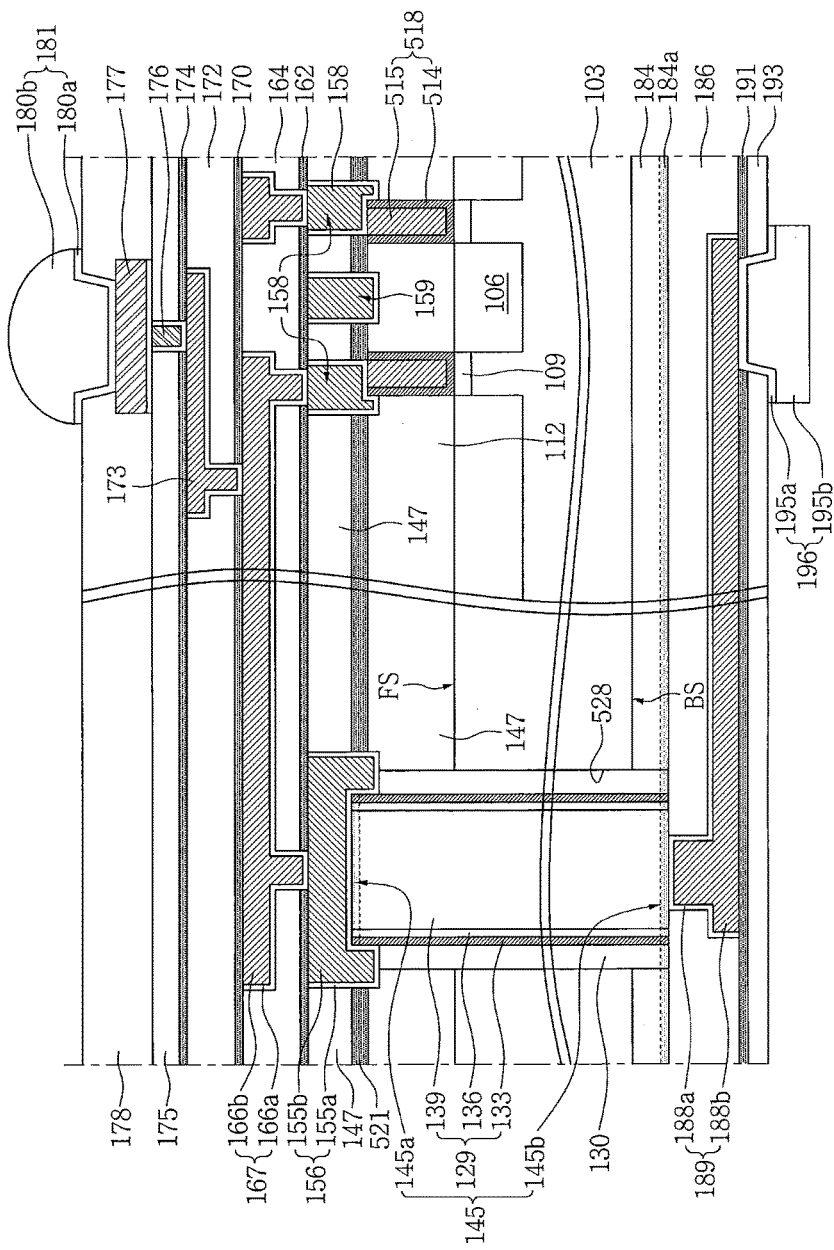
FIG. 11 is a cross-sectional view of a semiconductor device according to some embodiments of the inventive concepts.

Referring to FIG. 11, the semiconductor substrate 103 having the first surface FS and the second surface BS, which is the same as described with reference to FIG. 5, may be provided. The contact regions 109, which are the same as described with reference to FIG. 5, may be disposed on the first surface FS of the semiconductor substrate 103.

A front lower insulating layer 112 may be disposed on the first surface FS of the semiconductor substrate 103.

Contact structures 518 may be disposed to pass through the front lower insulating layer 112 and to be electrically connected to the contact regions 109. Each of the contact structures 518 may include a contact plug 515 and a contact barrier layer 514 which covers a bottom surface and side surfaces of the contact plug 515. The contact barrier layer 514 may be formed of metal nitride (e.g., TiN or the like), and the contact plug 515 may be formed of a metal material (e.g., W or the like).

An intermediate insulating layer 521 may be disposed on the front lower insulating layer 112 and the contact structures 518. The front lower insulating layer 112 may be formed of silicon oxide, and the intermediate insulating layer 521 may be formed of a different insulating material from that of the front lower insulating layer 112, for example, silicon nitride.

The back insulating layer 184 including the insulating doped region 184a, which is the same as described with reference to FIG. 5, may be disposed on the second surface BS of the semiconductor substrate 103.

A via hole 528 may be disposed to pass through the front lower insulating layer 112, the intermediate insulating layer 521, and the back insulating layer 184 while passing through the semiconductor substrate 103.

The through via structure 145, which is the same as described with reference to FIG. 5, may be disposed in the via hole 528. The upper surface of the through via structure 145 may be disposed in the same plane as an upper surface of the intermediate insulating layer 521.

A via insulating layer 130 may be disposed in the via hole 528 to surround the side surfaces of the through via structure 145. The via insulating layer 130 may be formed of silicon oxide, and the intermediate insulating layer 521 may be formed of a different insulating material from that of the via insulating layer 130, for example, silicon nitride.

The first inter-metal insulating layer 147, the via pad 156, the wiring structures 158 and 159, the first insulating barrier layer 162, the second inter-metal insulating layer 164, the connection wiring 167, the second insulating barrier layer 170, the third inter-metal insulating layer 172, the upper wiring 173, the third insulating barrier layer 174, the front upper insulating layer 175, the contact plug 176, the front pad 177, the front protective layer 178, and the front conductive pattern 181, which are the same as described with reference to FIG. 5, may be disposed on the through via structure 145 and the intermediate insulating layer 521.

The back inter-metal insulating layer 186, the back rewiring structure 189, the back insulating barrier layer 191, the back protective layer 193, and the back conductive pattern 196, which are the same as described with reference to FIG. 5, may be disposed on the back insulating layer 184 of the second surface BS of the semiconductor substrate 103.

In some embodiments of the inventive concepts, the via pad (e.g., 56 in FIG. 1) may cover the entire upper surface of the through via structure (e.g., 45) as described with reference to FIG. 1. However, the inventive concepts are not limited thereto. For example, the via pad may have a portion which overlaps a portion of the upper surface of the through via structure in plan view or a portion which is in contact therewith.

Figure 12:
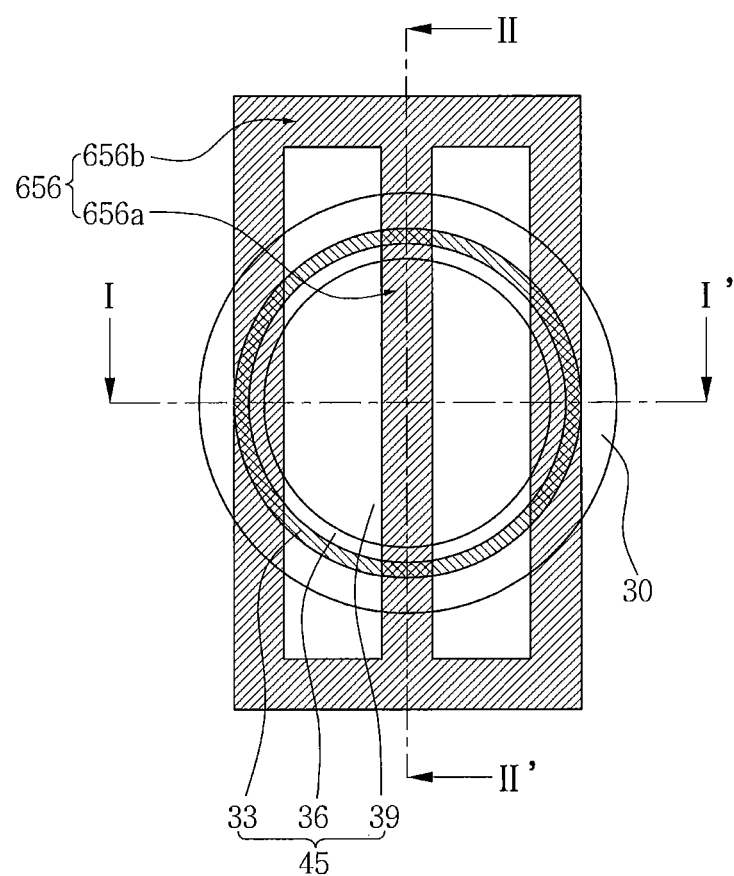
FIG. 12 is a plan view of a semiconductor device according to some embodiments of the inventive concepts.
Figure 13:
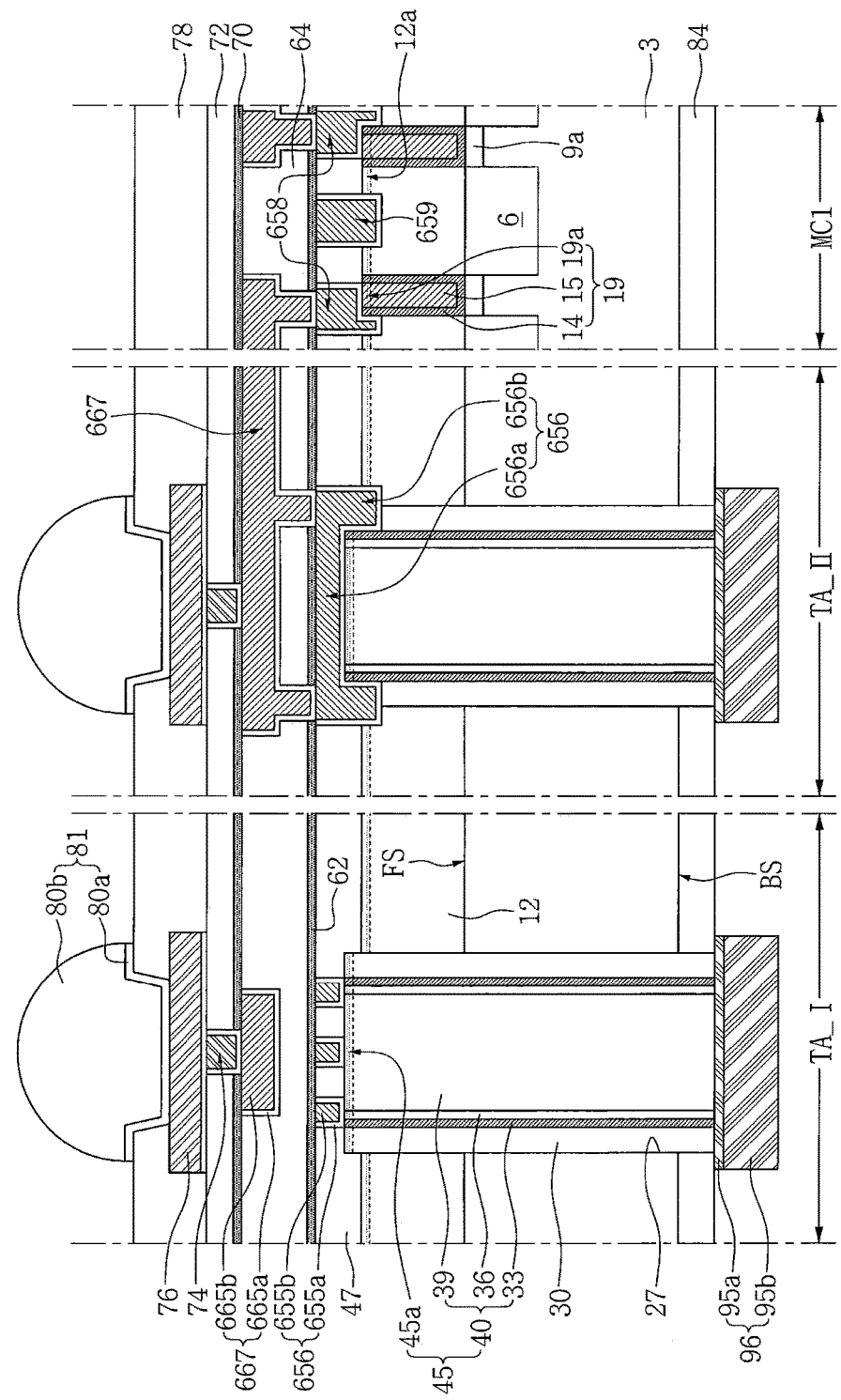
FIG. 13 is a cross-sectional view of a semiconductor device according to some embodiments of the inventive concepts.
Figure 14:
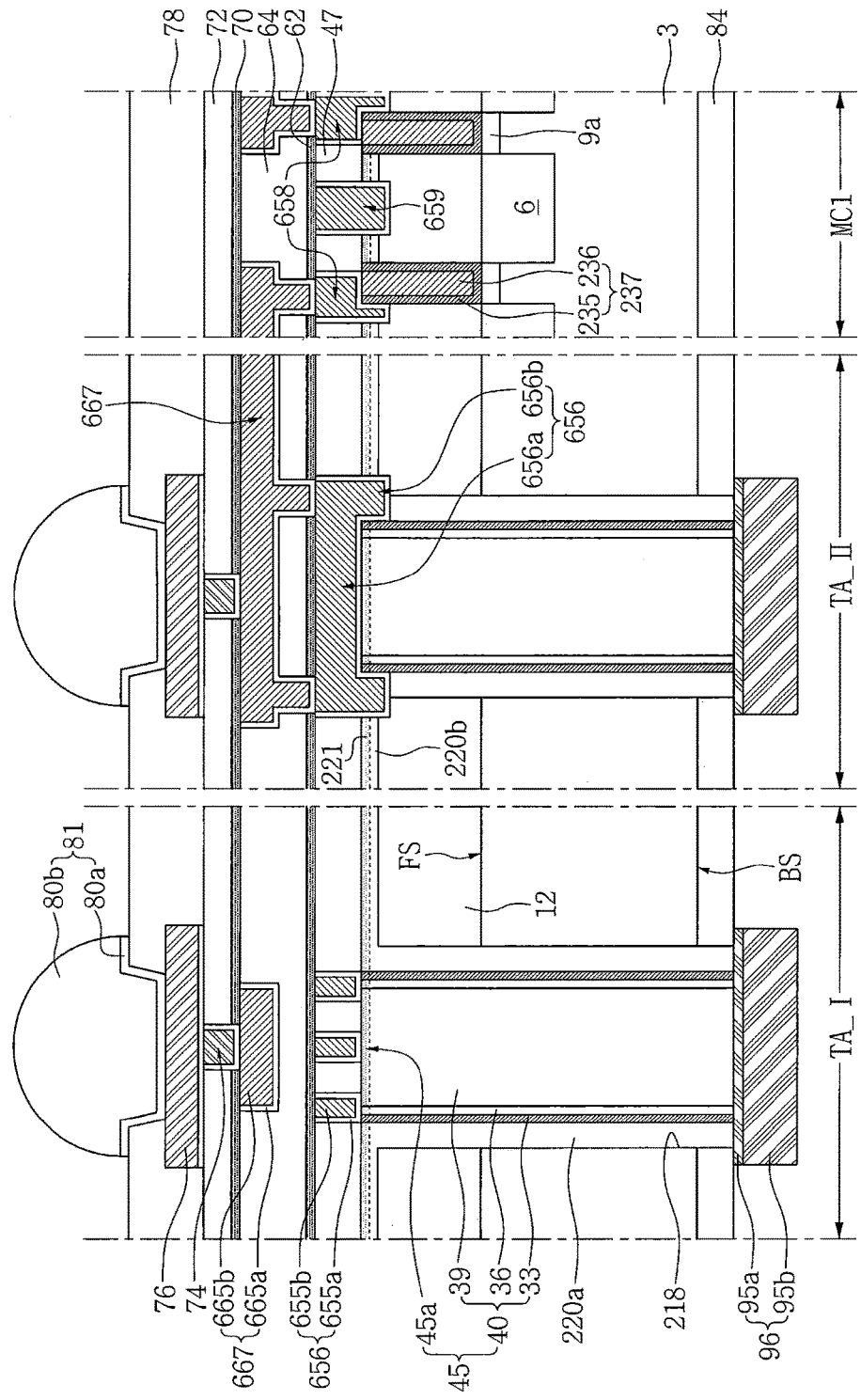
FIG. 14 is a cross-sectional view of a semiconductor device according to some embodiments of the inventive concepts.
Figure 15:
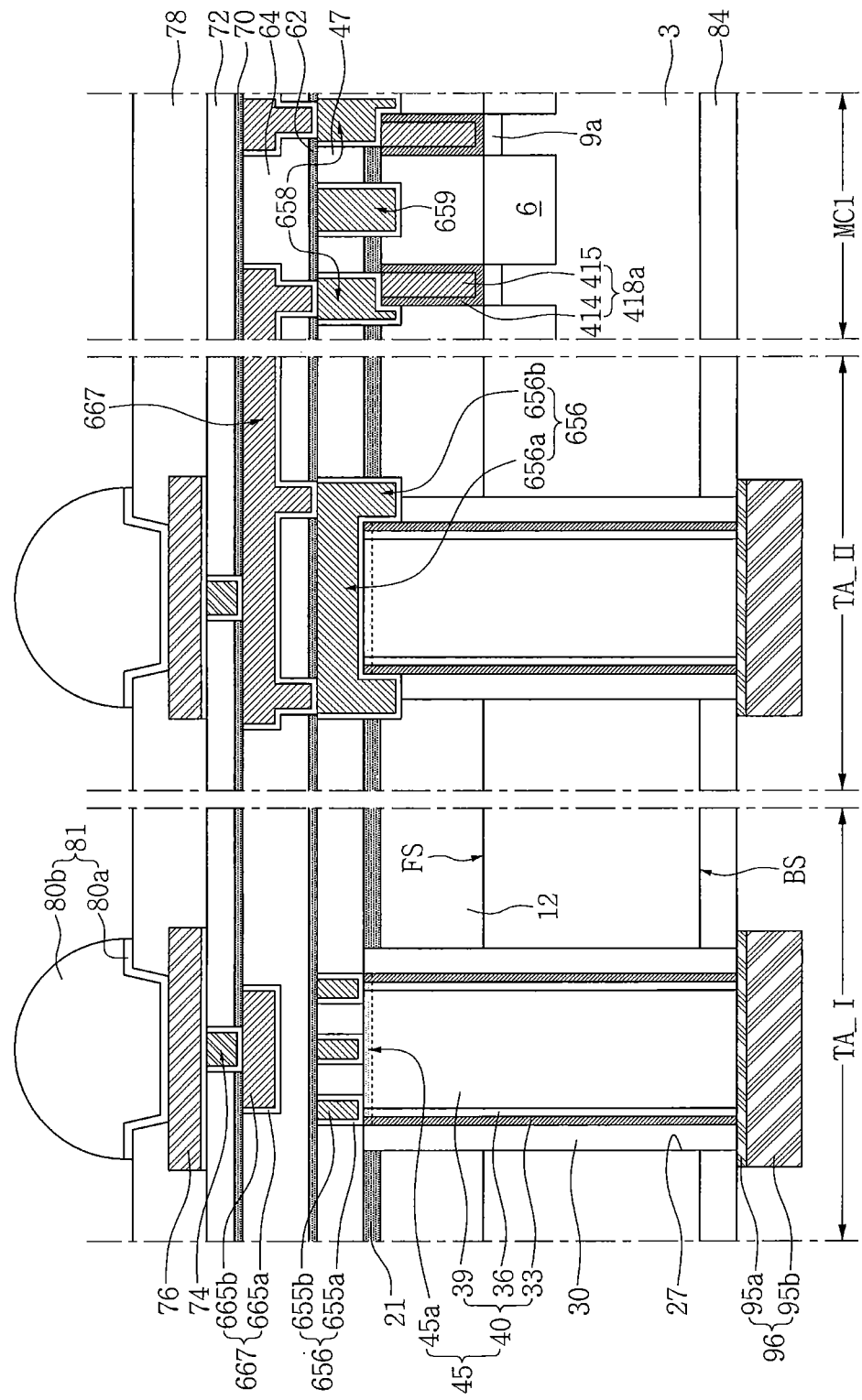
FIG. 15 is a cross-sectional view of a semiconductor device according to some embodiments of the inventive concepts.

Hereinafter, a semiconductor device including a via pad having a portion which overlaps the portion of the upper surface of the through via structure in plan view or the portion which is in contact therewith will be described with reference to FIGS. 12 to 15. FIG. 12 is a plan view illustrating a through via structure and a via pad of a semiconductor device according to some embodiments of the inventive concepts, and FIGS. 13, 14, and 15 are cross-sectional views of a semiconductor device according to some embodiments of the inventive concepts. In FIGS. 13, 14, and 15, a region denoted by "TA_I" may be a cross-sectional view taken along the line I-I' of FIG. 12, a region denoted by "TA_II" may be a cross-sectional view taken along the line II-II' of FIG. 12, and a region denoted by "MC1" may be the same as the region denoted by "MC1" of FIG. 1. Further, in FIGS. 13, 14, and 15, since components formed in the region denoted by "MC1" may be formed to have the same structure and of the same material as those of the components formed in the region denoted by "MC1" of FIG. 1, detailed description thereof is omitted.

A semiconductor device according to some embodiments of the inventive concepts will be described with reference to FIGS. 12 and 13.

Referring to FIGS. 12 and 13, the semiconductor substrate 3, the contact regions 9a, the front lower insulating layer 12, the back insulating layer 84, and the through via structure 45, which are the same as described with reference to FIG. 1, may be disposed.

The front lower insulating layer 12 may include the insulating doped region 12a, which is the same as described in FIG. 1.

The upper surfaces of the through via structure 45 and the via insulating layer 30 may be disposed in a different plane from the upper surface of the front lower insulating layer 12 as described with reference to FIG. 1. The upper surface of the through via structure 45 may be disposed at a higher level than the upper surface of the front lower insulating layer 12 relative to the first surface FS of the semiconductor substrate 3.

The contact structures 19 having the conductive doped region 19a, which are the same as described with reference to FIG. 1, may be disposed. The contact structures 19 may be electrically connected to the contact regions 9a while passing through the front lower insulating layer 12. Each of the contact structures 19 may include a contact plug 15 and a contact barrier layer 14 which covers a bottom surface and side surfaces of the contact plug 15.

A first inter-metal insulating layer 47 may be disposed on the front lower insulating layer 12 and the through via structure 45. The first inter-metal insulating layer 47 may be formed of a silicon oxide-based insulating material.

A via pad 656 and wiring structures 658 and 659 may be disposed to pass through the first inter-metal insulating layer 47. Each of the via pad 656 and the wiring structures 658 and 659 may include a conductive material layer 655b and a conductive barrier layer 655a which covers a bottom surface and side surfaces of the conductive material layer 655b. The wiring structures 658 and 659 may include a pair of first wiring structures 658 electrically connected to the contact structures 19 and an intermediate wiring structure 659 which is between the pair of the first wiring structures 658 and is electrically insulated from the contact structures 19.

In a plan view, the via pad 656 may include a plurality of line portions 656a and connection portion 656b which connect between end portions of the plurality of line portions 656a.

The plurality of line portions 656a may cross the upper surface of the through via structure 45 and extend onto the front lower insulating layer 12.

The connection portion 656b may not overlap the through via structure 45 and may be disposed on the front lower insulating layer 12. The upper surface of the through via structure 45 may be directly in contact with and/or may overlap the plurality of line portions 656a and the first inter-metal insulating layer 47 in plan view as illustrated in FIG. 12.

A first insulating barrier layer 62 and a second inter-metal insulating layer 64, which are sequentially stacked on the via pad 656, the wiring structures 658 and 659, and the first inter-metal insulating layer 47, may be disposed. The first insulating barrier layer 62 may be formed of silicon nitride. The second inter-metal insulating layer 64 may be formed of a silicon oxide-based insulating material.

A connection wiring 667 having a dual damascene wiring structure may be disposed in the second inter-metal insulating layer 64. The connection wiring 667 may include a wiring material layer 665b and a wiring barrier layer 665a which covers a lower surface and side surfaces of the wiring material layer 665b. The wiring material layer 665b may be formed of a metal material such as tungsten (W), copper (Cu), or the like, and the wiring barrier layer 665a may be formed of metal nitride such as TiN, TaN, or the like.

The connection wiring 667 may pass through the first insulating barrier layer 62 to electrically connect the via pad 656 to the wiring structures 658 and 659. The connection wiring 667 may pass through the first insulating barrier layer 62, may overlap and/or may be in contact with the connection portion 656b of the via pad 656, and may be electrically connected to the via pad 656.

The second insulating barrier layer 70, the front upper insulating layer 72, the contact plug 74, the front pad 76, the front protective layer 78, the front conductive pattern 81, and the back conductive pattern 96, which are the same as described with reference to FIG. 1, may be disposed on the connection wiring 667 and the second inter-metal insulating layer 64.

A semiconductor device according to some embodiments of the inventive concepts will be described with reference to FIG. 14.

Referring to FIGS. 12 and 14, the semiconductor substrate 3 having the first surface FS and the second surface BS, the contact regions 9a disposed on the first surface FS of the semiconductor substrate 3, the front lower insulating layer 12 disposed on the first surface FS of the semiconductor substrate 3, and the back insulating layer 84 disposed on the second surface BS of the semiconductor substrate 3, which are the same as described with reference to FIG. 6, may be disposed.

A via hole 218 passing through the front lower insulating layer 12 and the back insulating layer 84 while passing through the semiconductor substrate 3, which is the same as described with reference to FIG. 6, may be disposed. The through via structure 45 may be disposed in the via hole 218.

A via insulating layer 220a may be disposed in the via hole 218 to surround the side surfaces of the through via structure 45, and an intermediate insulating layer 220b may be disposed on the front lower insulating layer 12. The via insulating layer 220a and the intermediate insulating layer 220b may be continuously connected to each other and may include the same material, for example, a silicon oxide-based insulating material. Upper surfaces of the via insulating layer 220a and the intermediate insulating layer 220b may be disposed in the same plane as the upper surface of the through via structure 45.

The via insulating layer 220a and the intermediate insulating layer 220b may include an insulating doped region 221 disposed in the upper portions thereof. The intermediate insulating layer 220b may be formed of a silicon oxide material, and the doped region 221 may be formed of a SiON material.

Contact structures 237 may be disposed to pass through the front lower insulating layer 12 and the intermediate insulating layer 220b. Each of the contact structures 237 may include a contact plug 236 and a contact barrier layer 235 which covers a bottom surface and side surfaces of the contact plug 236.

The via pad 656, the wiring structures 658 and 659, the first inter-metal insulating layer 47, the first insulating barrier layer 62, the second inter-metal insulating layer 64, the connection wiring 667, the second insulating barrier layer 70, the front upper insulating layer 72, the contact plug 74, the front pad 76, the front protective layer 78, the front conductive pattern 81, and the back conductive pattern 96, which are the same as described with reference to FIGS. 12 and 13, may be disposed on the intermediate insulating layer 220b and the through via structure 45.

A semiconductor device according to some embodiments of the inventive concepts will be described with reference to FIG. 15.

Referring to FIGS. 12 and 15, the semiconductor substrate 3 having the first surface FS and the second surface BS, the contact regions 9a disposed on the first surface FS of the semiconductor substrate 3, the front lower insulating layer 12 disposed on the first surface FS of the semiconductor substrate 3, the contact structures 418a passing through the front lower insulating layer 12, the intermediate insulating layer 21 disposed on the front lower insulating layer 12, and the back insulating layer 84 disposed on the second surface BS of the semiconductor substrate 3, which are the same as described with reference to FIG. 9, may be disposed. Further, the through via structure 45 and the via insulating layer 30, which are the same as described with reference to FIG. 9, may be disposed. The upper surface of the through via structure 45 may be disposed in the same plane as the upper surface of the intermediate insulating layer 21 and at a higher level than an upper surface of the contact structures 18a.

The via pad 656, the wiring structures 658 and 659, the first inter-metal insulating layer 47, the first insulating barrier layer 62, the second inter-metal insulating layer 64, the connection wiring 667, the second insulating barrier layer 70, the front upper insulating layer 72, the contact plug 74, the front pad 76, the front protective layer 78, the front conductive pattern 81, and the back conductive pattern 96, which are the same as described with reference to FIGS. 12 and 13, may be disposed on the intermediate insulating layer 21 and the through via structure 45.

Methods of forming a semiconductor device according to some embodiments of the inventive concepts will be described.

A method of forming a semiconductor device according to some embodiments of the inventive concepts will be described with reference to FIGS. 16A to 16K.

Figure 16A:
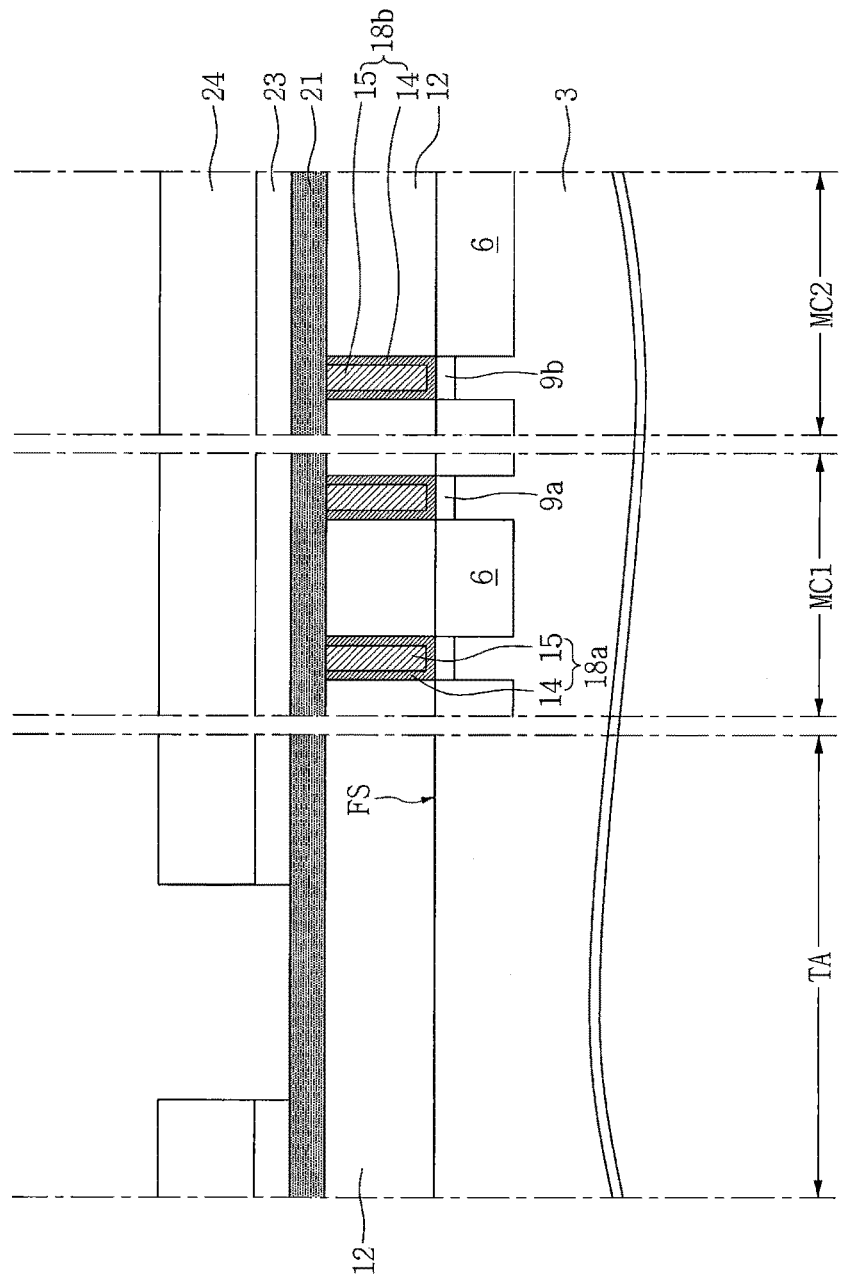

Referring to FIG. 16A, a semiconductor substrate 3 having a through via region TA, a first circuit region MC1, and a second circuit region MC2 may be prepared.

First and second contact regions 9a and 9b may be formed on the semiconductor substrate 3. The first and second contact regions 9a and 9b may be contact regions of devices constituting an internal circuit. For example, the first and second contact regions 9a and 9b may be source/drain regions of transistors. The first and second contact regions 9a and 9b may be formed in active regions of the semiconductor substrate 3 defined by trench device isolation regions 6. The first contact regions 9a may be formed in the first circuit region MC1, and the second contact region 9b may be formed in the second circuit region MC2.

A front lower insulating layer 12 may be formed on a first surface FS of the semiconductor substrate 3. The front lower insulating layer 12 may be formed of a silicon oxide-based insulating material.

First and second contact structures 18a and 18b may be formed to pass through the front lower insulating layer 12. The first contact structures 18a may be formed in the first circuit region MC1 and may be electrically connected to the first contact regions 9a. The second contact structure 18b may be formed in the second circuit region MC2 and may be electrically connected to the second contact region 9b. Each of the first and second contact structures 18a and 18b may include a contact plug 15 and a contact barrier layer 14 which covers a bottom surface and side surfaces of the contact plug 15. The contact barrier layer 14 may be formed of metal nitride (e.g., TiN or the like), and the contact plug 15 may be formed of a metal material (e.g., Cu or the like).

An intermediate insulating layer 21 may be formed on the front lower insulating layer 12 and the first and second contact structures 18a and 18b. The intermediate insulating layer 21 may be formed of, for example, silicon nitride.

A hard mask 23 and a photoresist pattern 24, which are sequentially stacked on the intermediate insulating layer 21, may be formed.

Figure 16B:
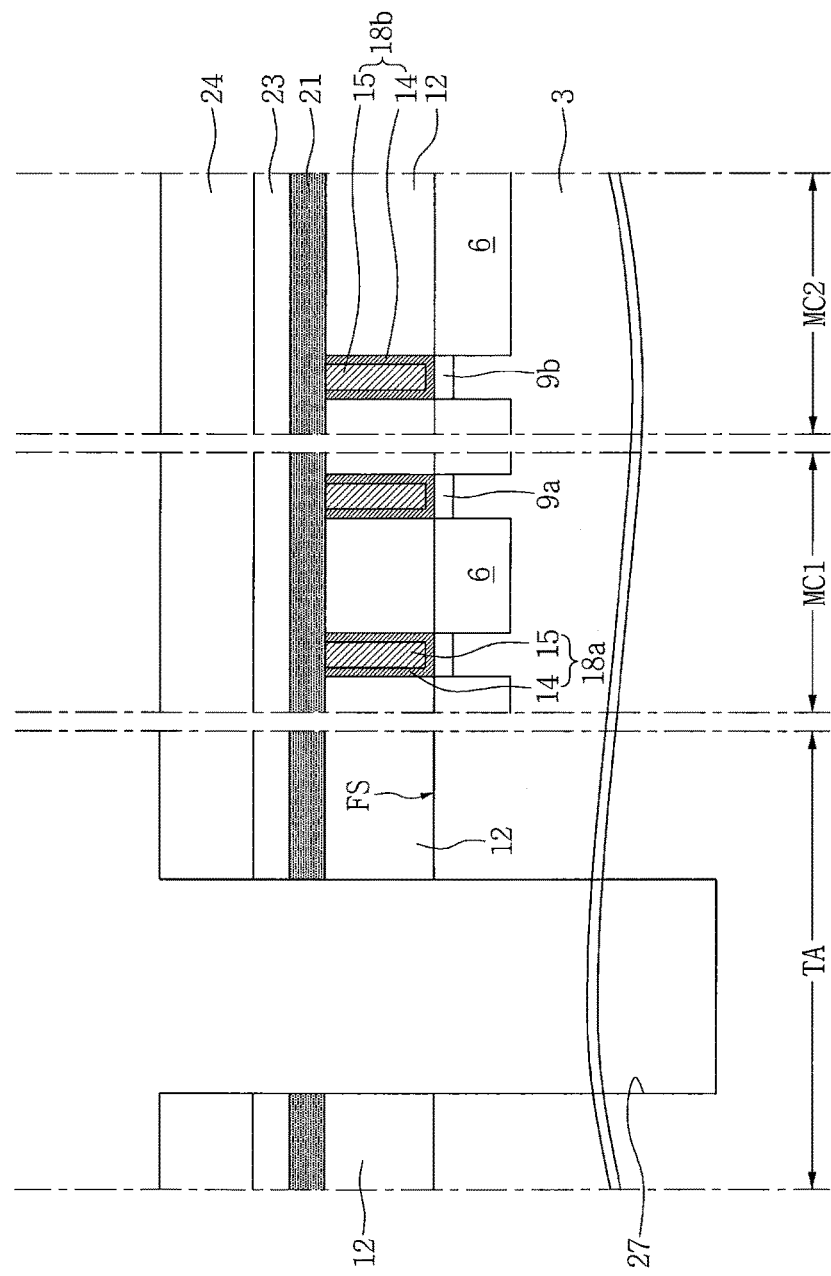

Referring to FIG. 16B, a via hole 27 may be formed by etching the intermediate insulating layer 21, the front lower insulating layer 12, and the semiconductor substrate 3 using the hard mask 23 and the photoresist pattern 24 as etching masks.

The via hole 27 may be formed to have a predetermined depth in the semiconductor substrate 3 while passing through the intermediate insulating layer 21 and the front lower insulating layer 12, and may not pass through the semiconductor substrate 3.

Referring to FIG. 16C, the intermediate insulating layer 21 may be exposed by removing the photoresist pattern 24 and the hard mask 23. Then, a cleaning process may be performed.

Figure 16D:
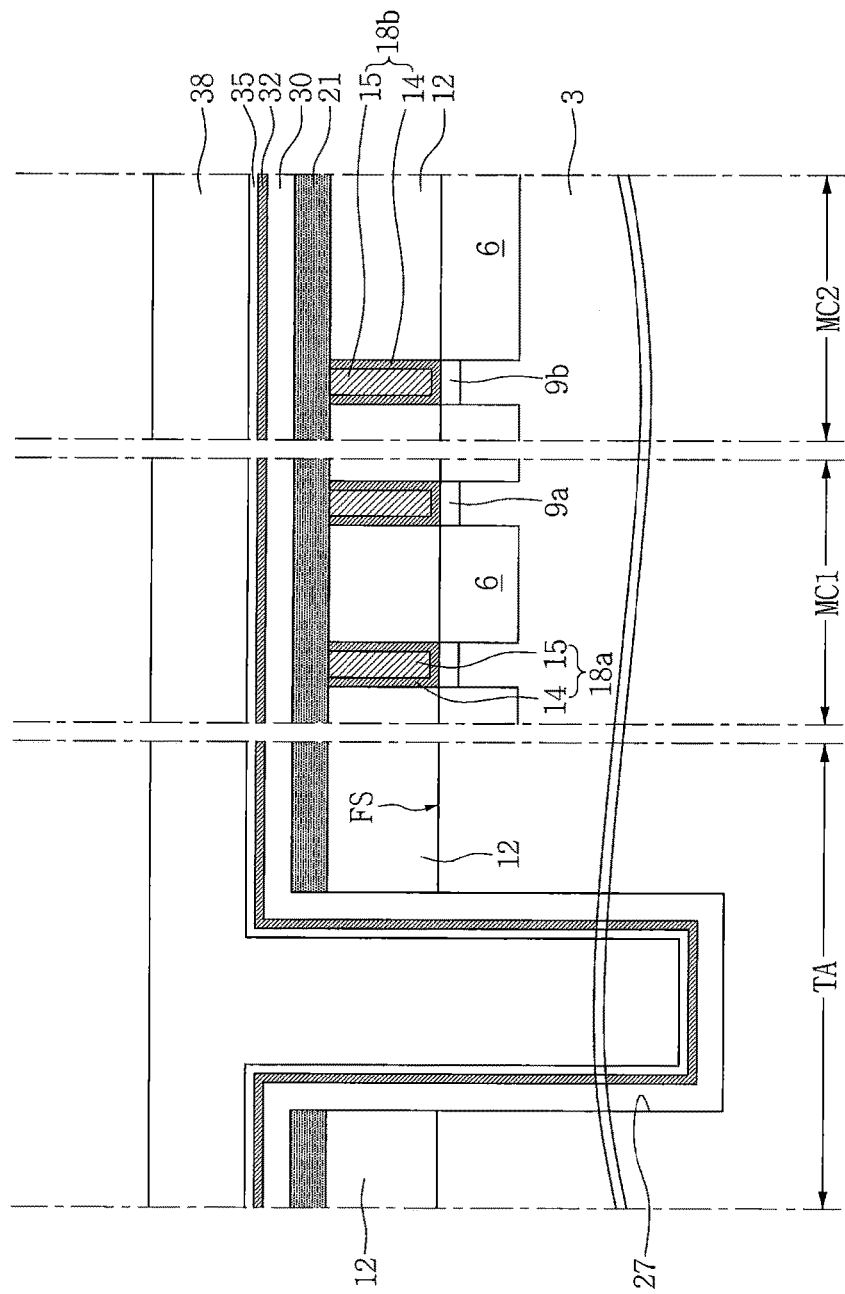

Referring to FIG. 16D, a via insulating layer 30 may be formed to cover an inner wall of the via hole 27 and an upper surface of the intermediate insulating layer 21. The via insulating layer 30 may be formed of an insulating material, for example, such as silicon oxide or the like.

A via barrier layer 32, a via seed layer 35, and a via conductive layer 38 may be sequentially formed on the via insulating layer 30. For example, the via barrier layer 32 may be formed of any of Ta, TaN, Ru, Co, Mn, TiN, Ti/TiN, WN, Ni, and NiB, or a combination thereof.

The via conductive layer 38 may be formed, for example, using an electrolytic plating method in which the via seed layer 35 may be used as a seed. For example, the via conductive layer 38 may be formed of a copper (Cu) material that can be formed using an electrolytic plating method, and the via seed layer 35 may be formed of a Cu seed material. However, the inventive concepts is not limited to the via conductive layer 38 formed of the Cu material using the electrolytic plating method. For example, the via conductive layer 38 may also be formed of a tungsten (W) material.

Figure 16E:
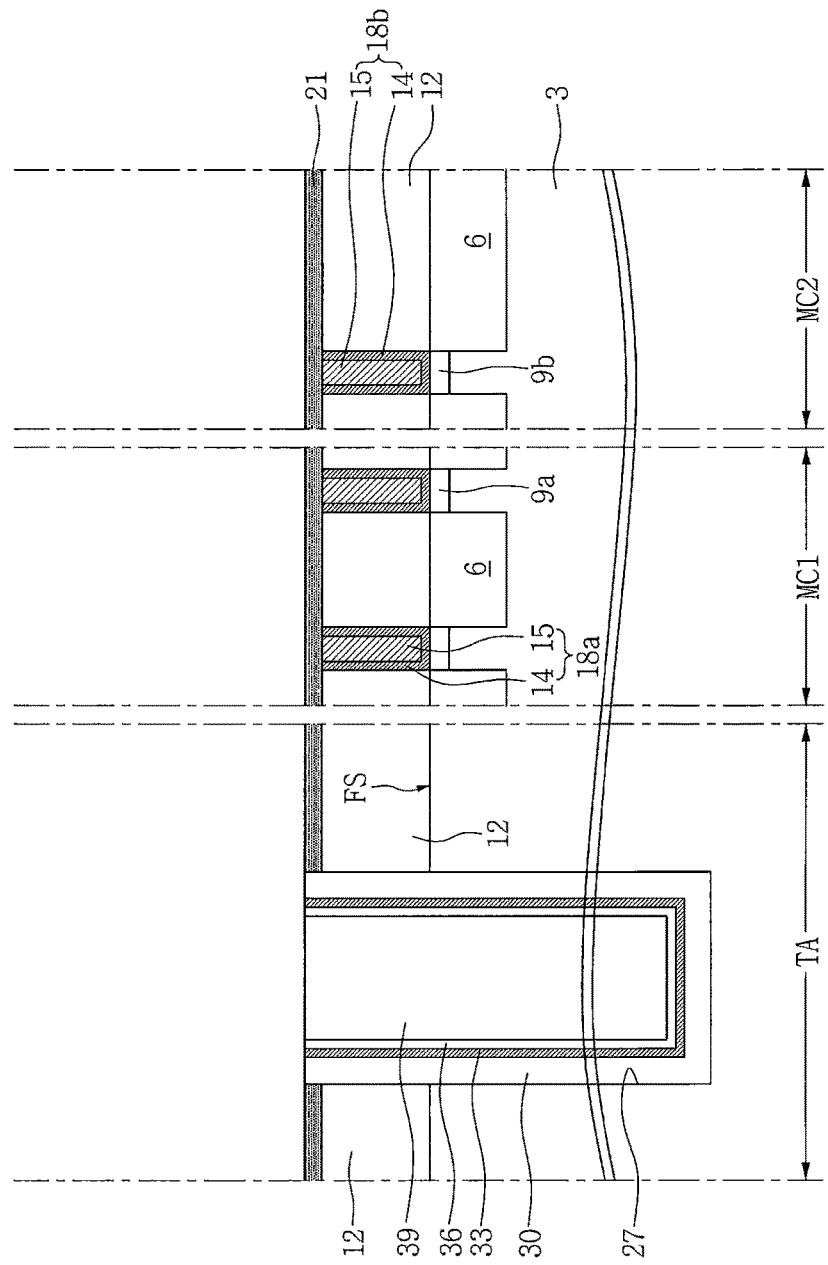

Referring to FIG. 16E, a via conductive pattern 39, a via seed pattern 36, and a via barrier pattern 33 may be formed by performing a planarization process on the via conductive layer 38, the via seed layer 35, and the via barrier layer 32 until the intermediate insulating layer 21 is exposed. While the planarization is performed, the via insulating layer 30 may also be planarized. A thickness of the intermediate insulating layer 21 may be decreased by the planarization process. It will be understood that the intermediate insulating layer 21 may be used as a planarization stop layer.

Figure 16F:
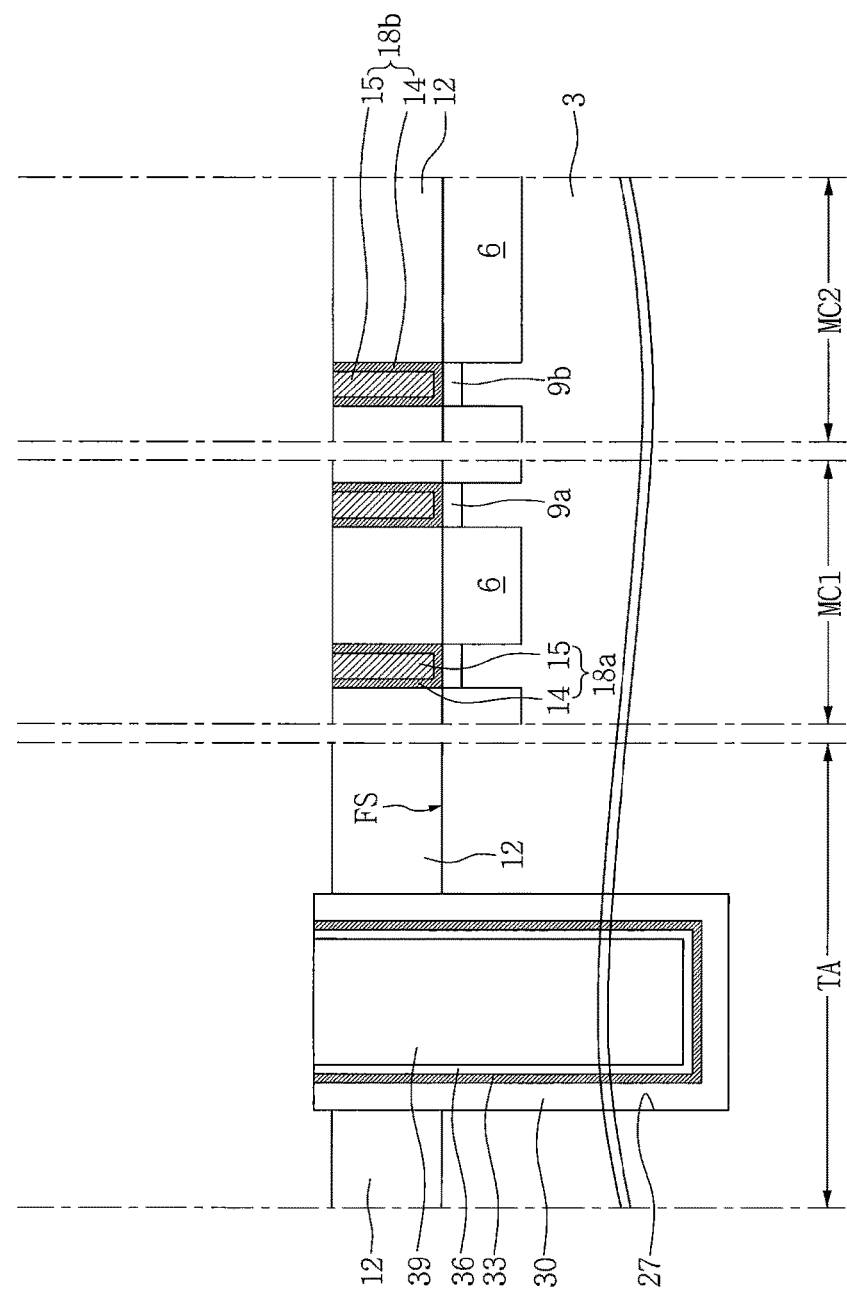

Referring to FIG. 16F, the intermediate insulating layer (i.e., the planarization stop layer) 21 may be removed. The via conductive pattern 39, the via seed pattern 36, the via barrier pattern 33, and the via insulating layer 30 may protrude from the front lower insulating layer 12 by the thickness of the removed intermediate insulating layer 21.

Figure 16G:
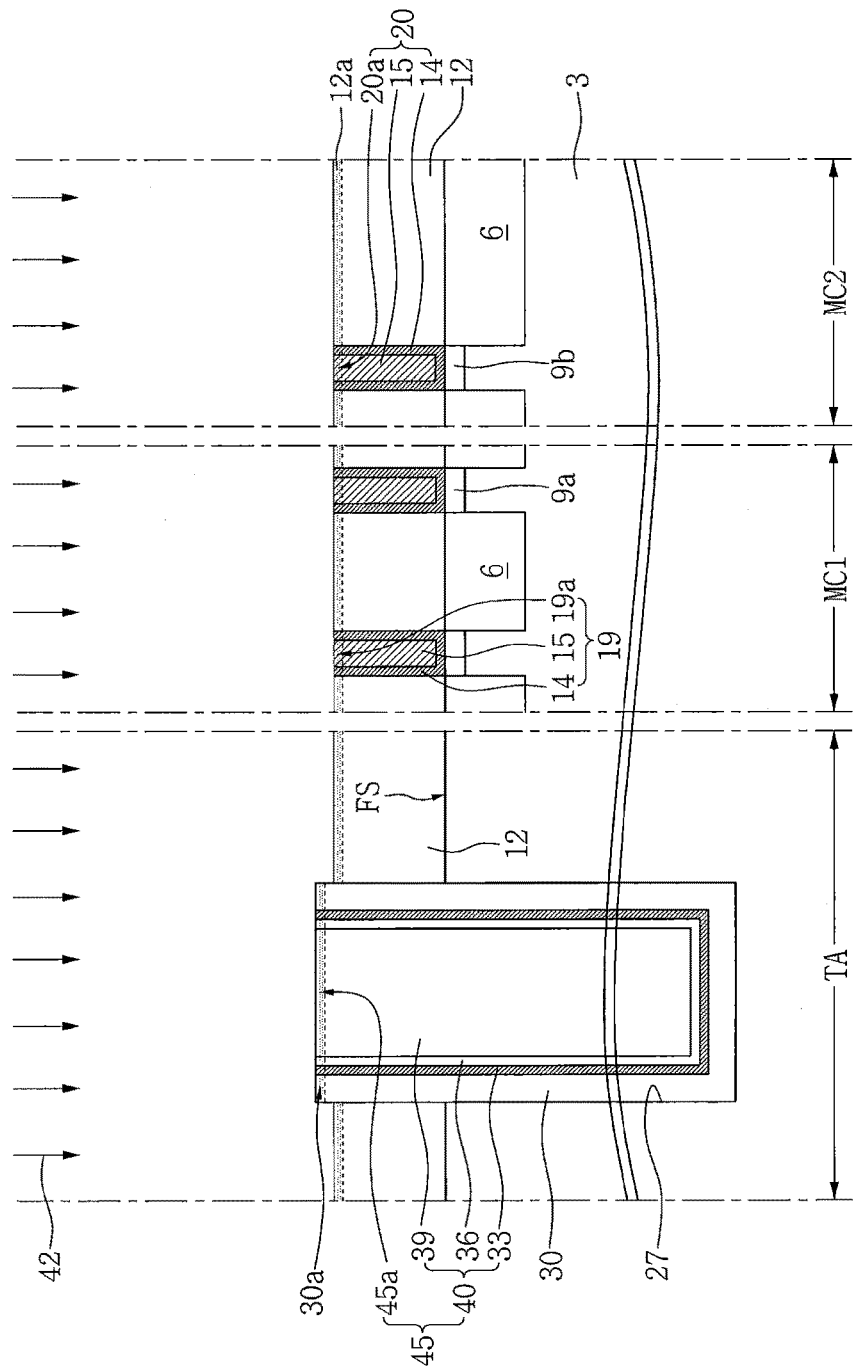

Referring to FIG. 16G, exposed surfaces of the via conductive pattern 39, the via seed pattern 36, the via barrier pattern 33, the first and second contact structures 18a and 18b (illustrated in FIG. 16F), the via insulating layer 30, and the front lower insulating layer 12 may be subject to a plasma treatment by performing a plasma treatment process 42.

In some embodiments, the plasma treatment process 42 may be a plasma doping process capable of doping an "A element."

A conductive doped region 45a may be formed by doping with the "A element" through exposed upper surfaces of the via conductive pattern 39, the via seed pattern 36, and the via barrier pattern 33 by performing the plasma treatment process 42. The conductive doped region 45a may include upper portions of the via conductive pattern 39, the via seed pattern 36, and the via barrier pattern 33.

In some embodiments, the "A element" may be a silicon (Si) element. For example, the plasma treatment process 42 may be a plasma doping process using a silicon (Si) source material such as $SiH_4$ or the like.

In some embodiments, the "A element" may be a nitrogen (N) element. For example, the plasma treatment process 42 may be a plasma doping process using a nitrogen (N) source material such as $N_2O$, $NH_3$, or the like.

In some embodiments, the "A element" may include both the silicon (Si) element and the nitrogen (N) element. For example, the plasma treatment process 42 may be a plasma doping process using both the silicon (Si) source material such as $SiH_4$ or the like and the nitrogen (N) source material such as $N_2O$, $NH_3$, or the like.

The via conductive pattern 39, the via seed pattern 36, the via barrier pattern 33, and the doped region 45a may constitute a through via structure 45.

The doped region 45a of the through via structure 45 may serve to reduce or possibly prevent diffusion of a Cu material of the via conductive pattern 39 into other regions.

A doped region 19a may be formed in the exposed surfaces of the first and second contact structures 18a and 18b (illustrated in FIG. 16F) to form first and second contact structures 19 and 20 including the doped region 19a.

An insulating doped region 30a may be formed in the exposed surface of the via insulating layer 30, and an insulating doped region 12a may be formed in the exposed surface of the front lower insulating layer 12.

Figure 16H:
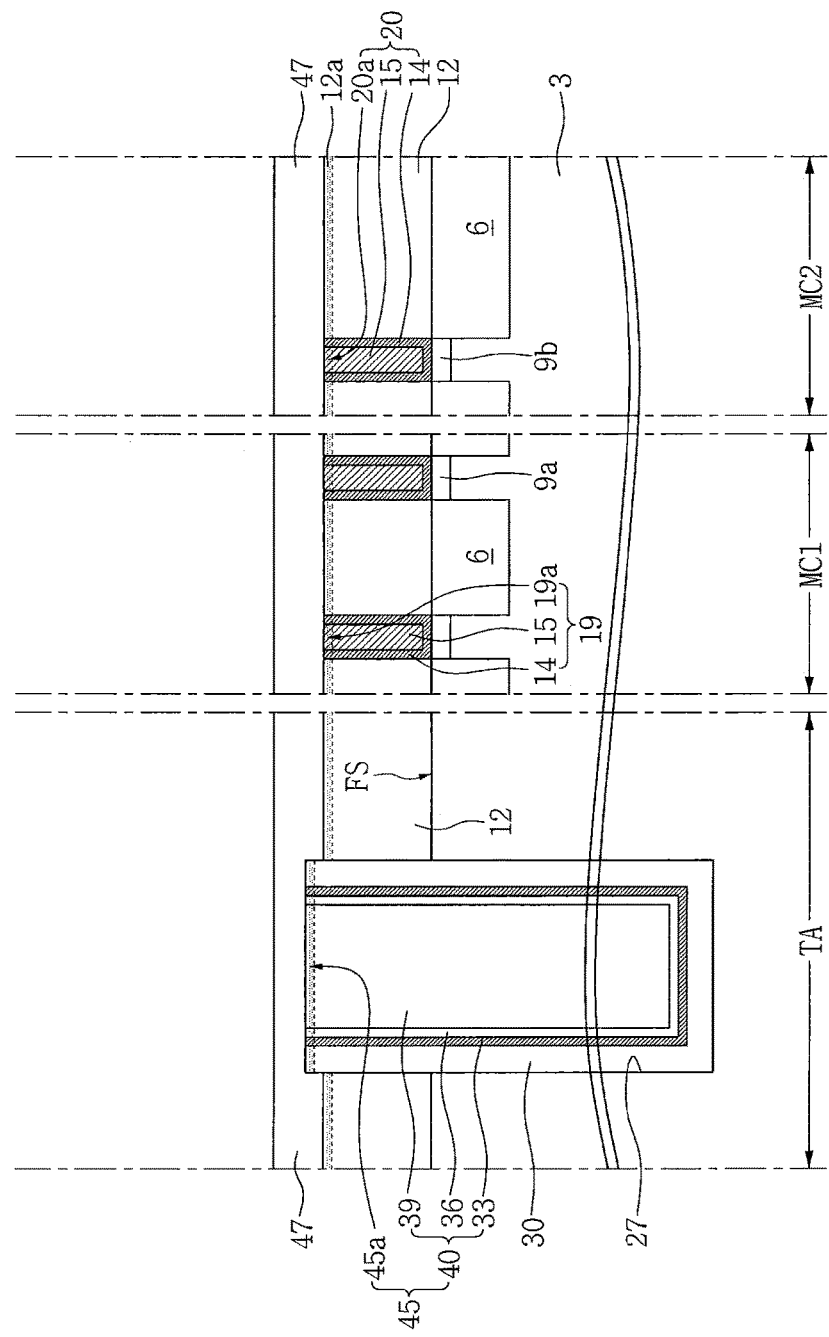

Referring to FIG. 16H, a first inter-metal insulating layer 47 may be formed on the semiconductor substrate 3 on which the plasma treatment process 42 (illustrated in FIG. 16G) has been performed. The first inter-metal insulating layer 47 may be formed of, for example, silicon oxide using a deposition process in which a silicon source material and an oxygen source material are used.

In some embodiments, while the first inter-metal insulating layer 47 is formed or after the first inter-metal insulating layer 47 is formed, an "oxygen (O)" element may be doped in the doped region 45a of the through via structure 45 by forming a thermal atmosphere. For example, the "O" element doped in the doped region 45a may be supplied from an oxygen source material for forming the first inter-metal insulating layer 47. In some embodiments, the "O" element in oxide constituting the first inter-metal insulating layer 47 may be diffused into the doped region 45a, and thus the "O" element may be doped in the doped region 45a.

Figure 16I:
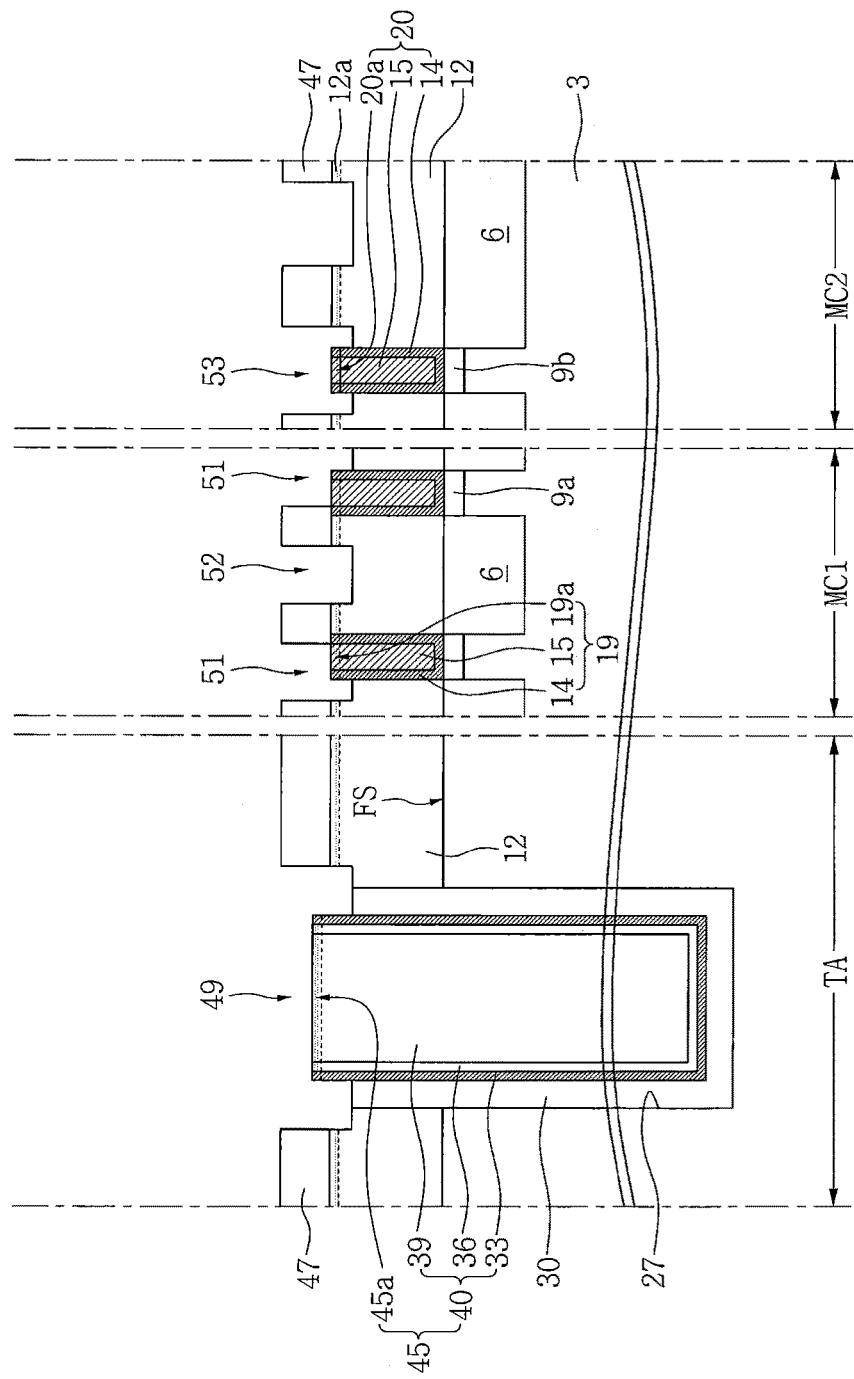

Referring to FIG. 16I, a via opening 49, first wiring openings 51, an intermediate wiring opening 52 between the first wiring openings 51, and a second wiring opening 53 may be formed by patterning the first inter-metal insulating layer 47.

In some embodiments, portions of the via insulating layer 30 and the front lower insulating layer 12 may be etched while patterning the first inter-metal insulating layer 47.

The via opening 49 may expose portions of side surfaces of the through via structure 45 while exposing an upper surface of the doped region 45a of the through via structure 45.

The first wiring openings 51 may expose the first contact structures 19. In some embodiments, the first wiring openings 51 which expose the first contact structures 19 may not be aligned with side surfaces of the first contact structures 19 in a vertical direction as illustrated in FIG. 16I. Portions of the upper surface and the side surfaces of the first contact structures 19 may be exposed by the first wiring openings 51.

The intermediate wiring opening 52 may be spaced apart from the first contact structures 19 while being disposed between the first wiring openings 51.

The second wiring opening 53, which is an opening which exposes the second contact structure 20, may have a width greater than that of the second contact structure 20 and may expose an upper surface and upper side surfaces of the second contact structure 20.

Figure 16J:
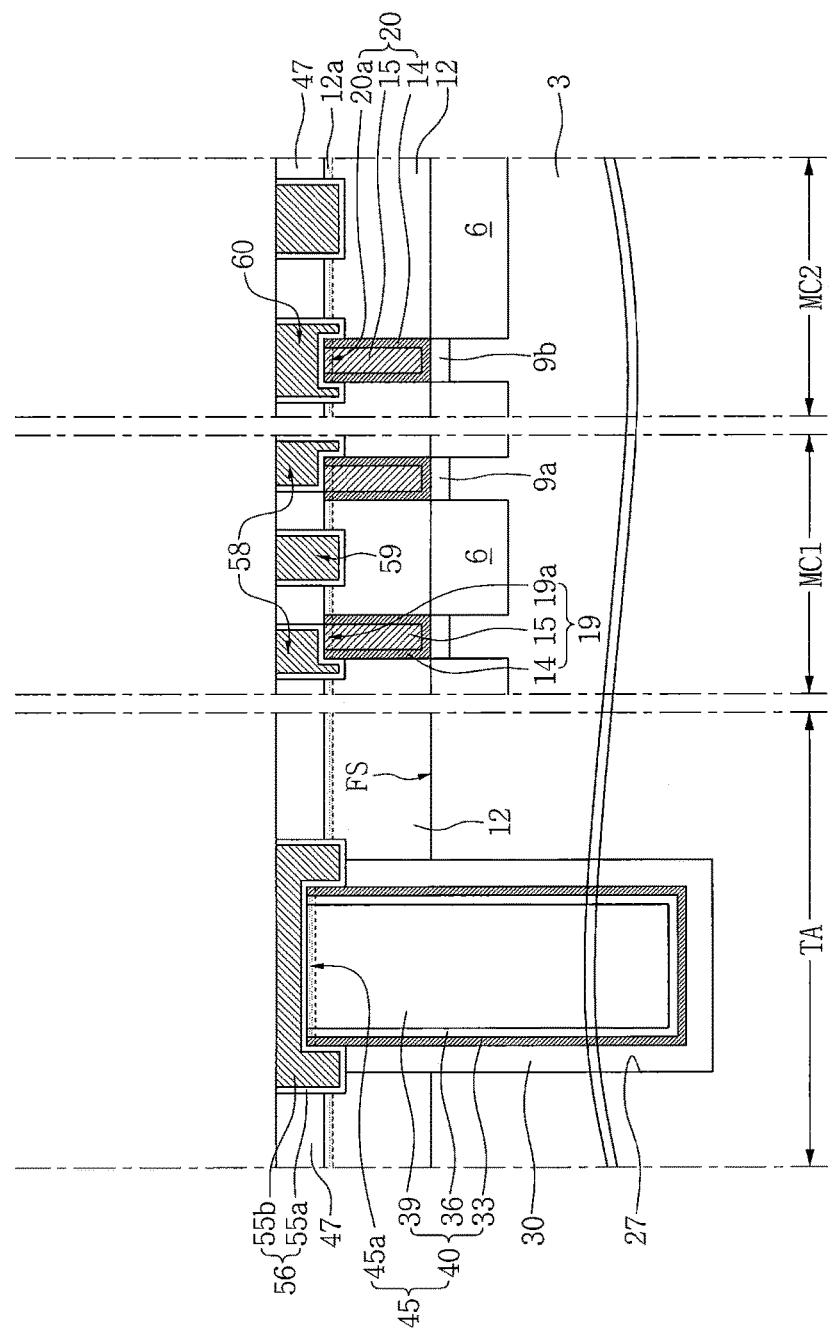

Referring to FIG. 16J, a via pad 56 may be formed in the via opening 49, first wiring structures 58 may be formed in the first wiring openings 51, an intermediate wiring structure 59 may be formed in the intermediate wiring opening 52, and a second wiring structure 60 may be formed in the second wiring opening 53.

Each of the via pad 56 and the wiring structures 58, 59, and 60 may include a conductive barrier layer 55a and a conductive material layer 55b. The conductive barrier layer 55a may cover side surfaces and a bottom surface of the conductive material layer 55b. For example, the conductive barrier layer 55a may be formed of a conductive material such as TiN, TaN, or the like, and the conductive material layer 55b may be formed of a conductive material such as W, Cu, or the like.

The formation of the via pad 56 and the wiring structures 58, 59, and 60 may include sequentially forming a conductive barrier layer and a conductive material layer on the semiconductor substrate 3 having the via opening 49 and the wiring openings 51, 52, and 53, and planarizing the conductive barrier layer and the conductive material layer until the first inter-metal insulating layer 47 is exposed.

Figure 16K:
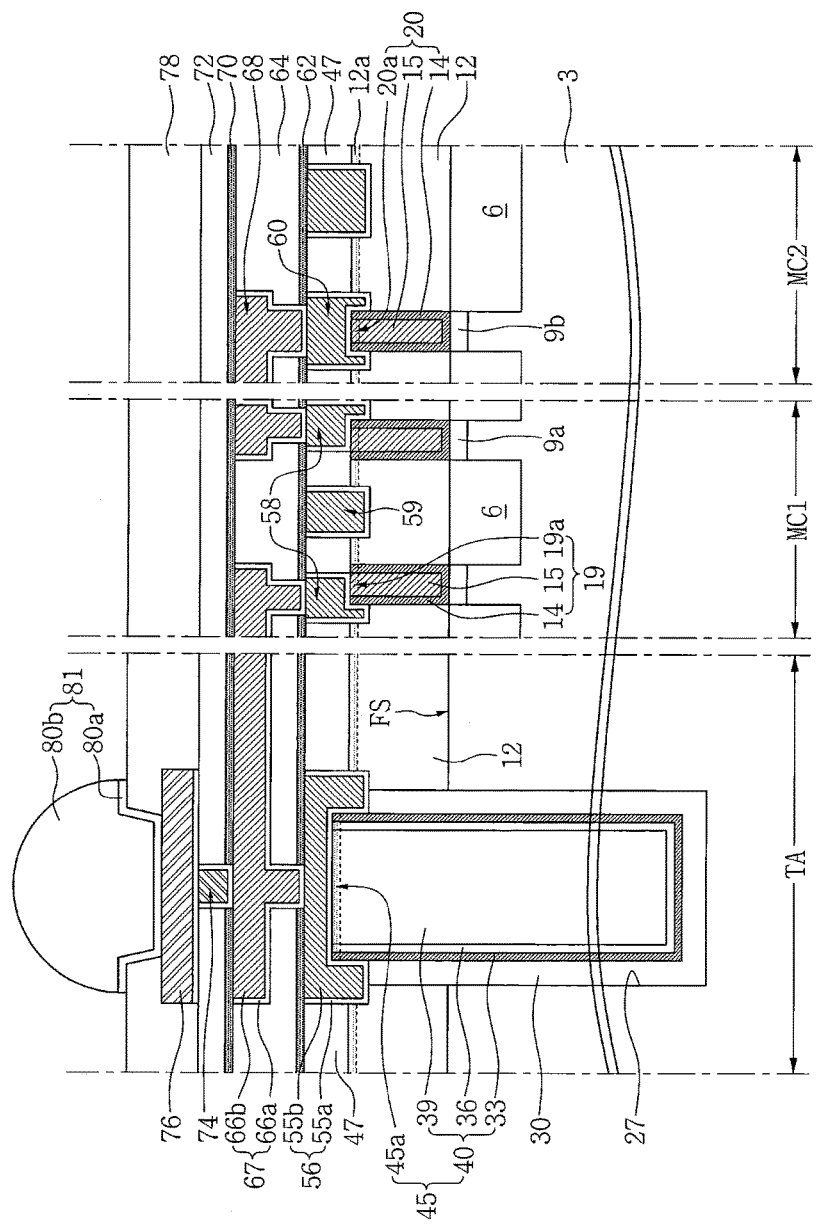

Referring to FIG. 16K, a first insulating barrier layer 62 and a second inter-metal insulating layer 64 may be sequentially formed on the semiconductor substrate 3 having the via pad 56 and the wiring structures 58, 59, and 60. For example, the first insulating barrier layer 62 may be formed of silicon nitride, and the second inter-metal insulating layer 64 may be formed of silicon oxide.

Connection wirings 67 and 68 having a dual damascene wiring structure may be formed in the second inter-metal insulating layer 64 by performing a dual damascene process.

The connection wirings 67 and 68 may pass through the first insulating barrier layer 62 to electrically connect the via pad 56 to the wiring structures 58, 59, and 60.

Each of the connection wirings 67 and 68 may include a wiring material layer 66b and a wiring barrier layer 66a which covers a lower surface and side surfaces of the wiring material layer 66b. For example, the wiring material layer 66b may be formed of a metal material such as tungsten (W), copper (Cu), or the like, and the wiring barrier layer 66a may be formed of metal nitride such as TiN, TaN, or the like.

A second insulating barrier layer 70 and a front upper insulating layer 72, which are sequentially stacked on the connection wirings 67 and 68 and the second inter-metal insulating layer 64, may be formed. The second insulating barrier layer 70 may be formed of, for example, silicon nitride. The front upper insulating layer 72 may be formed of, for example, a silicon oxide-based insulating material.

A contact plug 74 may be formed to pass through the front upper insulating layer 72 and the second insulating barrier layer 70 and to be electrically connected to the connection wiring 67. A front pad 76 may be formed on the contact plug 74.

A front protective layer 78 may be formed to cover the front pad 76 and the front upper insulating layer 72. For example, the front protective layer 78 may be formed of an insulating material such as polyimide, silicon nitride, or the like. A front conductive pattern 81 may be formed to pass through the front protective layer 78 and to be electrically connected to the front pad 76.

The front conductive pattern 81 may include a first front conductive pattern 80a and a second front conductive pattern 80b disposed on the first front conductive pattern 80a. The second front conductive pattern 80b may be formed of a solder material such as a solder ball or the like.

Referring again to FIG. 1, the through via structure 45 may be formed to protrude from the semiconductor substrate 3 by planarizing and etching the second surface BS of the semiconductor substrate 3. Then, a back insulating layer 84 may be formed on the back surface BS of the semiconductor substrate 3, and the through via structure 45 may be exposed by planarizing the back insulating layer 84.

Then, a back conductive pattern 96 may be formed on the second surface BS of the semiconductor substrate 3. The back conductive pattern 96 may have a width greater than that of the through via structure 45 and may cover a lower surface of the through via structure 45. The back conductive pattern 96 may include a first back conductive pattern 95a and a second back conductive pattern 95b disposed on the first back conductive pattern 95a. The back conductive pattern 96 may be a back bump.

A method of forming a semiconductor device according to some embodiments of the inventive concepts will be described with reference to FIGS. 17A to 17J.

Figure 17A:
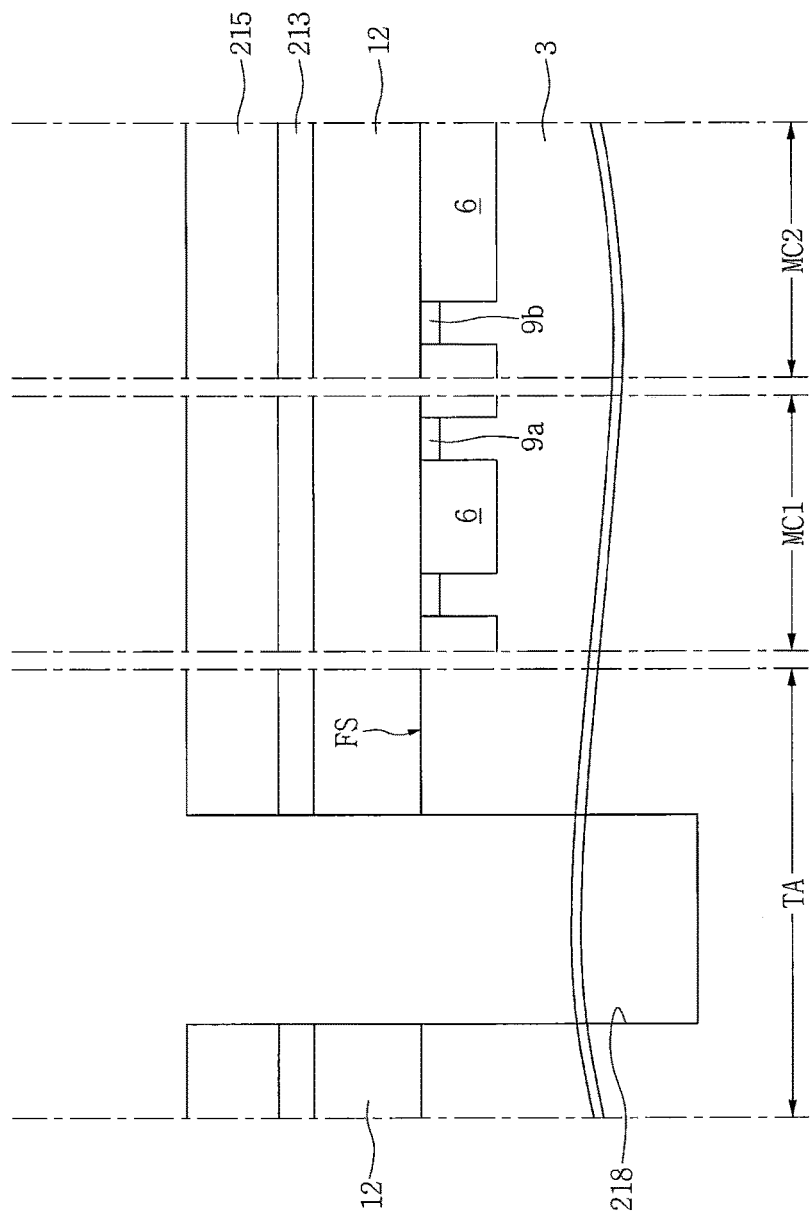
FIGS. 17A to 17J are cross-sectional views illustrating a method of forming a semiconductor device according to some embodiments of the inventive concepts.

Referring to FIG. 17A, the semiconductor substrate 3, which is the same as described with reference to FIG. 16A, may be prepared. Further, the first and second contact regions 9a and 9b and the front lower insulating layer 12, which are the same as described with reference to FIG. 16A, may be formed on the semiconductor substrate 3. A hard mask 213 and a photoresist pattern 215, which are sequentially stacked on the front lower insulating layer 12, may be formed.

A via hole 218 may be formed by etching the front lower insulating layer 12 and the semiconductor substrate 3 using the hard mask 213 and the photoresist pattern 215 as etching masks. The via hole 218 may be formed to have a predetermined depth in the semiconductor substrate 3 while passing through the front lower insulating layer 12, and may not pass through the semiconductor substrate 3.

Figure 17B:
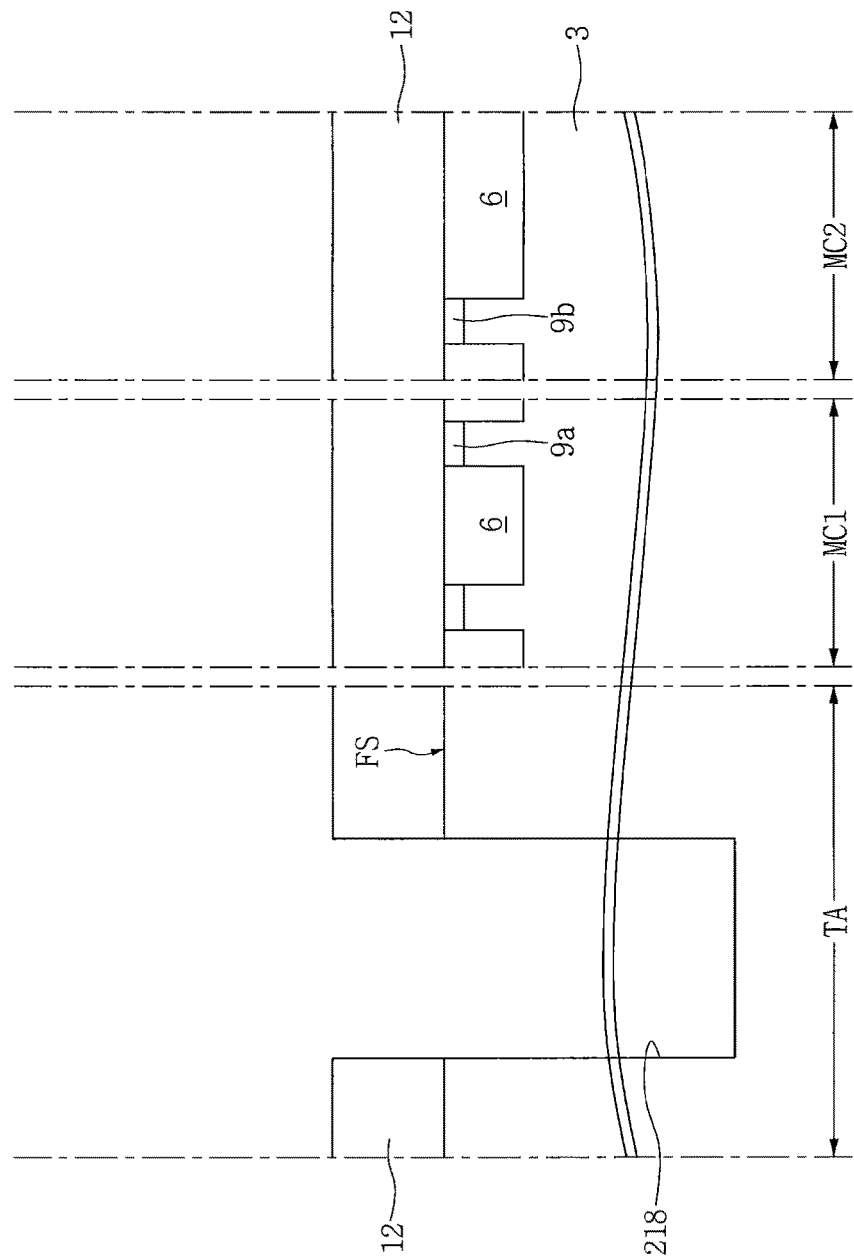

Referring to FIG. 17B, the hard mask 213 and the photoresist pattern 215 may be selectively removed. Therefore, an upper surface of the front lower insulating layer 12 may be exposed.

Figure 17C:
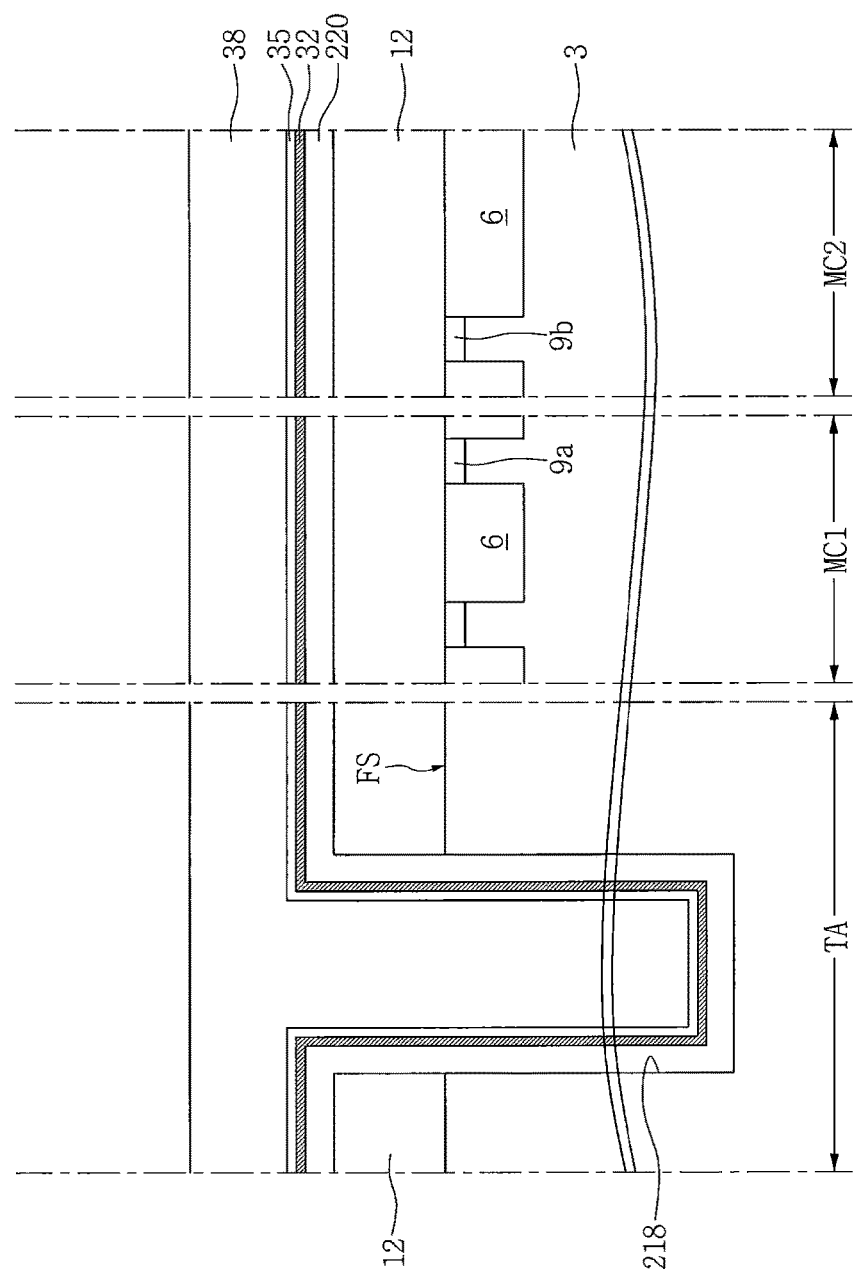

Referring to FIG. 17C, a via insulating layer 220 may be conformally formed on the semiconductor substrate 3 having the via hole 218 and the front lower insulating layer 12 of which an upper surface is exposed. The via insulating layer 220 may be formed of an insulating material such as silicon oxide or the like.

The via barrier layer 32, the via seed layer 35, and the via conductive layer 38, which are the same as described with reference to FIG. 16D, may be sequentially formed on the via insulating layer 220.

Figure 17D:
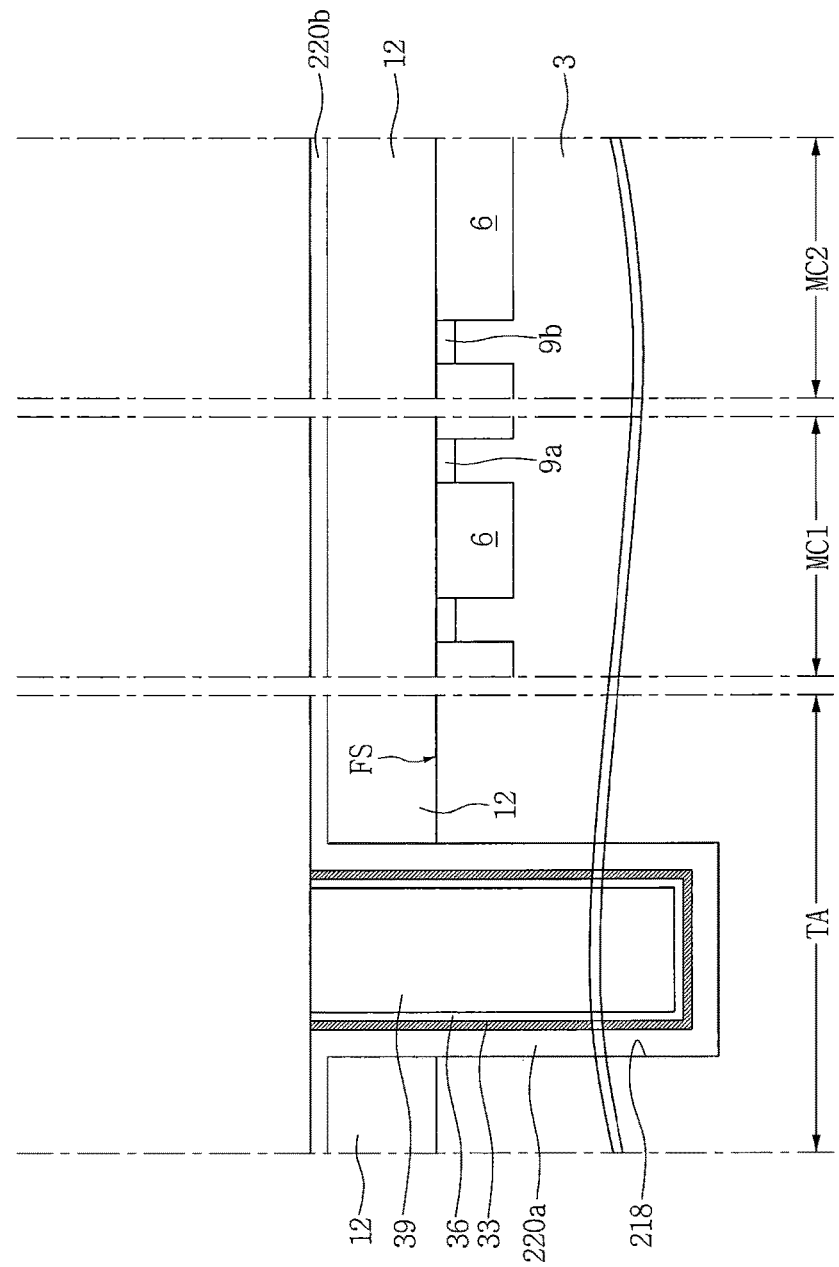

Referring to FIG. 17D, a process of planarizing the via conductive layer 38, the via seed layer 35, and the via barrier layer 32 may be performed until the via insulating layer 220 is exposed. Therefore, the via conductive pattern 39, the via seed pattern 36, and the via barrier pattern 33, which are the same as described with reference to FIG. 16E, may be formed.

A thickness of the via insulating layer 220 disposed on the front lower insulating layer 12 may be decreased by the planarization process.

In the via insulating layer 220, a portion disposed on the front lower insulating layer 12 may be referred to as an intermediate insulating layer 220b, and the other portion may be referred to as a via insulating layer 220a.

Figure 17E:
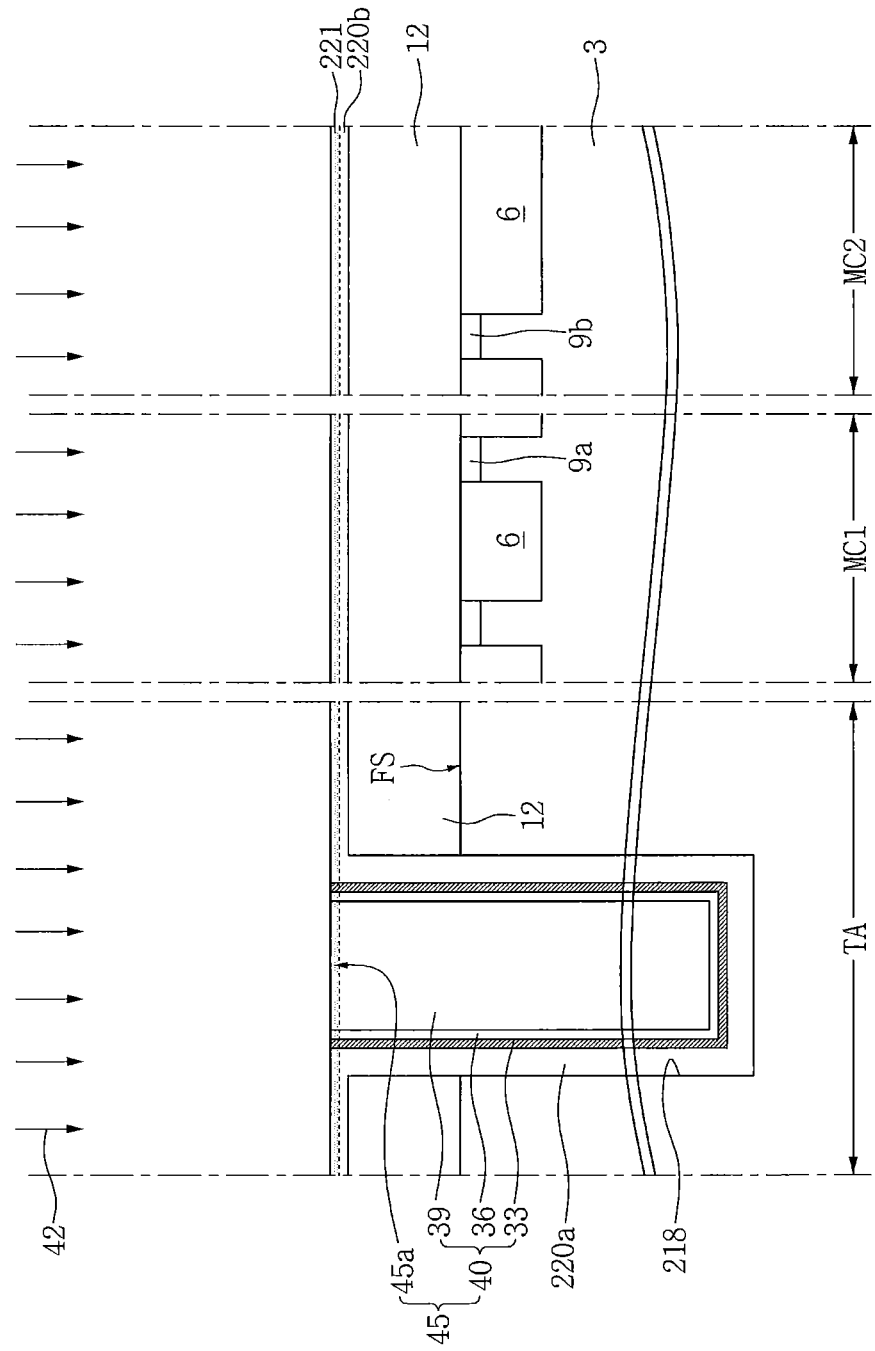

Referring to FIG. 17E, the plasma treatment process 42, which is the same as described with reference to FIG. 16G, may be performed. A conductive doped region 45a may be formed by doping with an "A element" through exposed surfaces of the via conductive pattern 39, the via seed pattern 36, and the via barrier pattern 33 by the plasma treatment process 42. The "A" element may be a silicon (Si) and/or nitrogen (N) element. Upper portions of the via conductive pattern 39, the via seed pattern 36, and the via barrier pattern 33 may include the "A element" by performing the plasma treatment process 42.

The via conductive pattern 39, the via seed pattern 36, the via barrier pattern 33 and the doped region 45a may constitute the through via structure 45 as described in FIG. 16G. The doped region 45a of the through via structure 45 may serve to reduce or possibly prevent diffusion of a Cu material of the via conductive pattern 39 into other regions.

While the plasma treatment process 42 is performed, an insulating doped region 221 may be formed by doping with the "A element" in the exposed surface of the intermediate insulating layer 220b.

Figure 17F:
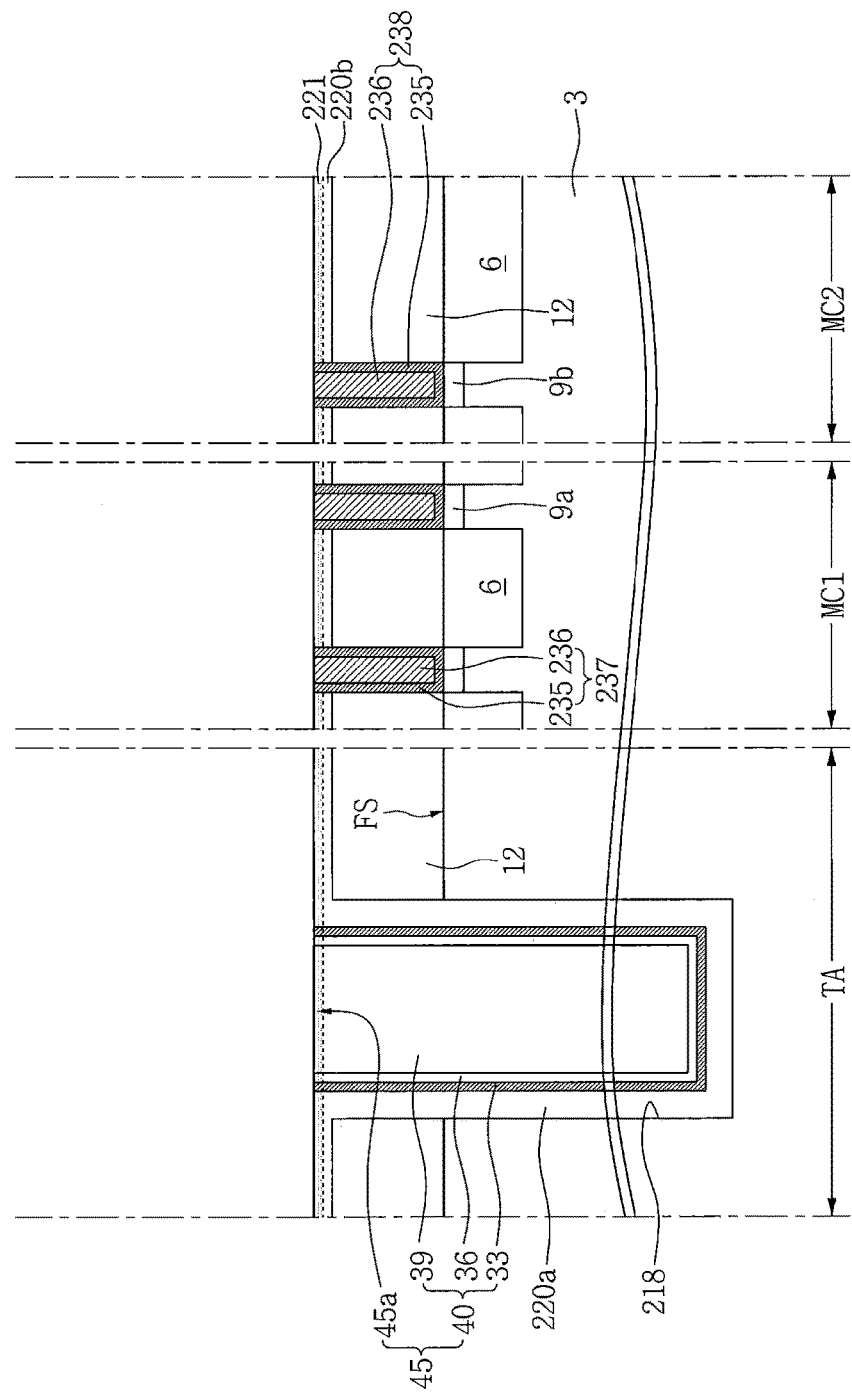

Referring to FIG. 17F, first and second contact structures 237 and 238 may be formed to pass through the front lower insulating layer 12. The first contact structures 237 may be formed in the first circuit region MC1 and may be electrically connected to the first contact regions 9a. The second contact structure 238 may be formed in the second circuit region MC2 and may be electrically connected to the second contact region 9b. Each of the first and second contact structures 237 and 238 may include a contact plug 236 and a contact barrier layer 235 which covers a bottom surface and side surfaces of the contact plug 236. For example, the contact barrier layer 235 may be formed of metal nitride (e.g., TiN or the like), and the contact plug 236 may be formed of a metal material (e.g., Cu or the like).

Figure 17G:
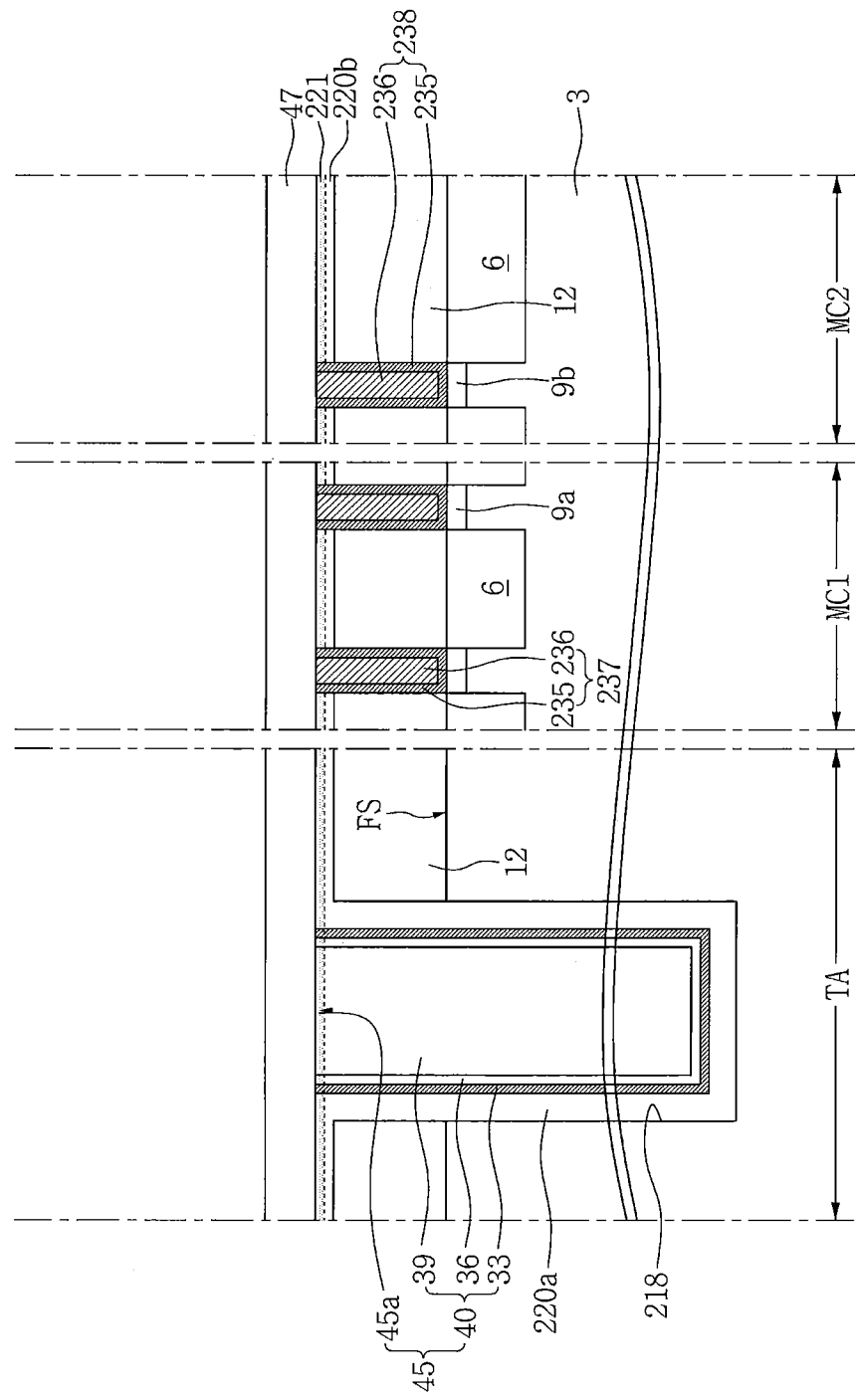

Referring to FIG. 17G, the first inter-metal insulating layer 47, which is the same as described with reference to FIG. 16H, may be formed. The first inter-metal insulating layer 47 may be formed on the front lower insulating layer 12 and may cover the first and second contact structures 237 and 238 and the through via structure 45. The first inter-metal insulating layer 47 may be formed of silicon oxide using a deposition process in which a silicon source material and an oxygen source material are used.

In some embodiments, as described in FIG. 16H, an "oxygen (O)" element may be doped in the doped region 45a of the through via structure 45.

Figure 17H:
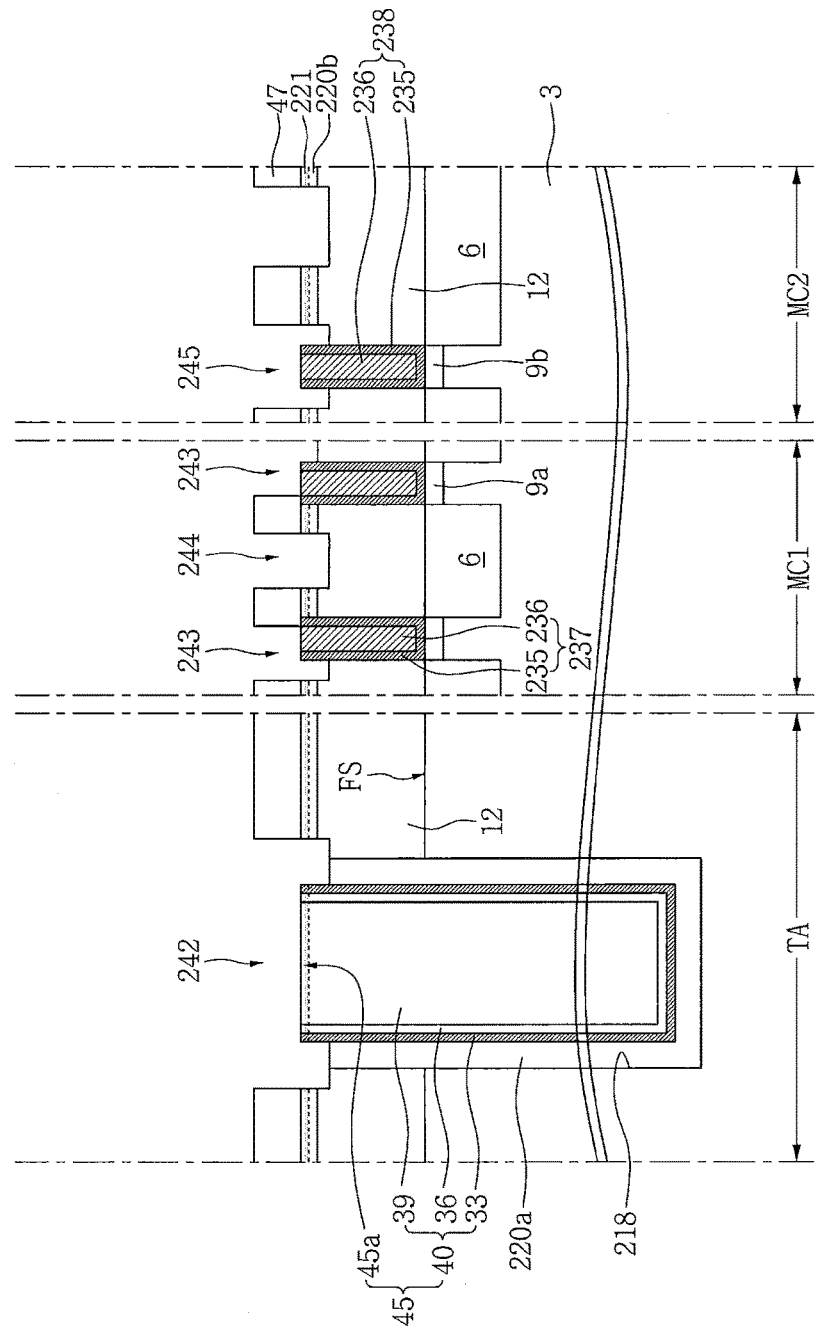

Referring to FIG. 17H, a via opening 242, first wiring openings 243, an intermediate wiring opening 244, and a second wiring opening 245 may be formed by patterning the first inter-metal insulating layer 47.

In some embodiments, portions of the via insulating layer 220 and the front lower insulating layer 12 may be etched.

The via opening 242 may expose portions of side surfaces of the through via structure 45 while exposing an upper surface of the doped region 45a of the through via structure 45.

The first wiring openings 243 may expose the first contact structures 237, the intermediate wiring opening 244 may be disposed between the first wiring openings 243, and the second wiring opening 245 may expose the second contact structure 238. In some embodiments, the first wiring openings 243 which expose the first contact structures 237 may not be aligned with side surfaces of the first contact structures 237 in a vertical direction as illustrated in FIG. 17H. The second wiring opening 245 may have a width greater than that of the second contact structure 238, and may expose an upper surface and upper side surfaces of the second contact structure 238.

Figure 17I:
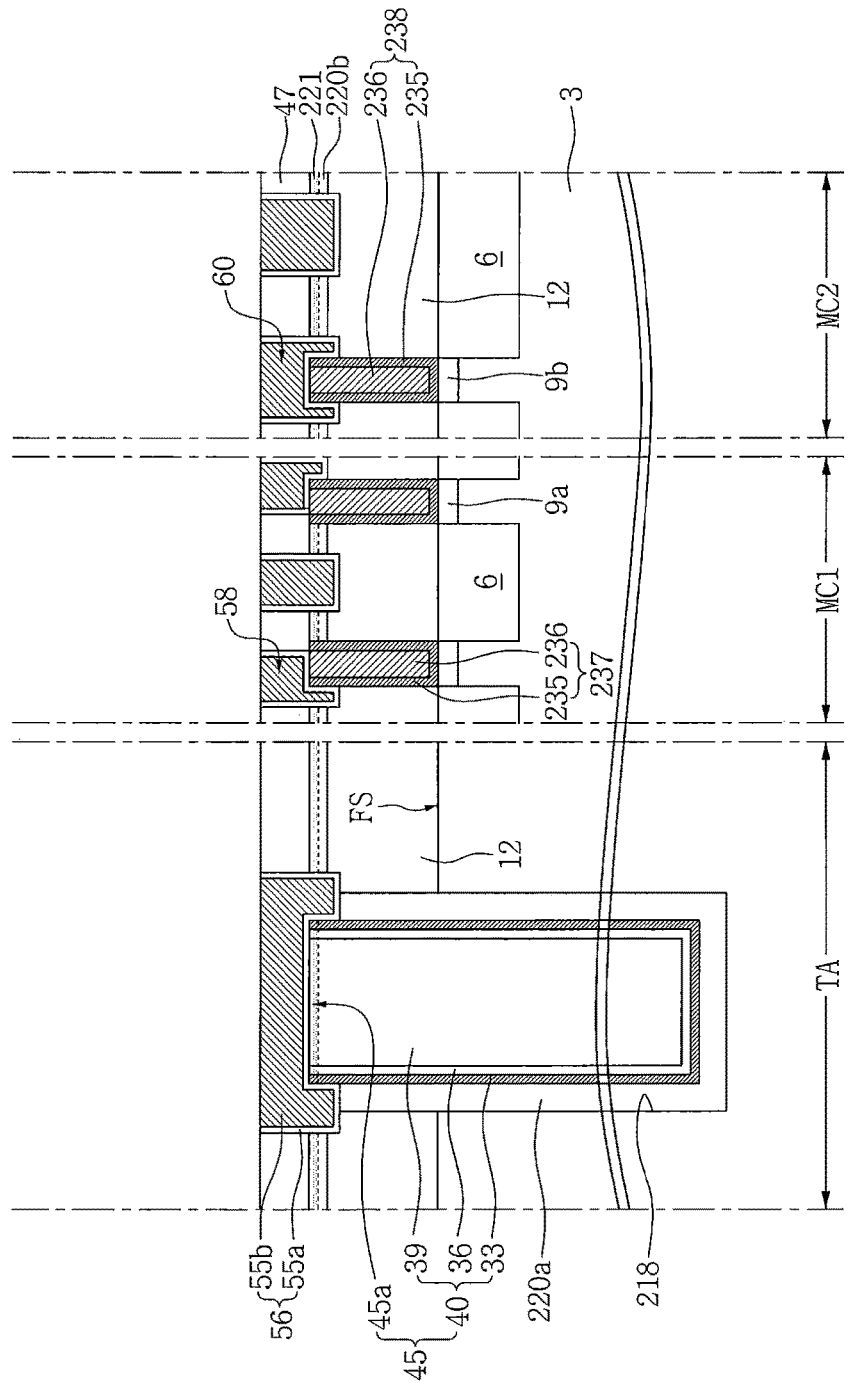

Referring to FIG. 17I, the via pad 56 and the wiring structures 58, 59, and 60, which are the same as described with reference to FIG. 16J, may be formed. The via pad 56 may be formed in the via opening 242, the first wiring structures 58 may be formed in the first wiring openings 243, the intermediate wiring structure 59 may be formed in the intermediate wiring opening 244, and the second wiring structure 60 may be formed in the second wiring opening 245.

Figure 17J:
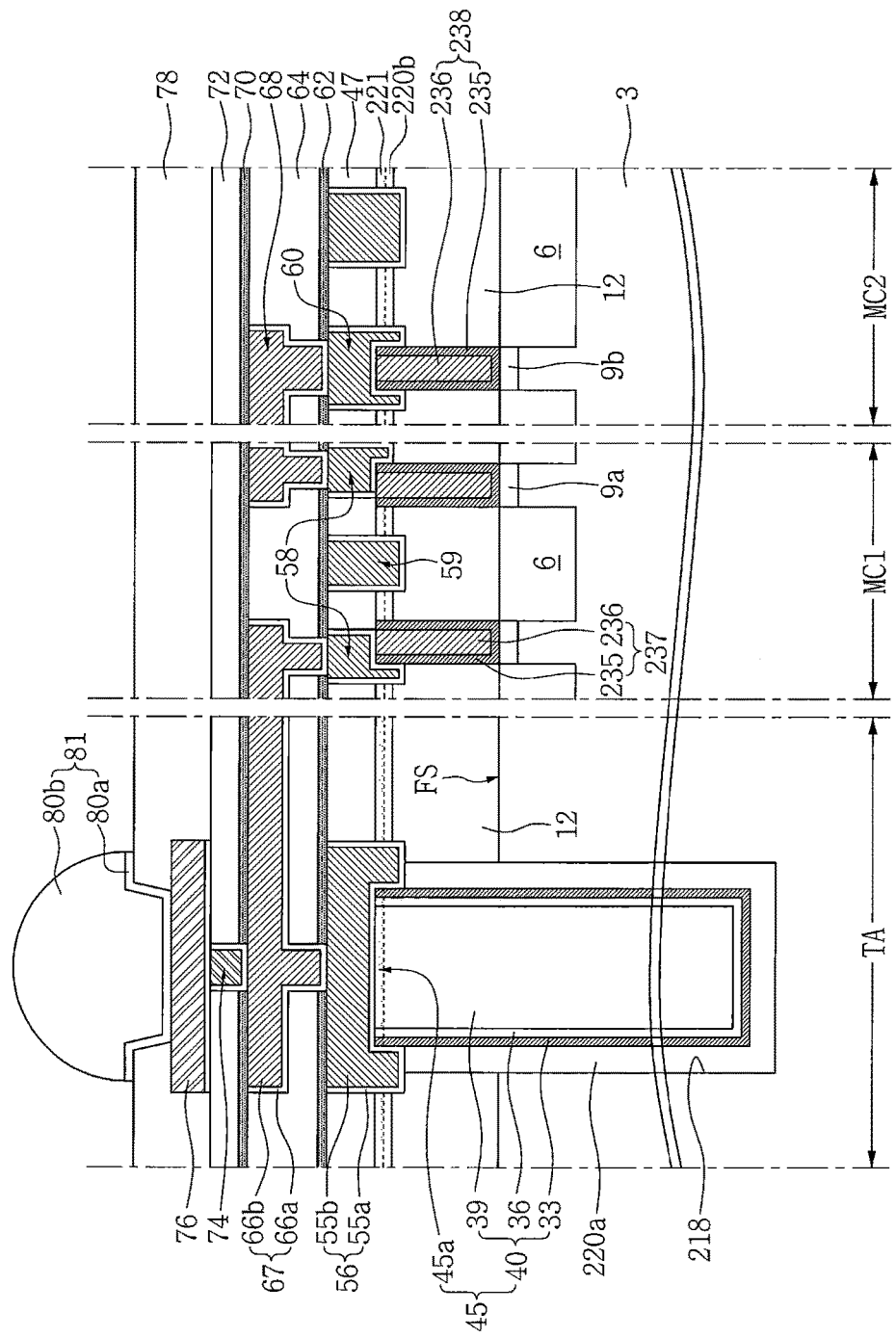

Referring to FIG. 17J, the first insulating barrier layer 62, the second inter-metal insulating layer 64, the connection wirings 67 and 68, the second insulating barrier layer 70, the front upper insulating layer 72, the contact plug 74, the front pad 76, the front protective layer 78, and the front conductive pattern 81, which are the same as described with reference to FIG. 16K, may be sequentially formed.

Referring again to FIG. 6, the through via structure 45 may be formed to protrude from the semiconductor substrate 3 by planarizing and/or etching the back surface BS of the semiconductor substrate 3. Then, a back insulating layer 84 may be formed on the back surface BS of the semiconductor substrate 3, and the through via structure 45 may be exposed by planarizing the back insulating layer 84. Then, a back conductive pattern 96 may be formed on the back surface BS of the semiconductor substrate 3.

A method of forming a semiconductor device according to some embodiments of the inventive concepts will be described with reference to FIGS. 18A to 18D.

Figure 18A:
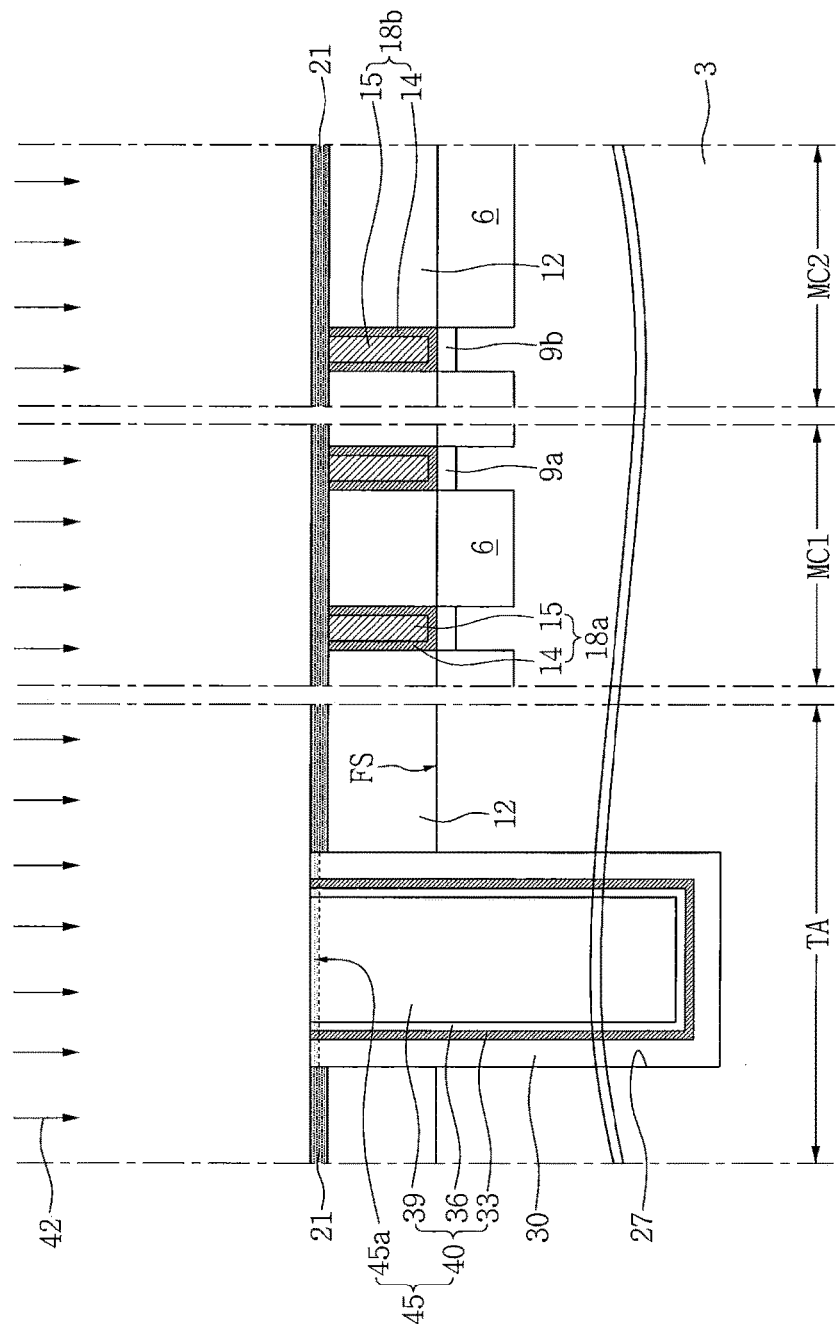
FIGS. 18A to 18D are cross-sectional views illustrating a method of forming a semiconductor device according to some embodiments of the inventive concepts.

Referring to FIG. 18A, the semiconductor substrate 3, which is the same as described with reference to FIG. 16A, may be prepared.

The first and second contact regions 9a and 9b, the front lower insulating layer 12, the first and second contact structures 18a and 18b, and the planarization stop layer 21, which are the same as described with reference to FIG. 16A, may be sequentially formed on the semiconductor substrate 3.

The via hole 27, which is the same as described with reference to FIGS. 16B and 16C, may be formed, and the via insulating layer 30, the via conductive pattern 39, the via seed pattern 36, and the via barrier pattern 33, which are the same as described with reference to FIGS. 16D and 16E, may be formed.

The plasma treatment process 42, which is the same as described with reference to FIG. 16G, may be performed.

A conductive doped region 45a may be formed by doping with an "A element" in exposed surfaces of the via conductive pattern 39, the via seed pattern 36, and the via barrier pattern 33 by the plasma treatment process 42. The "A" element may be a silicon (Si) and/or nitrogen (N) element. The doped region 45a of the through via structure 45 may serve to reduce or possibly prevent diffusion of a Cu material of the via conductive pattern 39 into other regions.

The planarization stop layer 21 may be a silicon nitride layer (SiN layer) or a silicon oxide layer (SiON layer).

The first and second contact structures 18a and 18b may be protected from the plasma treatment process 42 by the planarization stop layer 21.

Figure 18B:
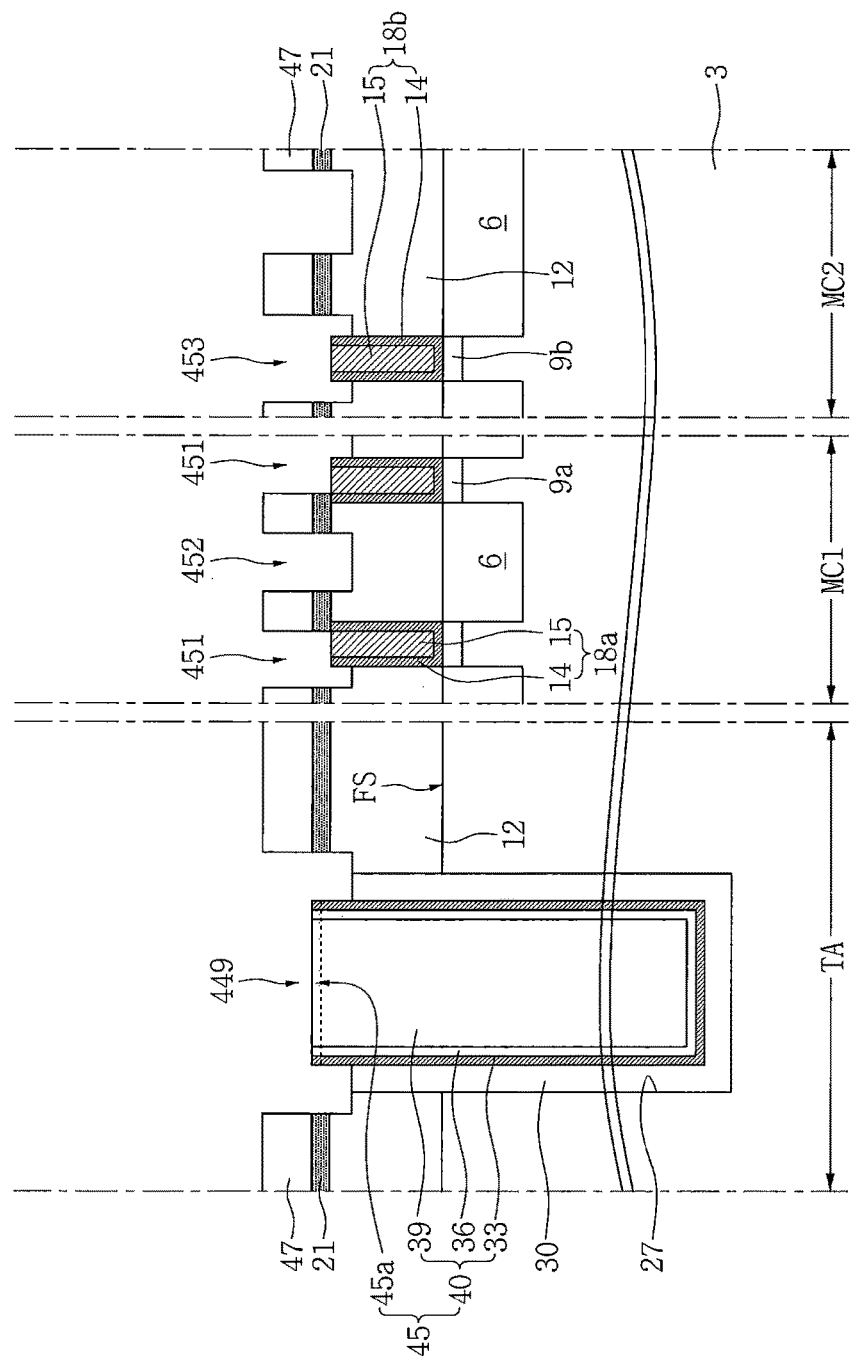

Referring to FIG. 18B, the first inter-metal insulating layer 47, which is the same as described with reference to FIG. 16H, may be formed on the semiconductor substrate 3 on which the plasma treatment process 42 (illustrated in FIG. 18A) has been performed. The first inter-metal insulating layer 47 may be formed of silicon oxide using a deposition process in which a silicon source material and an oxygen source material are used.

In some embodiments, as described in FIG. 16H, an "oxygen (O)" element may be doped in the doped region 45a of the through via structure 45.

A via opening 449, first wiring openings 451, an intermediate wiring opening 452, and a second wiring opening 453 may be formed by patterning the first inter-metal insulating layer 47 and the planarization stop layer 21.

In some embodiments, portions of the via insulating layer 30 and the front lower insulating layer 12 may be etched.

The via opening 449 may expose portions of side surfaces of the through via structure 45 while exposing an upper surface of the doped region 45a of the through via structure 45.

The first wiring openings 451 may expose the first contact structures 18a, the intermediate wiring opening 452 may be disposed between the first wiring openings 541, and the second wiring opening 453 may expose the second contact structure 18b. The first wiring openings 541 which expose the first contact structures 18a may not be aligned with side surfaces of the first contact structures 18a in a vertical direction as illustrated in FIG. 18. The second wiring opening 453 may have a width greater than that of the second contact structure 18b, and may expose an upper surface and upper side surfaces of the second contact structure 18b.

Figure 18C:
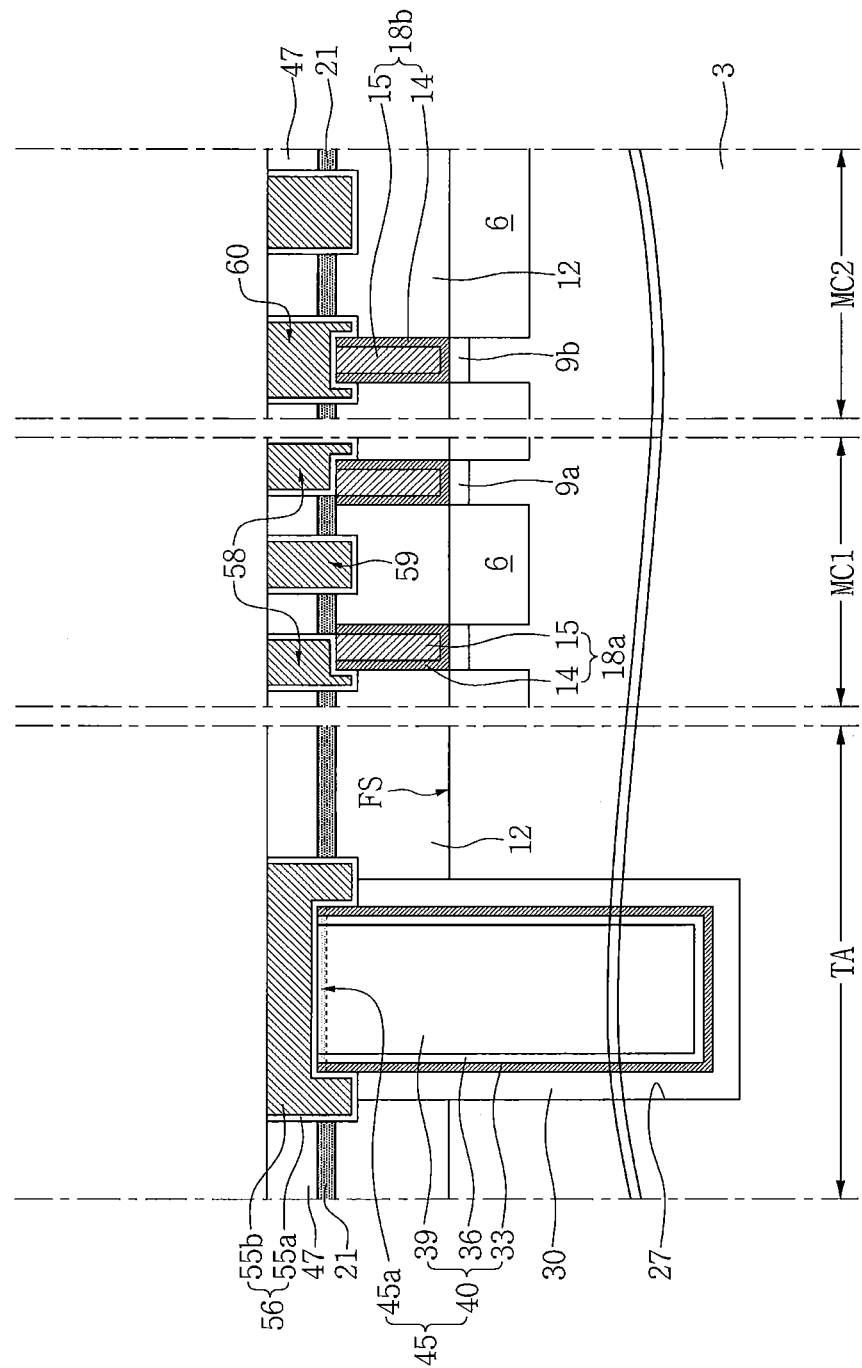

Referring to FIG. 18C, the via pad 56 and the wiring structures 58, 59, and 60, which are the same as described with reference to FIG. 16J, may be formed. The via pad 56 may be formed in the via opening 449, the first wiring structures 58 may be formed in the first wiring openings 451, the intermediate wiring structure 59 may be formed in the intermediate wiring opening 452, and the second wiring structure 60 may be formed in the second wiring opening 453.

Figure 18D:
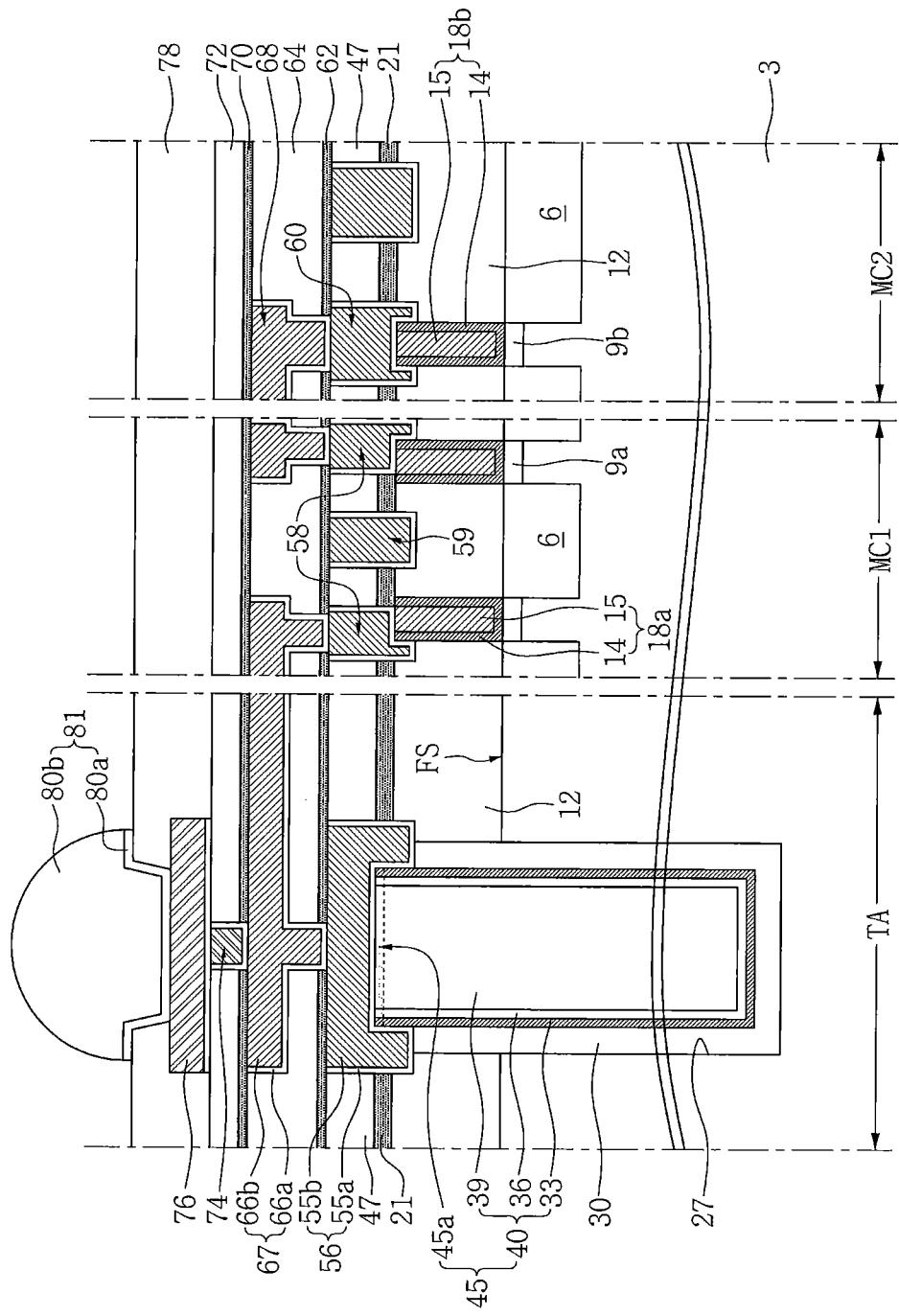

Referring to FIG. 18D, the first insulating barrier layer 62, the second inter-metal insulating layer 64, the connection wirings 67 and 68, the second insulating barrier layer 70, the front upper insulating layer 72, the contact plug 74, the front pad 76, the front protective layer 78, and the front conductive pattern 81, which are the same as described with reference to FIG. 16K, may be sequentially formed.

Referring again to FIG. 9, the through via structure 45 may be formed to protrude from the semiconductor substrate 3 by planarizing and/or etching the back surface BS of the semiconductor substrate 3. Then, a back insulating layer 84 may be formed on the back surface BS of the semiconductor substrate 3, and the through via structure 45 may be exposed by planarizing the back insulating layer 84. Then, a back conductive pattern 96 may be formed on the back surface BS of the semiconductor substrate 3.

According to some embodiments of the inventive concepts, a conductive doped region may be formed in an upper portion of a through via structure. The upper portion of the through via structure include an upper surface of the through via structure. The doped region formed in the upper portion of the through via structure can serve to reduce or possibly prevent a metal material in the through via structure from being diffused into other regions. For example, when the through via structure is formed using a Cu material, the doped region formed in the upper portion of the through via structure can serve to reduce or possibly prevent the Cu material in the through via structure from being diffused into the other regions.

According to some embodiments of the inventive concepts, a semiconductor device formed by a method of addressing contamination of a contact structure that occurs while forming the through via structure may be provided.

Further, according to some embodiments of the inventive concepts, a method of forming a semiconductor device that includes a through via structure and has a lower leakage current between a contact structure and an adjacent wiring structure, and a semiconductor device formed by the method may be provided.

Therefore, the reliability and yield of the semiconductor device may be improved.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
a semiconductor substrate including a first surface and a second surface opposite the first surface;
a front insulating layer on the first surface of the semiconductor substrate;
a back insulating layer on the second surface of the semiconductor substrate;
a through via structure extending through the back insulating layer, the semiconductor substrate, and the front insulating layer, the through via structure including a first region and a second region disposed on the first region, the second region including a first doping element, the first region being substantially free of the first doping element, the second region being closer to the front insulating layer than the back insulating layer, and the second region being spaced apart from the front insulating layer;
a via insulating layer on a side surface of the through via structure; and
a contact structure extending through the front insulating layer.

2. The device of claim 1, further comprising:
an inter-metal insulating layer on the front insulating layer;
a via pad extending through the inter-metal insulating layer and being electrically connected to the through via structure; and
a wiring structure extending through the inter-metal insulating layer and being electrically connected to the contact structure.

3. The device of claim 2, wherein:
the via pad comprises a same material as the wiring structure; and
upper surfaces of the via pad and the wiring structure are coplanar.

4. The device of claim 2, wherein:
the via pad includes a first portion that overlaps the through via structure in plan view and a second portion that does not overlap the through via structure in plan view; and
a lower surface of the second portion of the via pad is lower than an upper surface of the front insulating layer relative to the first surface of the semiconductor substrate.

5. The device of claim 2, wherein:
the via pad includes line portions and a connection portion connecting end portions of the line portions;
the line portions of the via pad cross an upper surface of the through via structure and extend onto the front insulating layer; and
the connection portion of the via pad is on the front insulating layer.

6. The device of claim 5, further comprising a connection wiring on the via pad,
wherein the connection wiring is electrically connected to the connection portion of the via pad.

7. The device of claim 2, wherein the wiring structure includes a first side surface that overlaps an upper surface of the contact structure in plan view and a second side surface that does not overlap the upper surface of the contact structure in plan view.

8. The device of claim 1, wherein the second region further includes a second doping element and a third doping element, and
wherein the first doping element is silicon (Si), the second doping element is nitrogen (N), and the third doping element is oxygen (O).

9. The device of claim 1, wherein an upper surface of the through via structure is at a higher level than a lower surface of the front insulating layer relative to the first surface of the semiconductor substrate.

10. A semiconductor device, comprising:
a semiconductor substrate including a first surface and a second surface opposite the first surface;
a front lower insulating layer on the first surface of the semiconductor substrate;
a back insulating layer on the second surface of the semiconductor substrate;
a through via structure extending through the semiconductor substrate, the front lower insulating layer, and the back insulating layer, wherein the through via structure includes a first region and a second region disposed on the first region, and wherein the second region of the through via structure includes a first doping element, and the first region of the through via structure is substantially free of the first doping element;

a via insulating layer on a side surface of the through via structure;

a contact structure on the first surface of the semiconductor substrate and in the front lower insulating layer;

an inter-metal insulating layer on the front lower insulating layer, the front lower insulating layer being between the semiconductor substrate and the inter-metal insulating layer;

a via pad extending through the inter-metal insulating layer and contacting the second region of the through via structure; and a wiring structure extending through the inter-metal insulating layer and being electrically connected to the contact structure.

11. The device of claim 10, wherein the via pad contacts an upper surface of the through via structure and an upper portion of the side surface of the through via structure.

12. The device of claim 10, wherein the through via structure further includes a third region disposed under the first region, and the first region is between the second region and the third region, and wherein the third region of the through via structure further includes a second doping element that is substantially absent from the first region.

13. A semiconductor device, comprising:

a substrate;

a through via structure extending through the substrate, the through via structure comprising a metal electrode that extends through the substrate and comprises a first surface and a second surface opposite the first surface, and the metal electrode comprising a first portion that comprises the first surface of the metal electrode and comprises a first chemical element that is silicon, oxygen or nitrogen;

a via pad extending on the first surface of the metal electrode and contacting the first portion of the metal electrode; and an insulating layer on the substrate, the insulating layer comprising a lower surface facing the substrate and an upper surface opposite the lower surface of the insulating layer, wherein the via pad extends on a portion of a side surface of the through via structure, wherein the through via structure and the metal electrode are in the insulating layer, wherein the insulating layer comprises an upper portion that comprises the upper surface of the insulating layer and comprises the first chemical element, and wherein a lower portion of the insulating layer is substantially free of the first chemical element.

14. The device of claim 13, wherein the metal electrode comprises a second portion that is adjacent the first portion, and wherein the second portion of the metal electrode is substantially free of the first chemical element.

15. The device of claim 13, wherein the through via structure and the metal electrode extend through the insulating layer, and wherein the first surface of the metal electrode is higher than the upper surface of the insulating layer relative to a surface of the substrate.

16. The device of claim 15, further comprising a conductive contact extending through the insulating layer, wherein the upper surface of the insulating layer and an upper surface of the conductive contact are coplanar.

17. The device of claim 16, wherein the conductive contact comprises an upper portion that comprises the upper surface of the conductive contact and comprises the first chemical element.

18. The device of claim 13, wherein the via pad contacts the first surface of the metal electrode and the portion of the side surface of the through via structure.

19. The device of claim 10, wherein the first doping element is silicon, nitrogen or oxygen.

* * * * *